United States Patent [19]
Dolby et al.

[11] Patent Number: 5,185,806
[45] Date of Patent: Feb. 9, 1993

[54] AUDIO COMPRESSOR, EXPANDER, AND NOISE REDUCTION CIRCUITS FOR CONSUMER AND SEMI-PROFESSIONAL USE

[76] Inventors: Ray M. Dolby, 3340 Jackson St., San Francisco, Calif. 94118; Stanley G. Cossette, 1270 29th Ave., San Francisco, Calif. 94122

[21] Appl. No.: 613,859

[22] Filed: Dec. 11, 1990

Related U.S. Application Data

[63] Continuation-in-part of Ser. No. 333,431, Apr. 3, 1989, abandoned, and a continuation-in-part of Ser. No. 428,363, Oct. 27, 1989, abandoned.

[51] Int. Cl.$^5$ .............................................. H03G 7/00
[52] U.S. Cl. ...................................... 381/106; 333/14
[58] Field of Search ........................... 381/106; 333/14

[56] References Cited

U.S. PATENT DOCUMENTS

| | | |
|---|---|---|
| Re. 28,426 | 5/1975 | Dolby . |
| 3,846,719 | 11/1974 | Dolby . |
| 3,903,485 | 9/1975 | Dolby . |
| 4,490,691 | 12/1984 | Dolby ................................ 333/14 |
| 4,498,055 | 2/1985 | Dolby . |
| 4,736,433 | 4/1988 | Dolby ................................ 381/106 |
| 4,815,068 | 3/1989 | Dolby et al. . |
| 4,922,535 | 5/1990 | Dolby . |

FOREIGN PATENT DOCUMENTS

| | | |
|---|---|---|
| 0206732 | 6/1986 | European Pat. Off. . |
| 0206746 | 12/1986 | European Pat. Off. . |
| 34394 | 8/1965 | United Kingdom . |
| 43136 | 10/1965 | United Kingdom . |
| 02368 | 1/1966 | United Kingdom . |

OTHER PUBLICATIONS

Dolby, "The Spectral Recording Process", Mar. 1987, *J. Audio Eng. Soc.*, vol. 35 (pp. 99-118).

(List continued on next page.)

*Primary Examiner*—Forester W. Isen
*Attorney, Agent, or Firm*—Thomas A. Gallagher

[57] ABSTRACT

Three related embodiments of audio signal dynamic range circuits for consumer and semi-professional audio signal compressors, expanders, and compressor/expander noise reduction systems incorporate certain basic features of professional Spectral Recording (SR) while adapting SR for use with consumer recording media (particularly audio cassette tape) and reducing the cost and complexity of the SR circuitry. In addition, the three embodiments, and particularly the preferred embodiment, provide substantial compatibility with the existing B-type and C-type consumer and semi-professional noise reduction systems. Subjective performance substantially equivalent to 16-bit PCM audio systems is achieved with analog audio cassette tape media. In all three embodiments there are two cascaded stages: (1) a high-level stage having a high-frequency fixed-band/sliding band action-substitution sub-state and a low-frequency fixed-band sub-stage and (2) a low-level stage having only a high-frequency fixed-band/sliding band action-substitution sub-stage. The dynamic action regions of the high-frequency action-substitution sub-stages are staggered. Each of the high-frequency sub-stages provides up to 12 dB of dynamic action (together providing up to 24 dB of dynamic action) and operates in a frequency band defined by a single-pole filter having a high-pass shelving response with a corner frequency of 400 Hz. The low-frequency sub-stage provides up to 10 dB of dynamic action and operates in a frequency band defined by a single-pole filter having a low-pass shelving response with a corner frequency of 200 Hz. The single-pole filter characteristics provide a broad and smooth overlap of the high-frequency and low-frequency characteristics. Particular forms of spectral skewing and antisaturation enhance the performance of the circuits with consumer recording media.

67 Claims, 20 Drawing Sheets

OTHER PUBLICATIONS

Cossette, Stan, "A New Analog Recording Process for Consumer Recording Formats," Presented at 89th Audio Eng. Soc. Convention, Sep. 21–25, 1990, Los Angeles, Audio Eng. Soc. Preprint #3004, Session-Paper #K-4.

"BMG to Release Dolby S-Type Cassettes," *Dolby Laboratories Information*, May 19, 1992, 2 pages.

"BMG Classics," *Audio Week*, May 25, 1992, vol. 4, No. 21, p. 3.

"DCC: A View from the Front Lines," *Billboard*, Jun. 6, 1992, p. 58.

Somerfield, Harry, "Audio Cassettes Get High-Tech Boost," *San Francisco Chronicle*, Jun. 24, 1992, p. 6 (Z-1).

Dolby, Ray M., "An Audio Noise Reduction System," *J. Audio Eng. Soc.*, vol. 15, No. 4, Oct. 1967, pp. 383–388.

Dolby, Ray M., "A 20 dB Audio Noise Reduction System for Consumer Applications," *J. Audio Eng. Soc.*, vol. 31, No. 3, Mar. 1983, pp. 98–113.

"DD Dolby SR, Dolby Spectral Recording, What It Is and What It Does," Dolby Laboratories 1987, 8 pages.

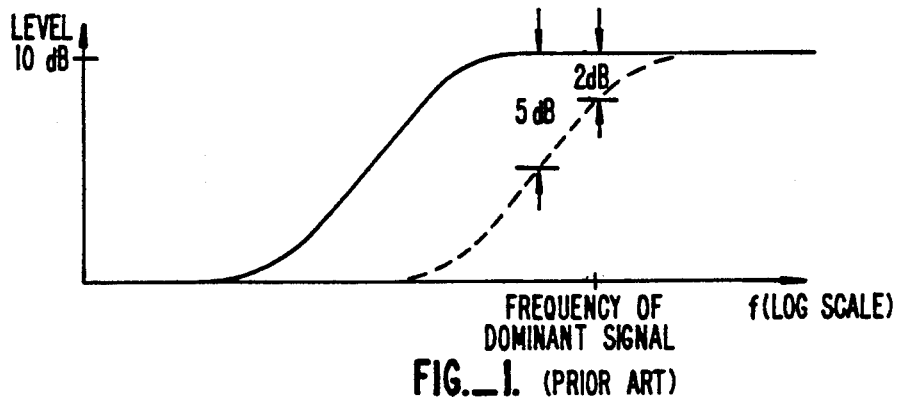
FIG._1. (PRIOR ART)
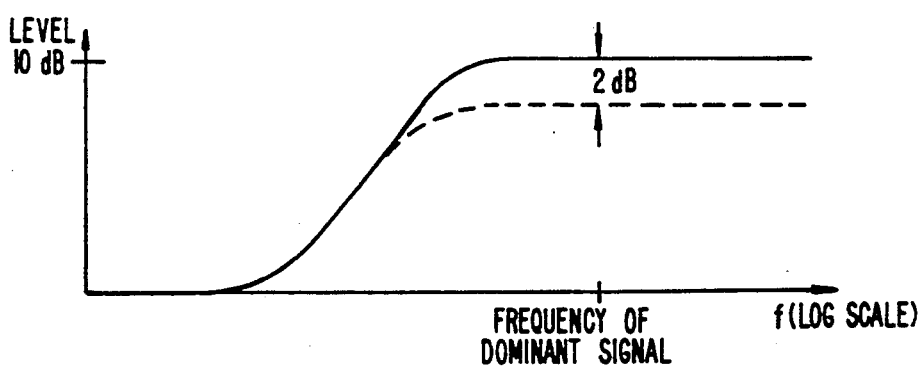
FIG._2. (PRIOR ART)
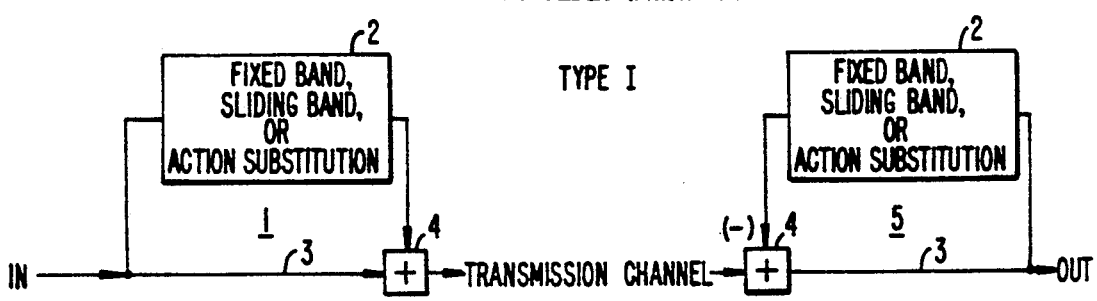
FIG._3. (PRIOR ART)
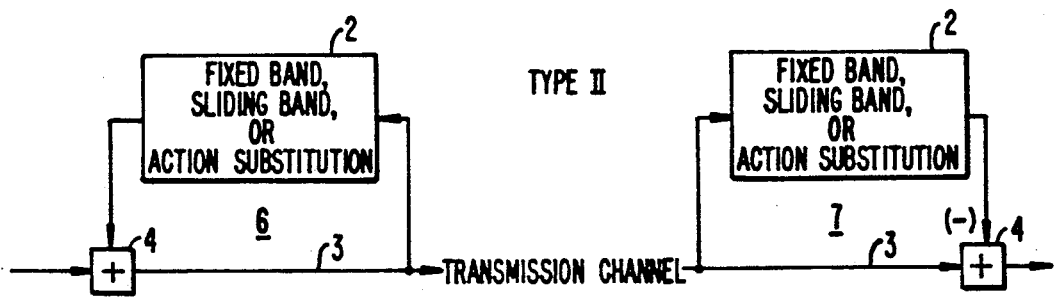
FIG._4. (PRIOR ART)

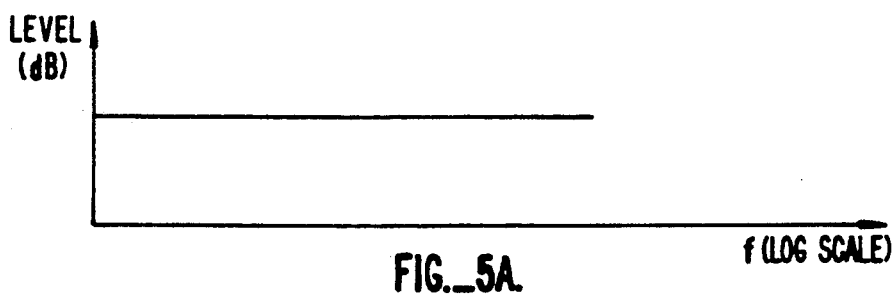
FIG._5A.
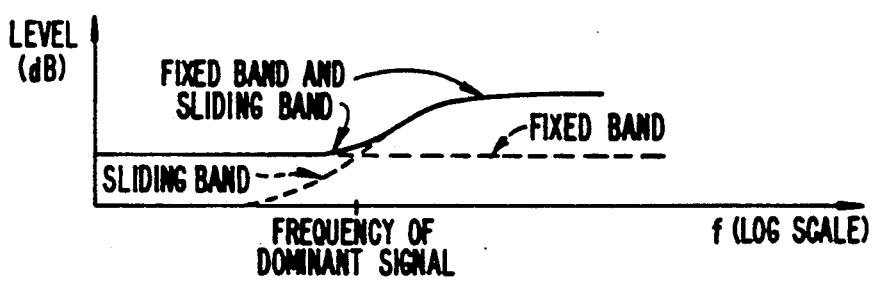
FIG._5B.
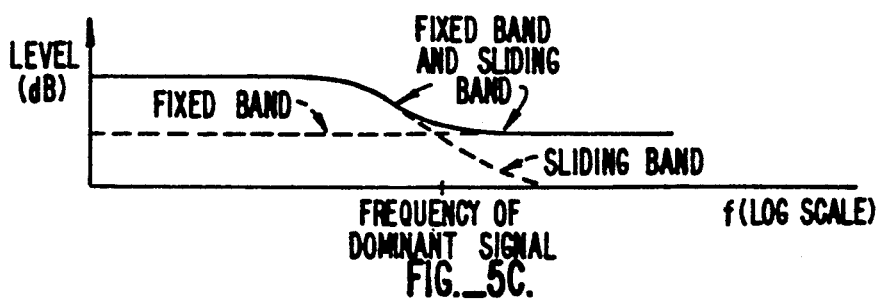
FIG._5C.
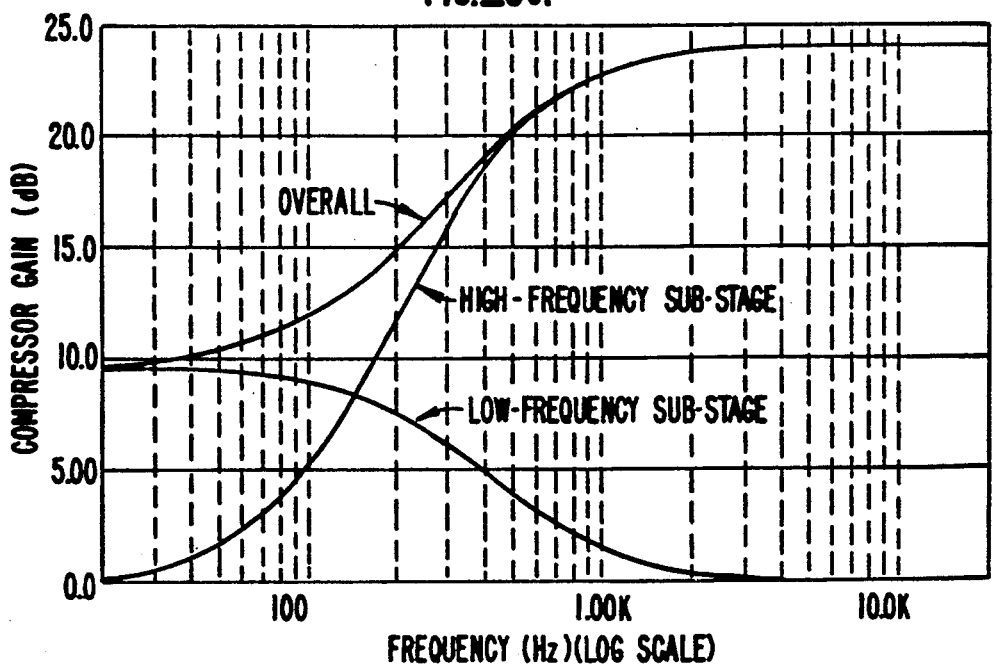
FIG._6.

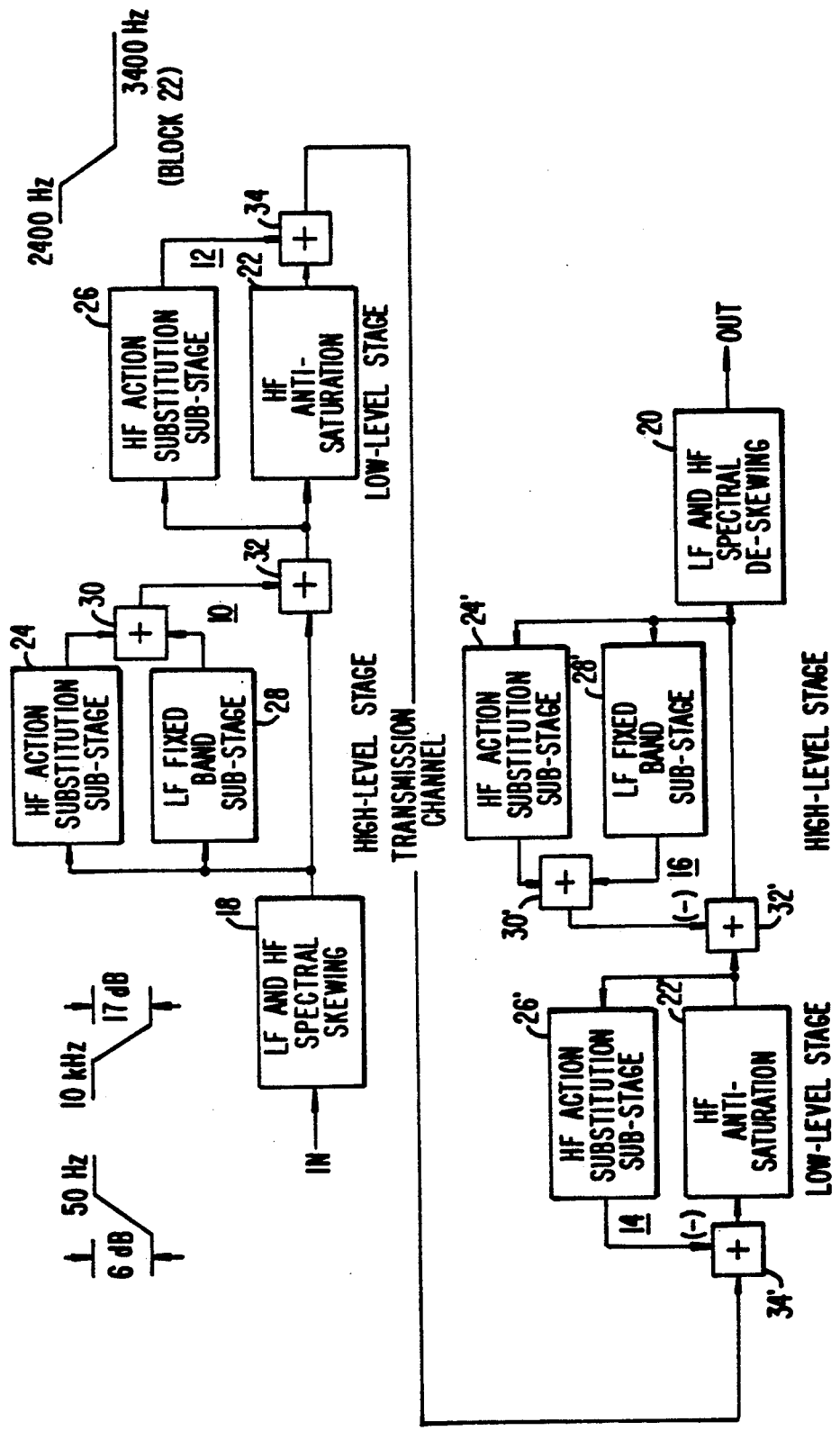
FIG._7A.

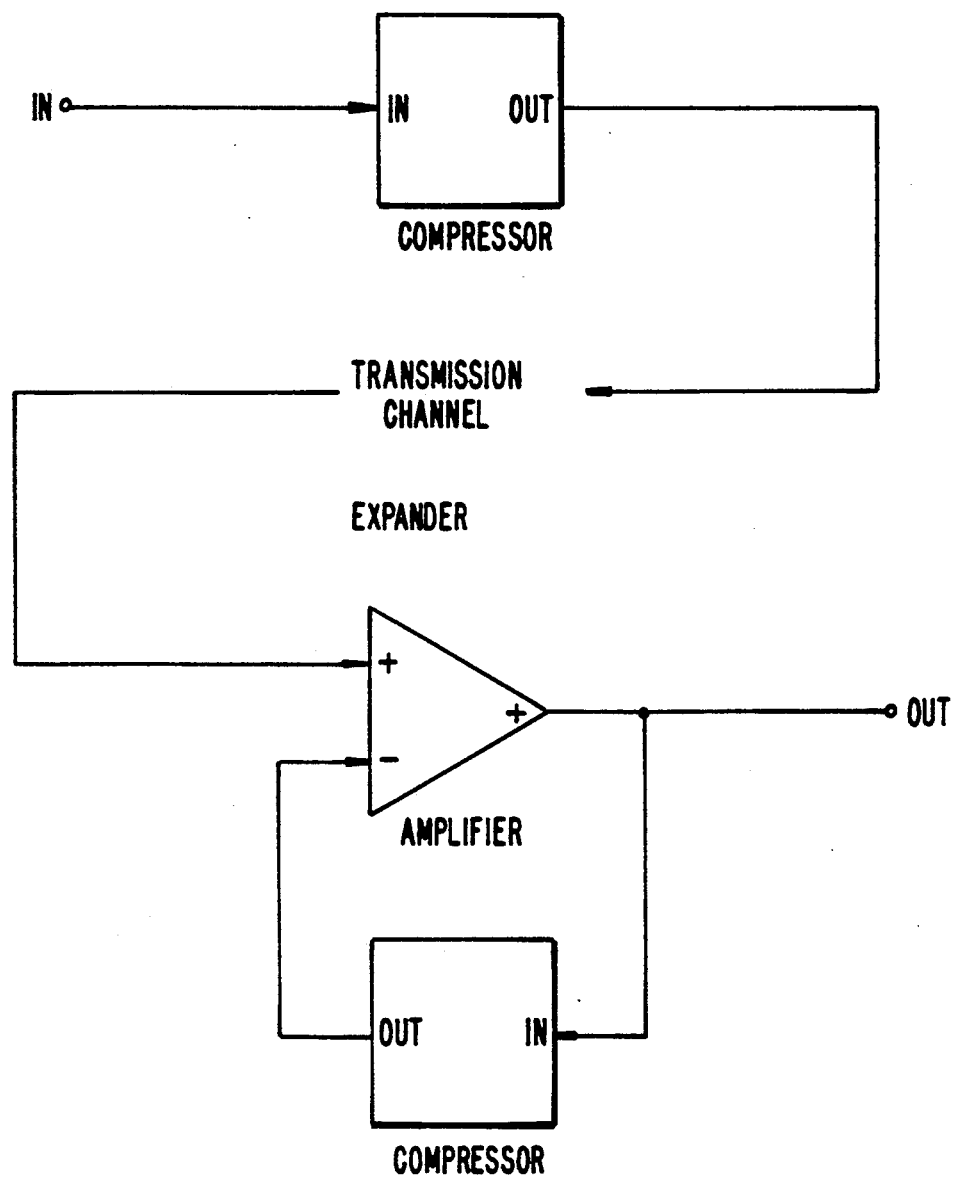
FIG._7B.

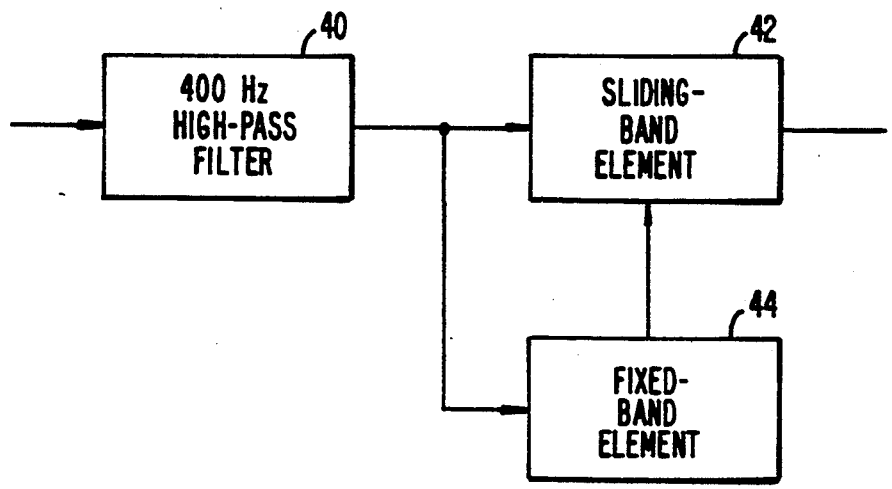
FIG._8.
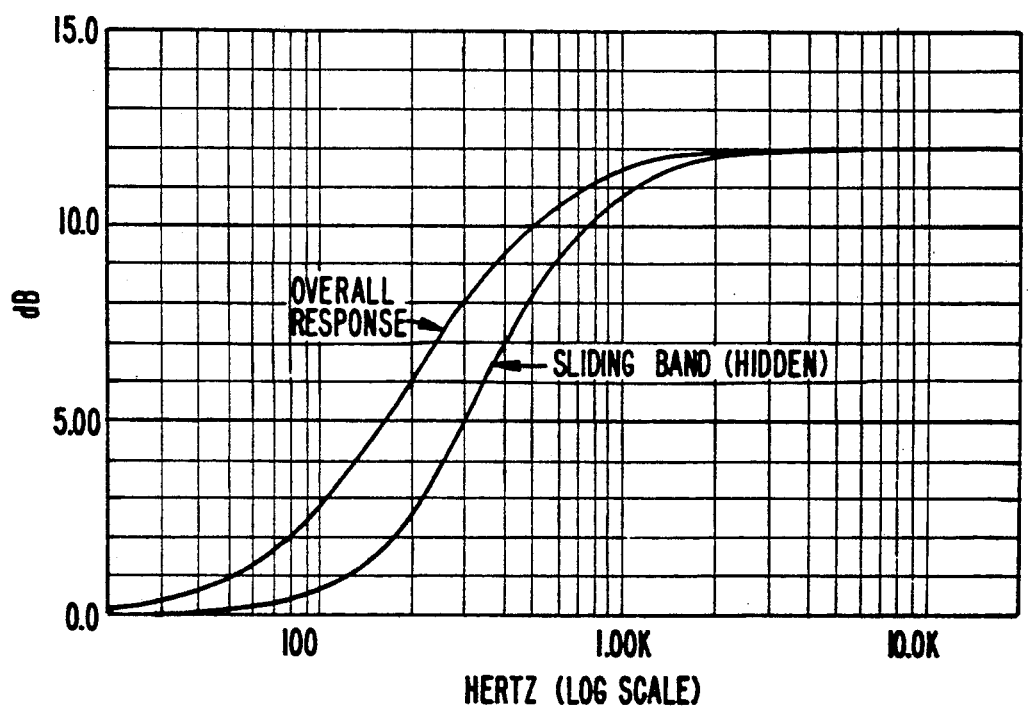
FIG._9A.

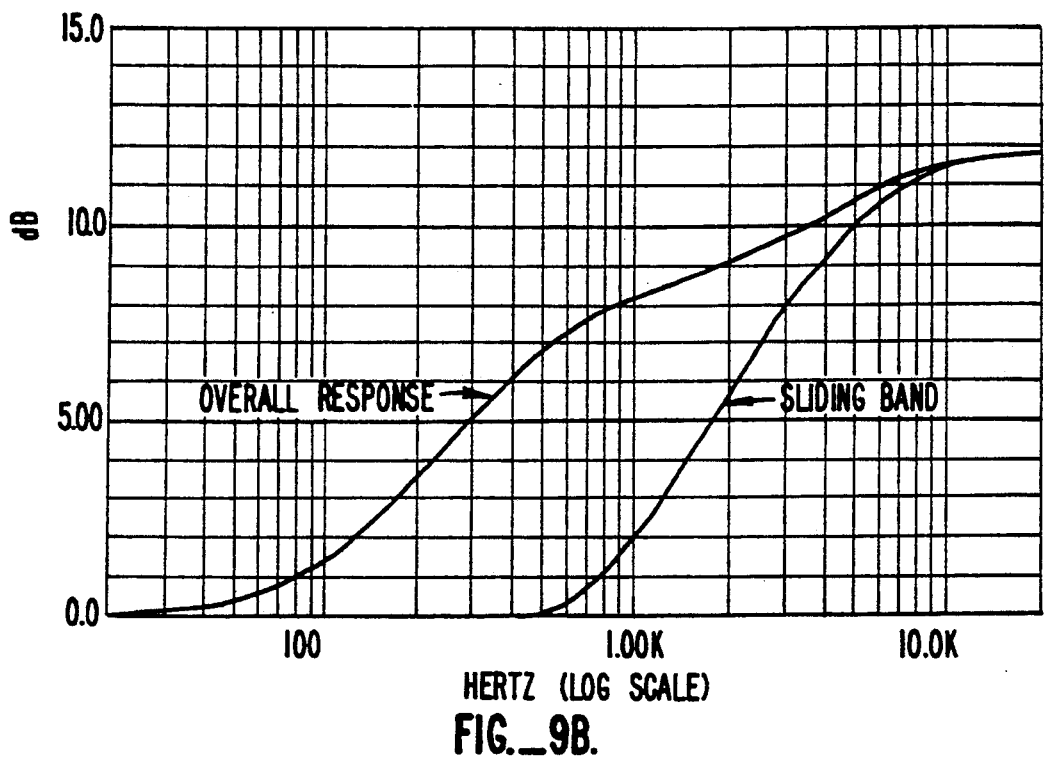
FIG._9B.
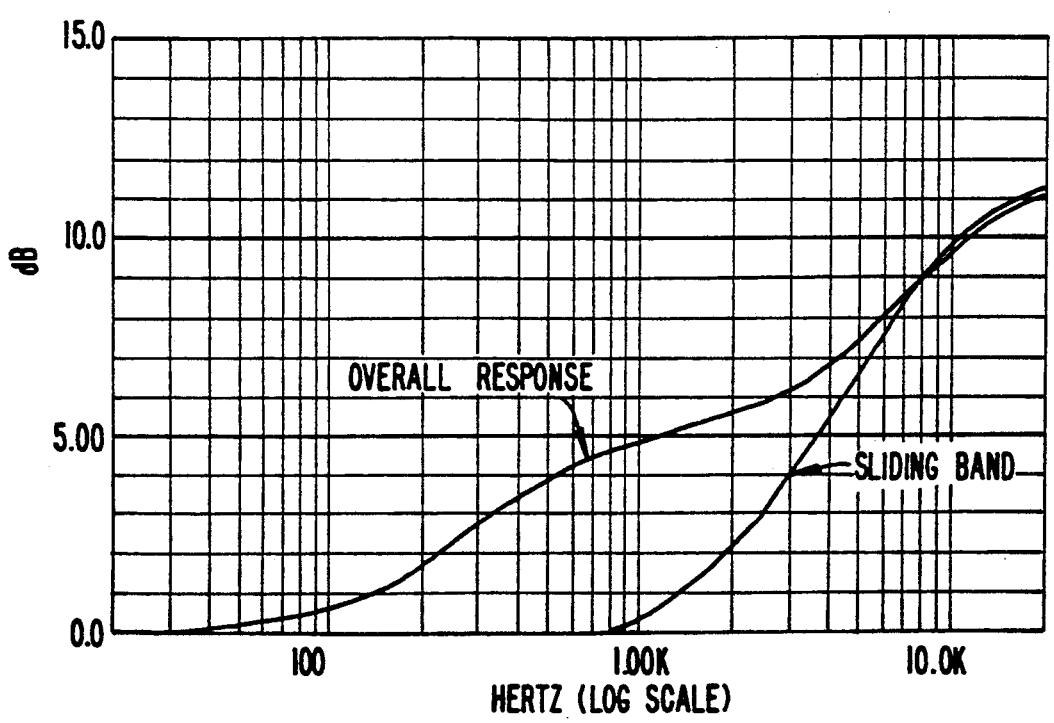
FIG._9C.

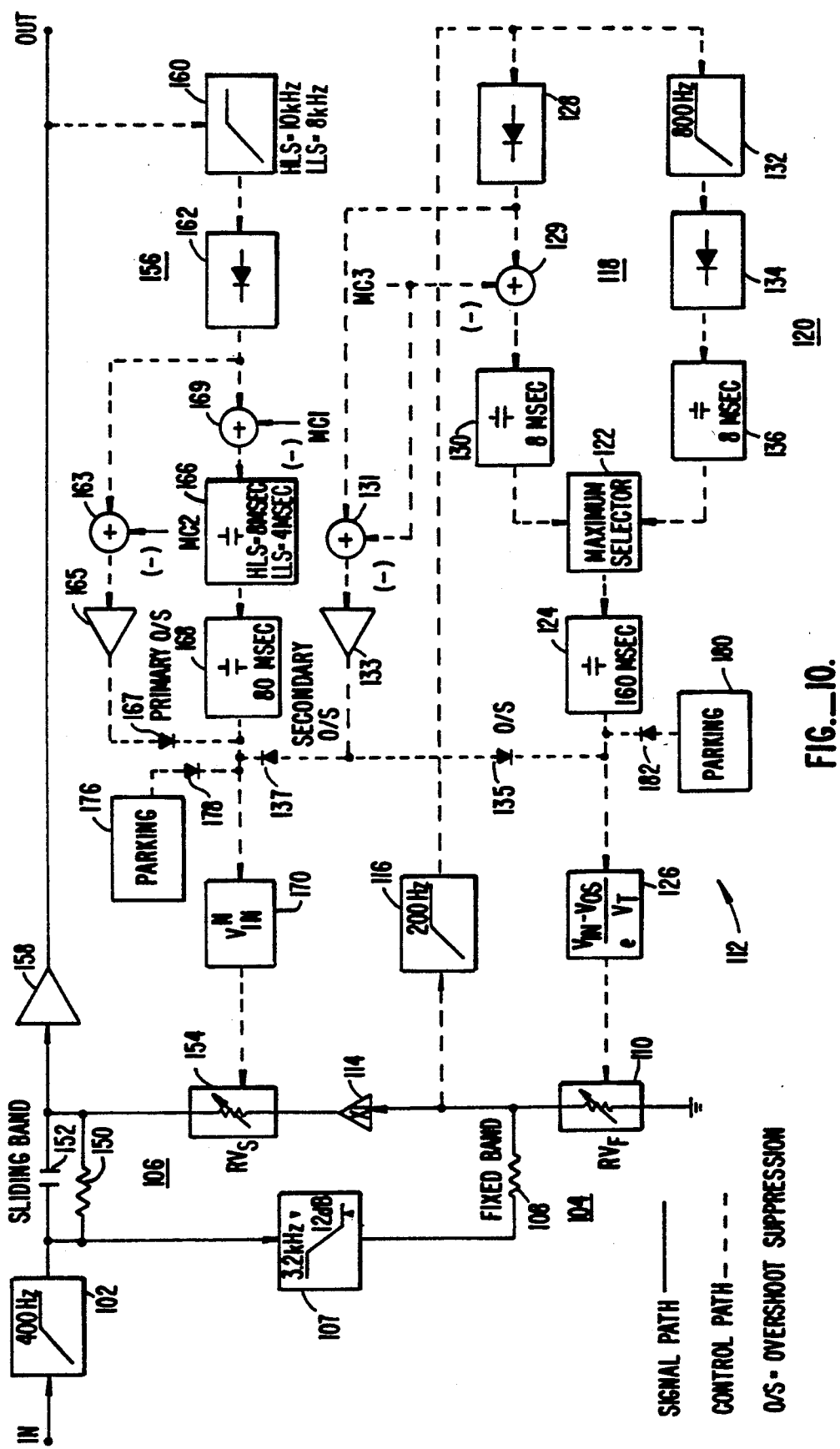
FIG._10.

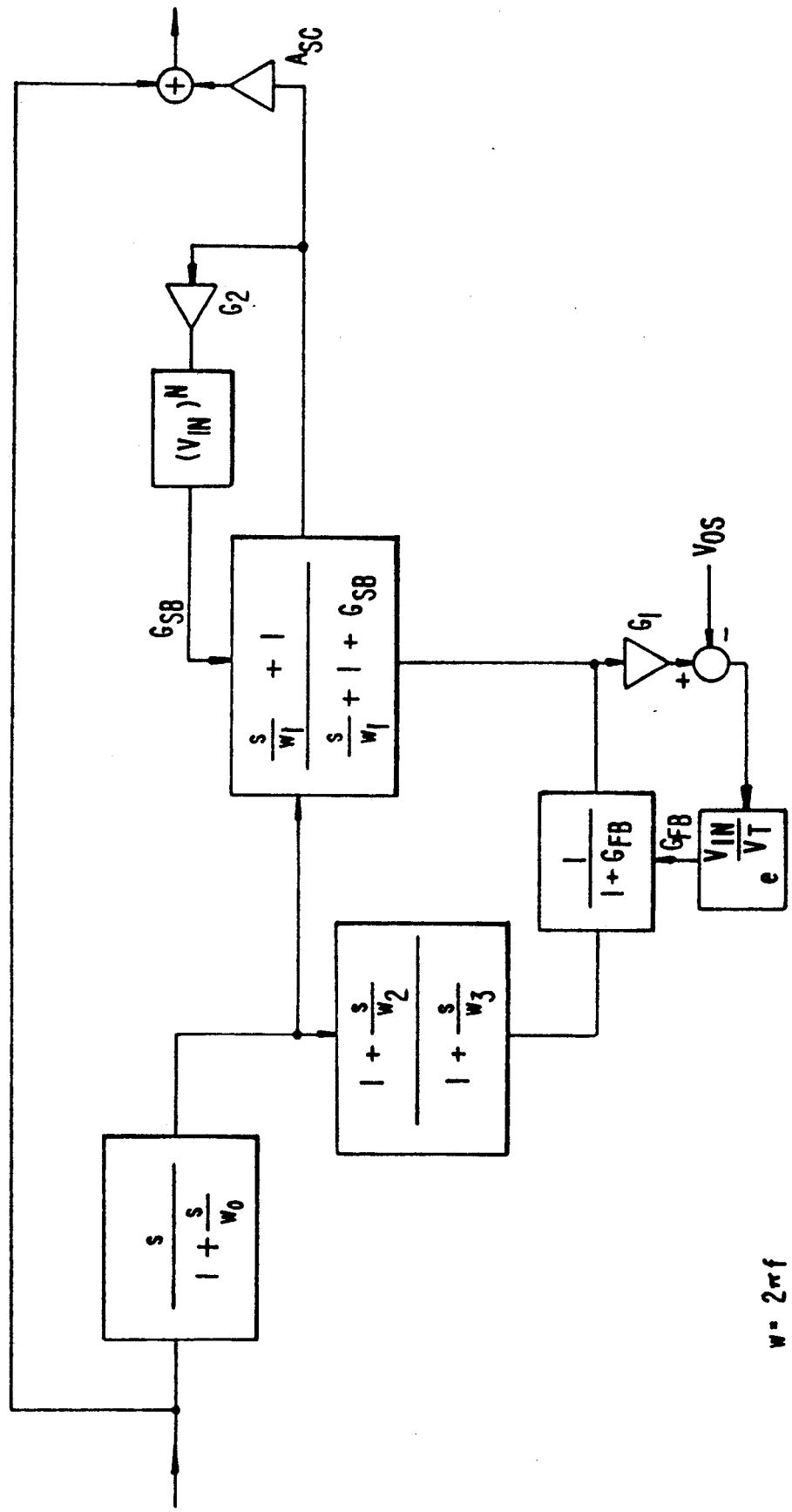
FIG._11.

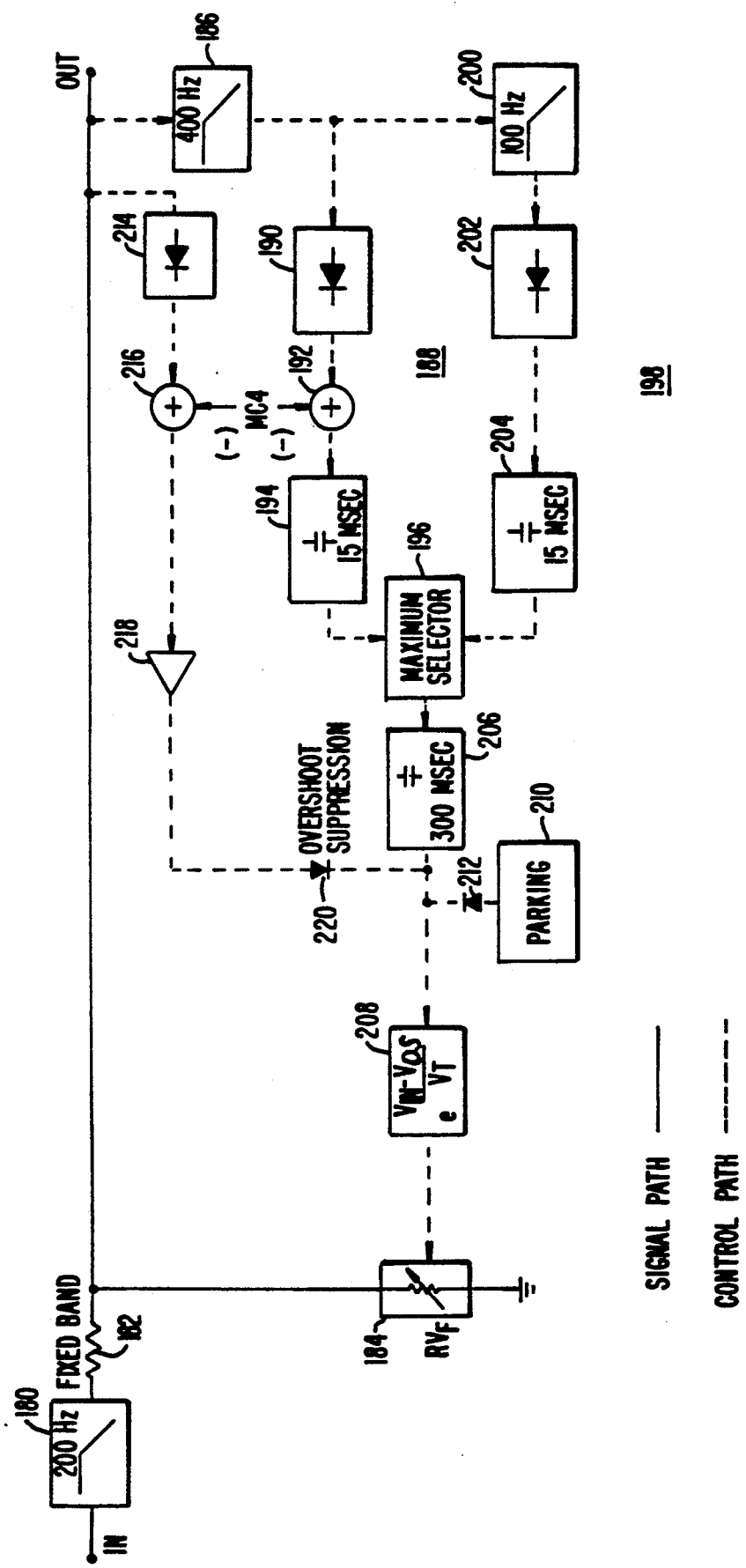
FIG._12.

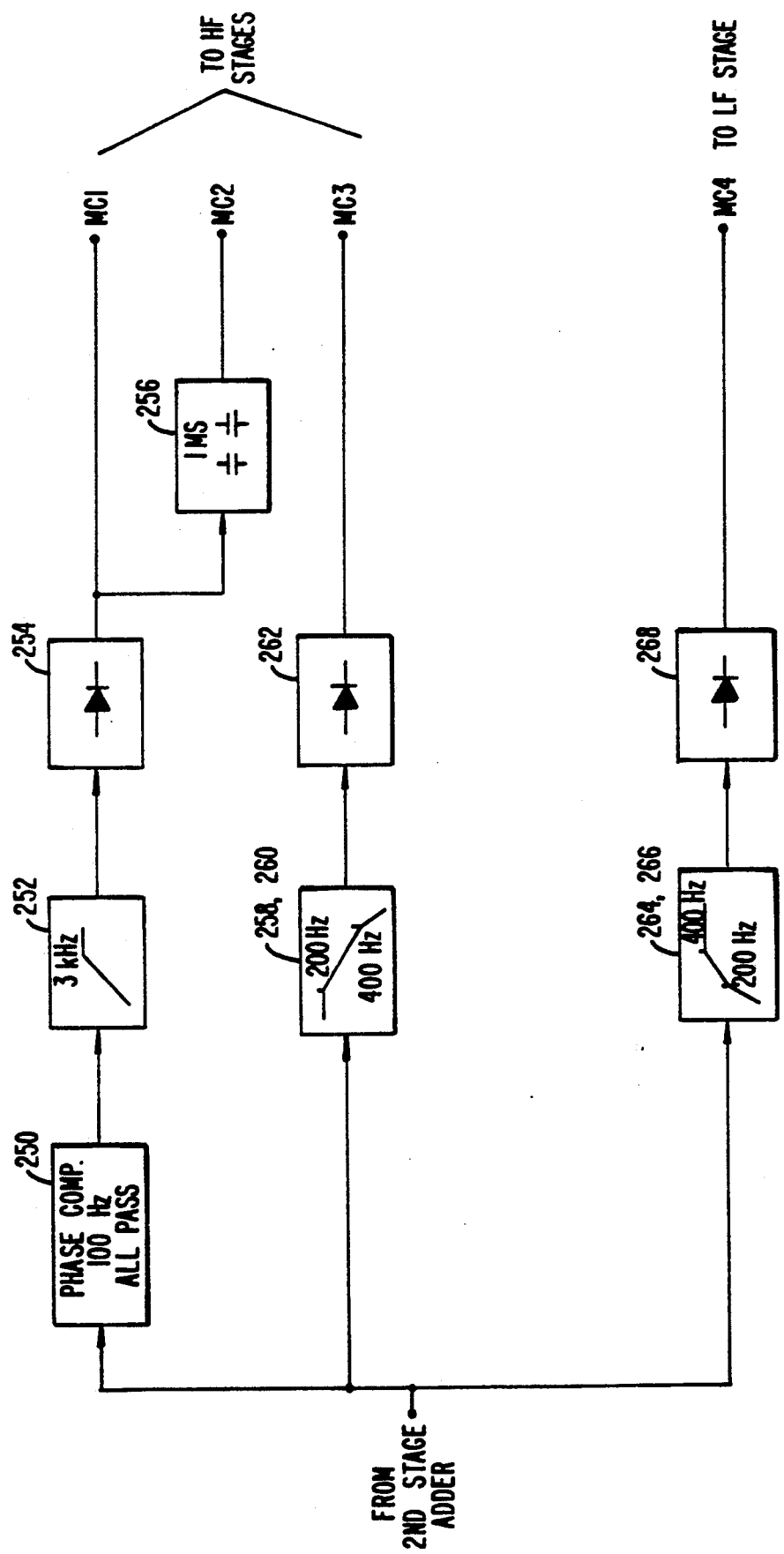
FIG._13.

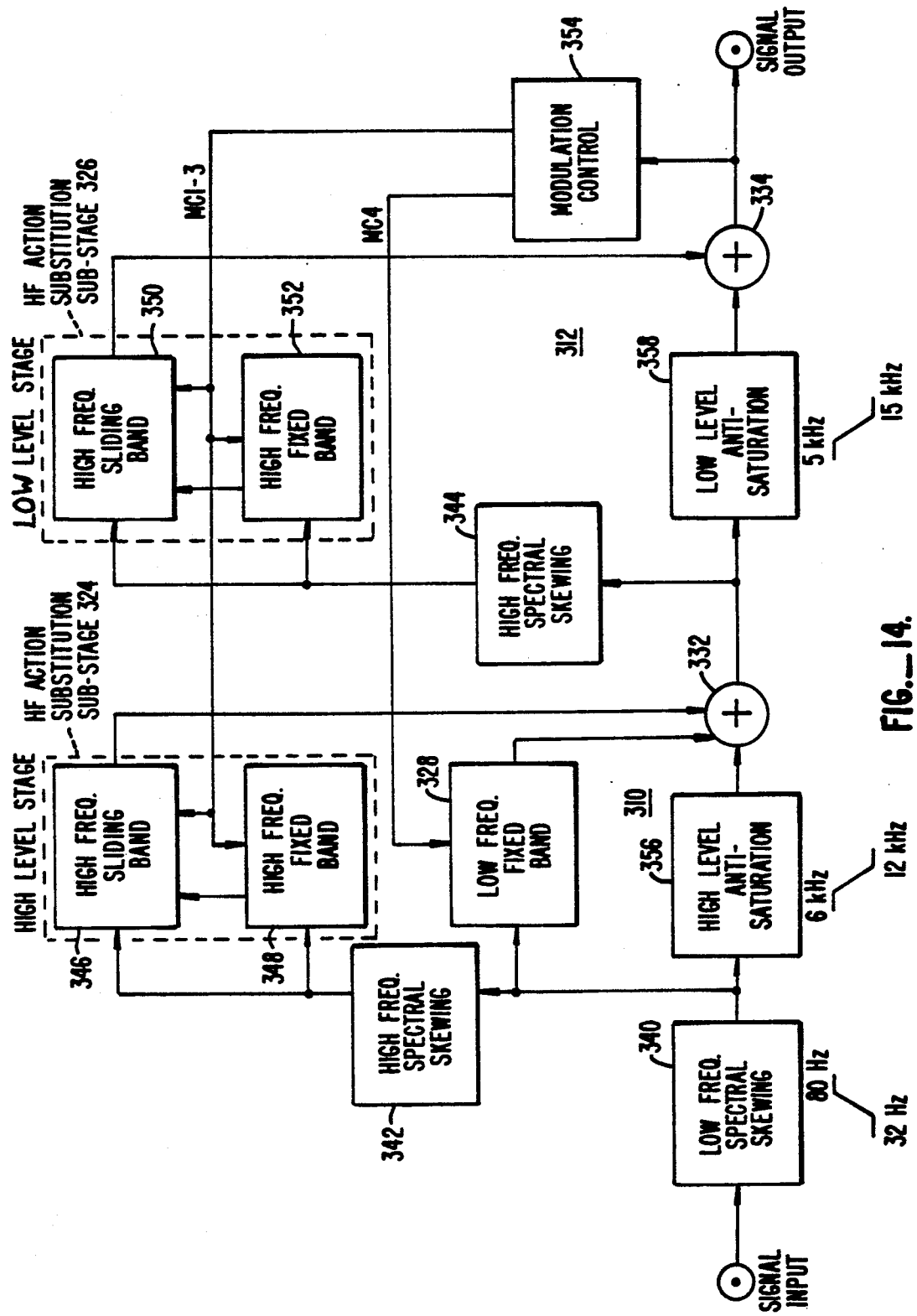
FIG._14.

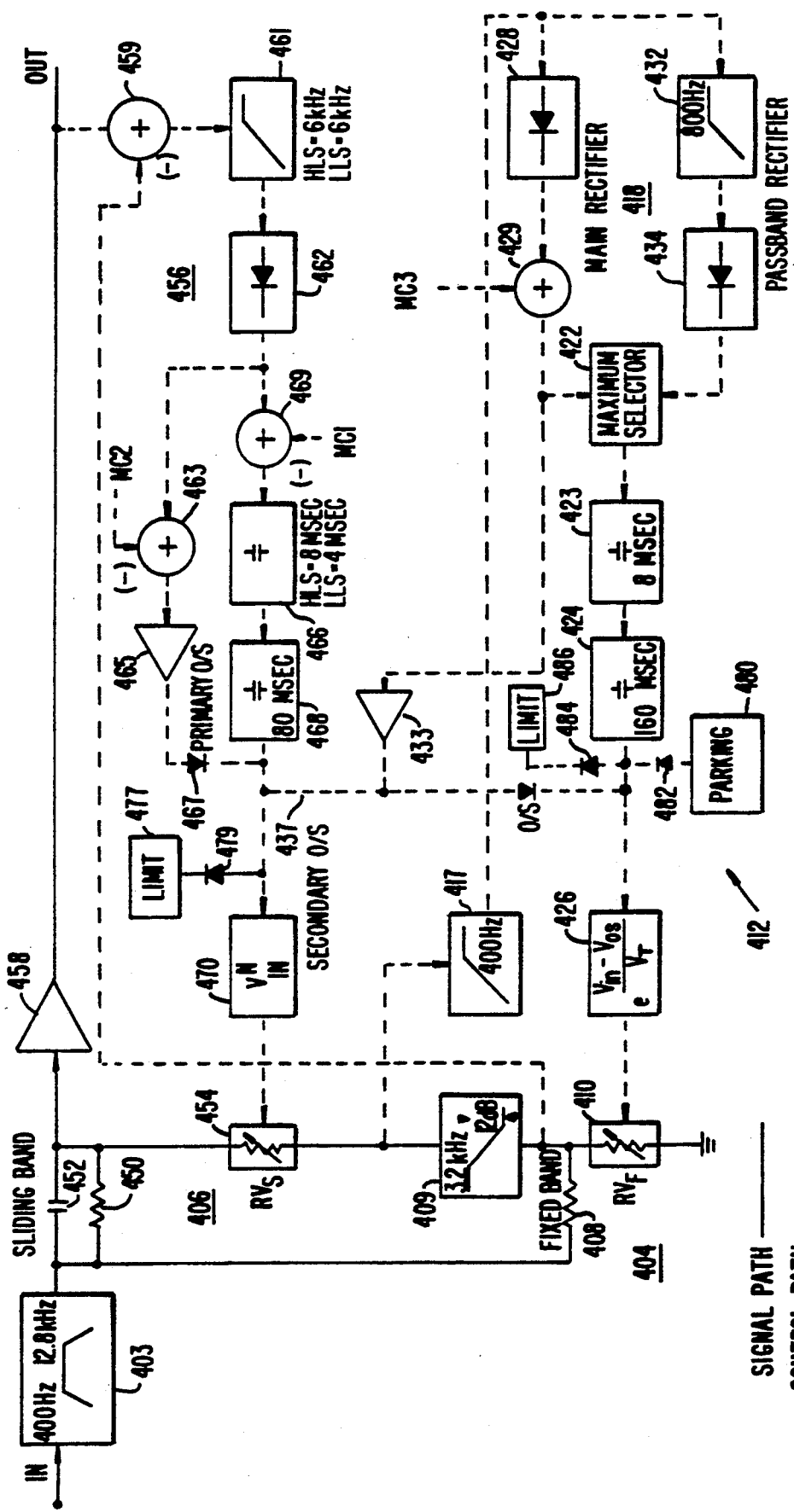
FIG._15.

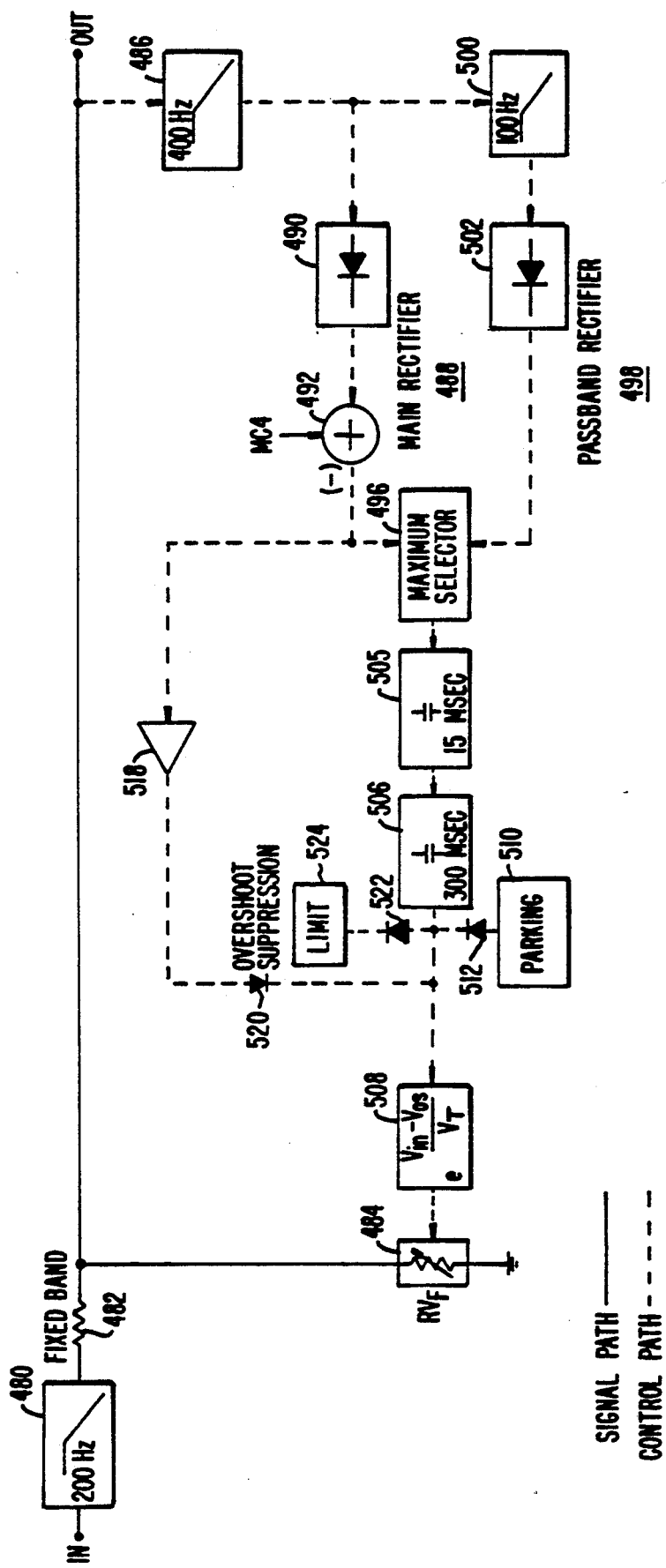
FIG._16.

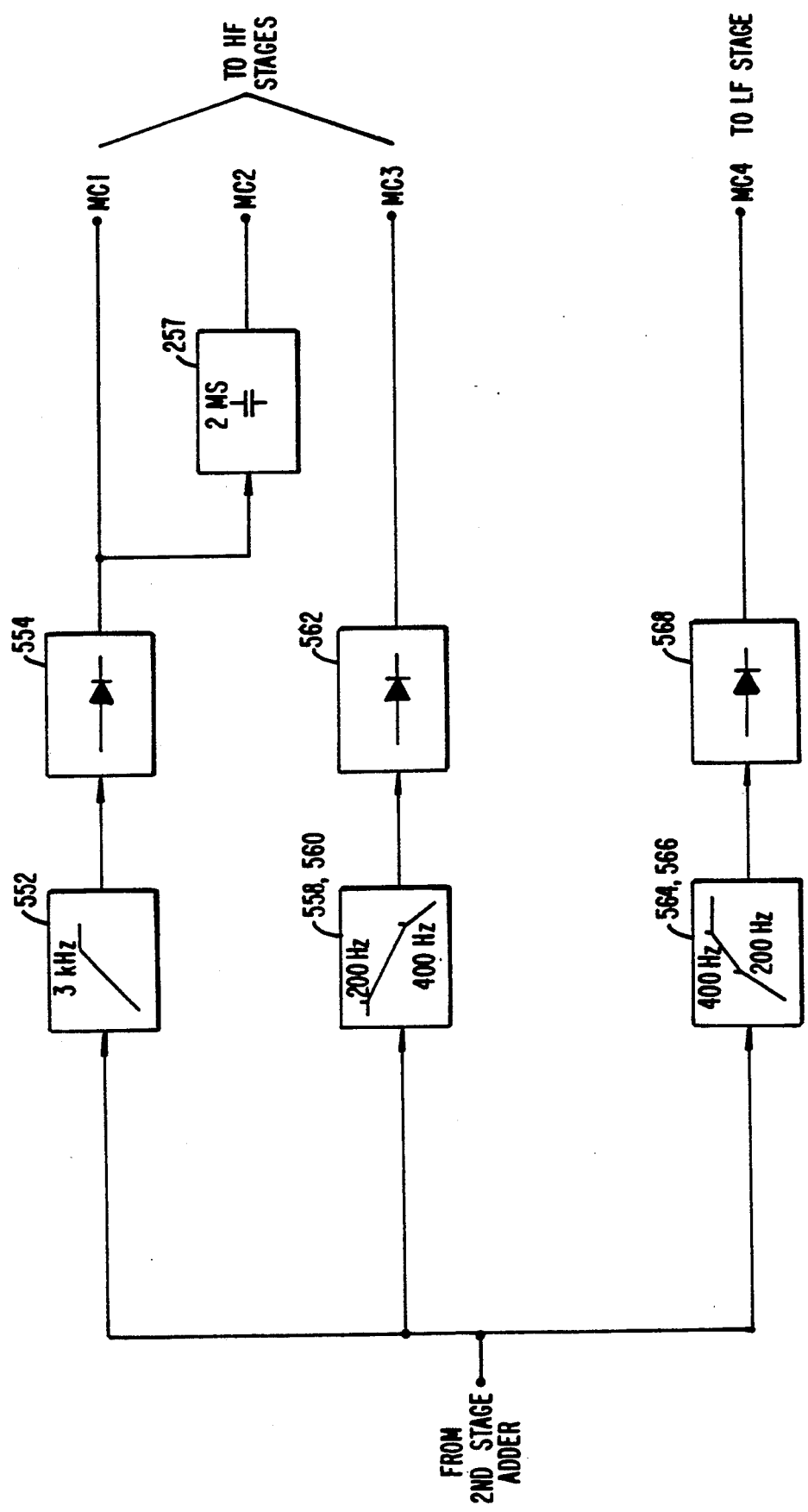

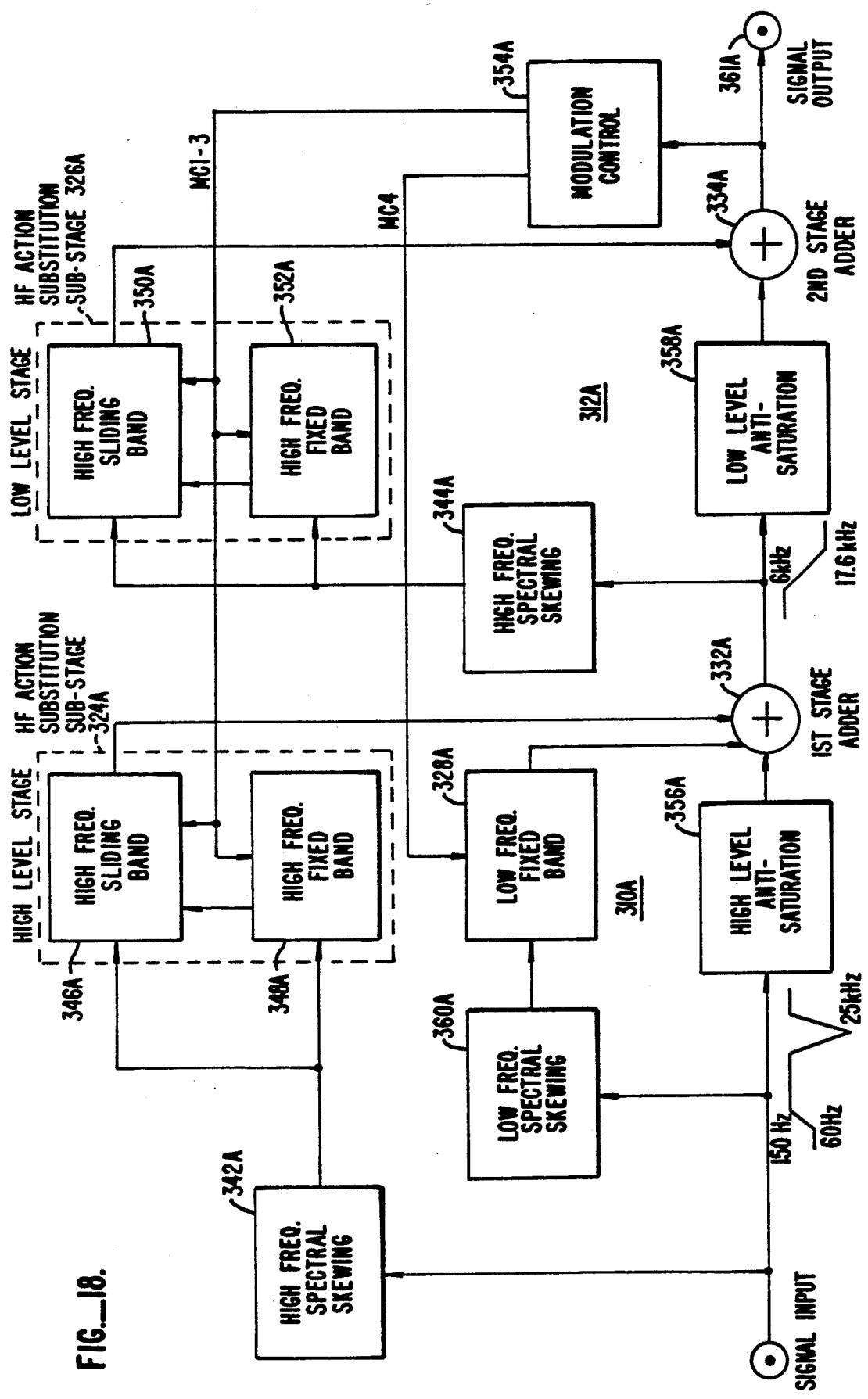
FIG._18.

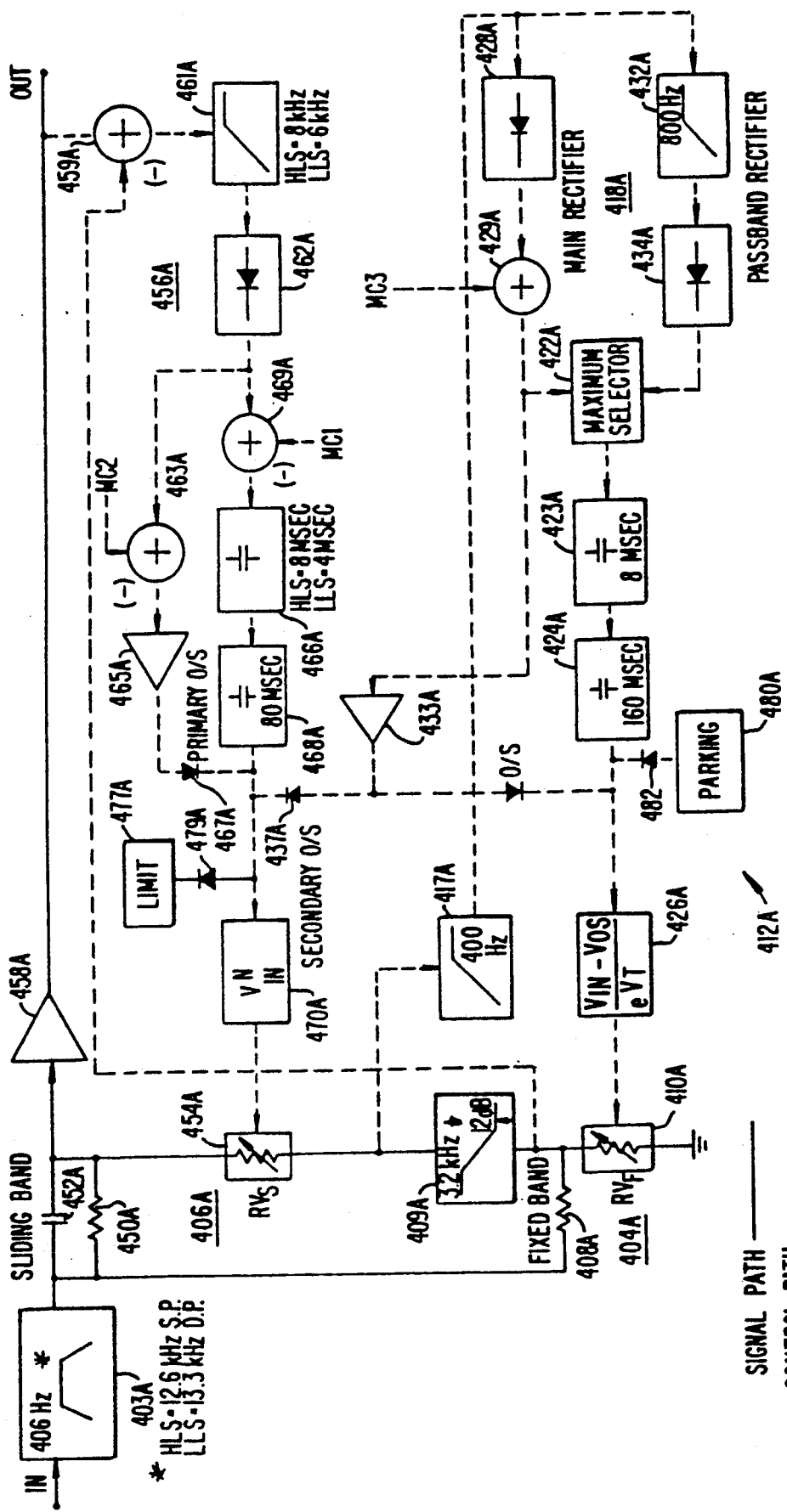
FIG._19.

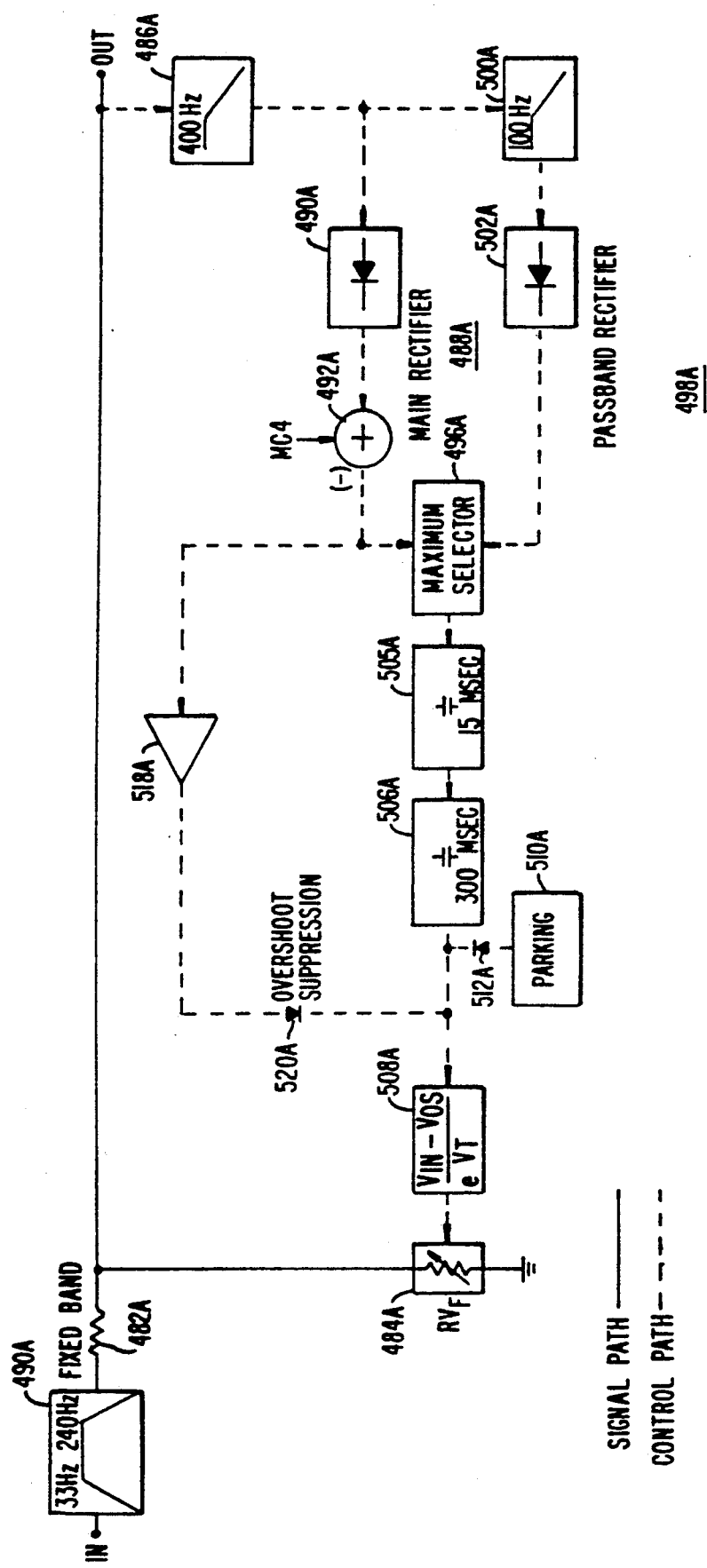
FIG._20.

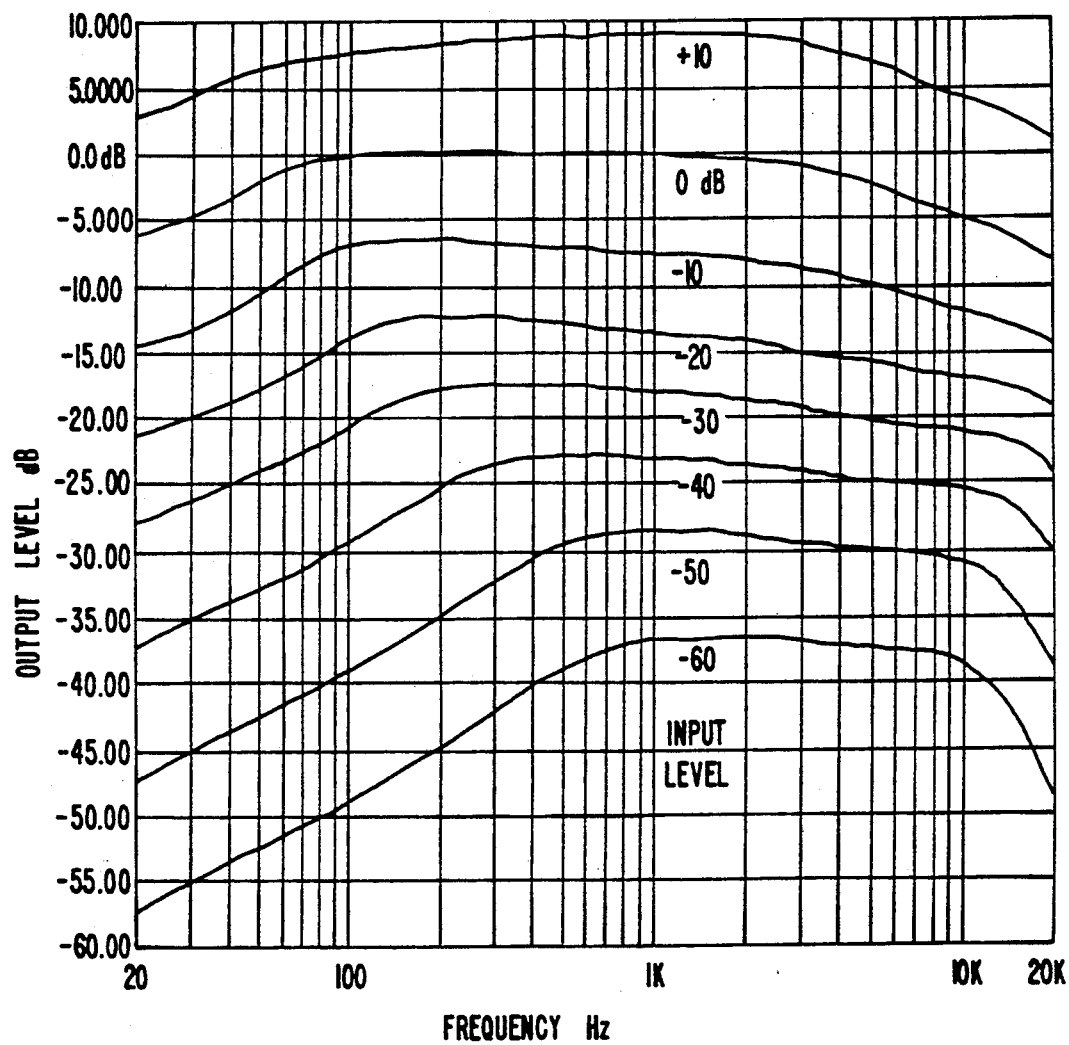
FIG._21.

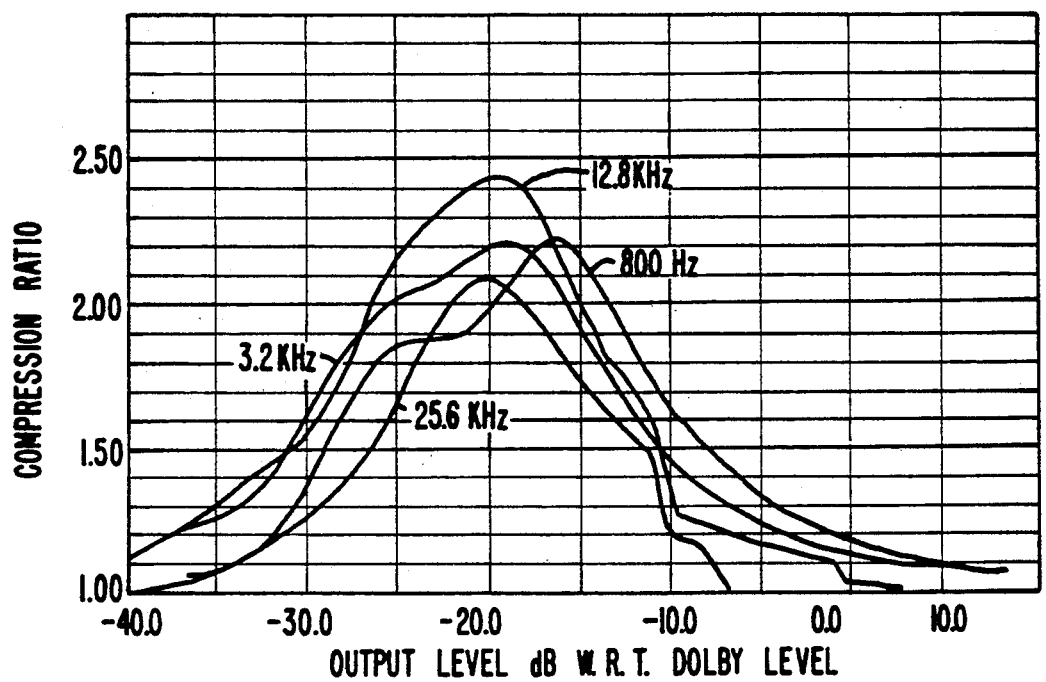
FIG._22B.
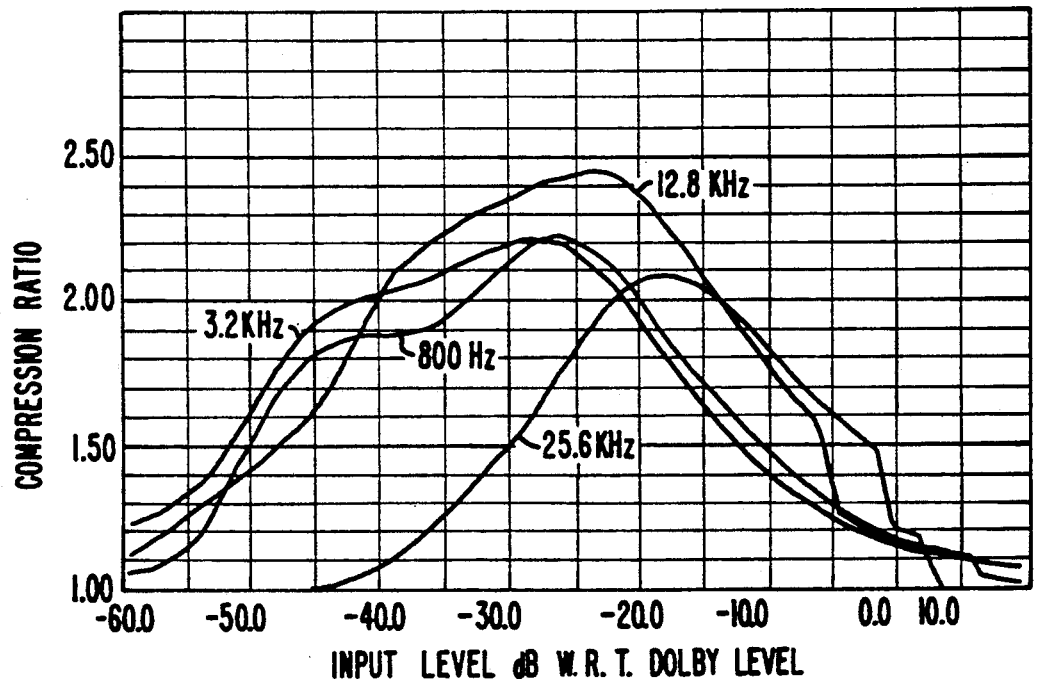
FIG._22A.

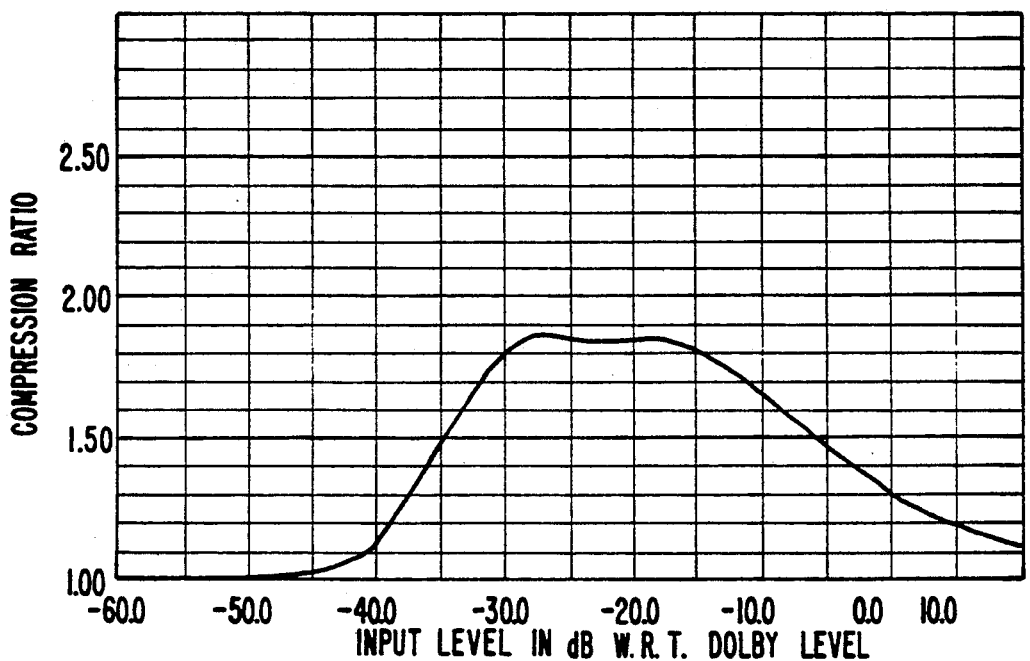
FIG._23A.
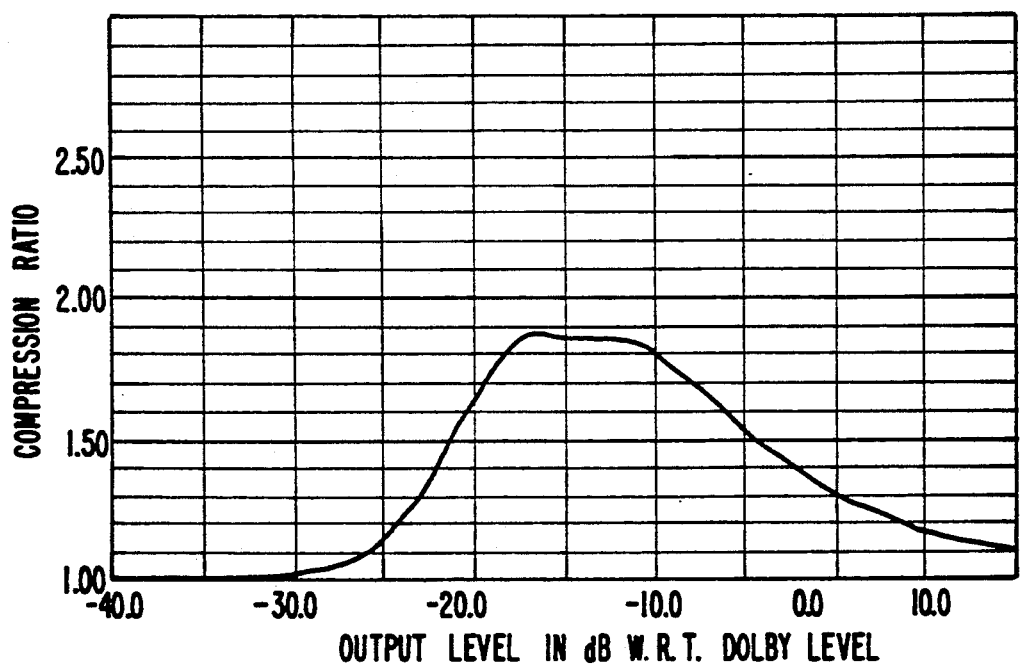
FIG._23B.

AUDIO COMPRESSOR, EXPANDER, AND NOISE REDUCTION CIRCUITS FOR CONSUMER AND SEMI-PROFESSIONAL USE

This application is a continuation-in-part of our parent application bearing the same title, Ser. No. 07/333,431, filed Apr. 3, 1989, now abandoned and our continuation-in-part application bearing the same title, Ser. No. 07/428,363, filed Oct. 27, 1989, now abandoned.

BACKGROUND OF THE INVENTION

I. General

The present invention is concerned in general with circuit arrangements which alter the dynamic range of audio signals, namely compressors which compress the dynamic range and expanders which expand the dynamic range.

Compressors and expanders are normally used together (a compander system) to effect noise reduction; the signal is compressed before transmission or recording and expanded after reception or playback from the transmission channel. However, compressors may be used alone to reduce the dynamic range, e.g., to suit the capacity of a transmission channel, without subsequent expansion when the compressed signal is adequate for the end purpose. In addition, compressors alone are used in certain products, especially audio products which are intended only to transmit or record compressed broadcast or pre-recorded signals. Expanders alone are used in certain products, especially audio products which are intended only to receive or play back already compressed broadcast or pre-recorded signals. In certain products, a single device is often configured for switchable mode operation as a compressor to record signals and as an expander to play back compressed broadcast or pre-recorded signals.

II. Adaptiveness: the Least Treatment Principle

A long sought after goal in the design of compressors, expanders and companding type noise-reduction systems is a high degree of adaptiveness of the compressor and expander to applied signals. A design philosophy embodying this goal has provided the foundation for a series of successful developments and refinements by Ray M. Dolby beginning in 1965 with A-type noise reduction and culminating recently in the Spectral Recording (SR) process, a highly adaptive signal processing system for high quality professional audio recording.

The underlying design philosophy, which was recently expressed as the "Least Treatment Principle"("The Spectral Recording Process" by Ray Dolby, *J. Audio Eng. Soc.*, 35, No. 3, 1987 March, pp. 99-118 at page 100) has its roots in the concept of "conformal equalization" mentioned in the U.K. Provisional Specification No. 43136 filed Oct. 11, 1965 of Ray M. Dolby. According to the Least Treatment Principle, the best treatment of the signal is the least treatment. The operating goal of the encoder is to provide fixed, predetermined gains for all frequency components of the signal, with corresponding attenuations in the decoder. If a large signal component appears at a particular frequency or frequencies, then the gains should be reduced at those frequencies only, in accordance with predetermined compression laws for restoration of the signal during decoding. In other words, the compressor should try to keep all signal components fully boosted at all times. When the boosting must be cut back at a particular frequency, the effect should not be extended to low-level signal components at other frequencies.

A. Adaptive Techniques

The just mentioned U.K. Provisional Specification (along with two other U.K. Provisional Specifications of Ray M. Dolby, Nos. 34394 and 02368, filed Aug. 11, 1965 and Jan. 18, 1966, respectively) and subsequent patents derived therefrom (including U.S. Pat. No. 3,846,719 and U.S. Pat. No. 3,903,485) employed several adaptive signal handling techniques, including, among others, techniques now commonly known as "bandsplitting," "fixed band," and "sliding band."

A recent patent of Ray M. Dolby, U.S. Pat. No. 4,736,433, and the above-cited article ("The Spectral Recording Process") are directed to a new type of compression and expansion action known as "action substitution" that is highly responsive to spectral changes. According to the action-substitution technique, fixed-band and sliding-band circuit elements may be used together in a unique arrangement that draws on the best features of both types of circuits to achieve a higher degree of adaptiveness than the use of either technique by itself. The basic principles of fixed-band, sliding-band, and action-substitution circuit operation are discussed below.

1. Older Adaptive Techniques a. Bandsplitting

According to the bandsplitting approach, the spectrum is divided into a plurality of frequency bands, each of which is acted upon independently. In that way a dominant signal component affects dynamic action (compression or expansion) only within a portion of the overall spectrum, in contrast to a wideband approach in which dynamic action throughout the entire spectrum is affected by a dominant signal component. Thus, a bandsplitting system provides a greater degree of adaptiveness or conformance than a wideband system.

In theory, a highly adaptive or conformal bandsplitting system could be provided by dividing the overall spectrum into a very large number of frequency bands; however, the complexity and cost of such an arrangement makes it impractical. Consequently, a design compromise is made by selecting a reasonable number of frequency bands capable of providing satisfactory performance.

One well-known commercially successful bandsplitting companding type audio noise-reduction system, known as A-type noise reduction, employs four frequency bands, a fixed-band circuit operating in each band: band 1, 80 Hz lowpass; band 2, 80 Hz to 3 kHz bandpass; band 3, 3 kHz high-pass; and band 4, 9 kHz high-pass. The basic elements of A-type noise reduction are described in "An Audio Noise Reduction System," by Ray M. Dolby, *J. Audio Eng. Soc.*, October 1967, Vol. 15, No. 4, pp. 383-388. The more recent but already well-known commercially successful bandsplitting compander-type audio noise-reduction system, known as Spectral Recording, mentioned above, employs two frequency bands: a low-frequency band and high-frequency band that broadly overlap at 800 Hz. Fixed-band/sliding-band action-substitution circuits operate in each band. Spectral Recording is described in greater detail below. Various A-type noise-reduction and SR products (encoders, decoders, encoder/decoders) are manufactured and sold by Dolby Laboratories.

b. Sliding Band

Another approach useful in working toward the goal of increased adaptiveness or conformance is the sliding-band (variable filter) technique, which employs signal dependent variable filtering to achieve limiting. Generally, a dominant signal component causes the cutoff or turnover frequency (or frequencies) of one or more variable filters (e.g., high-pass, low-pass, shelf, notch, etc.) to shift so as to compress or expand the dominant signal component.

A sliding-band system operating only in a single high-frequency band is described in U.S. Pat. No. Re 28,426 and U.S. Pat. No. 4,490,691. This system, which forms the basis for the well-known consumer companding type audio noise-reduction system known as B-type noise reduction (NR), includes, in a dual-path arrangement ("dual-path" arrangements are described below), a side path having a fixed high-pass filter in series with a variable filter. A total dynamic effect of up to about 10 dB is obtained at high frequencies.

A system providing twice as much total dynamic effect, known as C-type noise reduction, is described in "A 20 dB Audio Noise Reduction System for Consumer Applications" by Ray Dolby, *J. Audio Eng. Soc.*, Vol. 31, No. 3, 1983 March, pp. 98–113. Aspects of the C-type system are also set forth in said U.S. Pat. No. 4,490,691 of Ray M. Dolby. The C-type system has an arrangement of two compressors and two expanders in cascade, in which the dynamic action levels of the respective compressors and expanders are staggered so as to increase the overall dynamic action without significant accompanying increases of the overall maximum compression and expansion ratio.

C-type NR also employs a technique referred to as spectral skewing, described below, to reduce susceptibility to compressor/expander mistracking under certain conditions. A further development, antisaturation, also described below, reduces the tendency of media subject to frequency-dependent overload to saturate, thereby increasing the useful signal levels which can be handled. Spectral skewing and antisaturation are also employed in the Spectral Recording (SR) system described further below.

One drawback of sliding-band arrangements is that in the presence of a dominant high-frequency signal component the variable filter turnover frequency shifts to a frequency above that signal component thereby restricting the frequency area at lower frequencies in which noise reduction is provided. The loss of noise reduction may be more noticeable audibly than in band-splitting systems and the related side effects (noise modulation and signal modulation) may be more severe than in fixed-band arrangements because of a multiplication effect that is inherent in sliding-band systems.

The multiplication effect results from the way in which sliding-band systems provide compression. If, for example, there is a dominant high-frequency signal and 2 dB of gain reduction is required at that frequency, the variable filter cutoff frequency should shift to the extent necessary to provide that amount of attenuation along the filter slope. However, for lower frequencies, further removed from the new filter cutoff frequency, the effect may be 5 or 10 dB of dynamic action, for example, with a consequent loss of all or most of the noise-reduction effect along with possible audible signal or noise modulation. In other words, in this example, a 2 dB change in a dominant signal can cause a 5 or 10 dB change in gain at frequencies removed from the dominant signal. FIG. 1 is an idealized compressor characteristic response curve illustrating this effect. (Throughout this document the characteristic response curves illustrated in the various FIGS. are those of compressors, it being understood that the respective expander characteristic is the complement of the compressor characteristic.)

Under relatively rare conditions, when very high-frequency dominant signal components (cymbals, for example) control the sliding-band filter, there may be audible modulation of non-dominant mid-band signal components that are also present if the expander does not properly "track" the compressor (in a complementary noise reduction system, the control signal developed in the encoder should be accurately reproduced in the decoder). This problem is called the "mid-band modulation effect." One approach in solving the problem, spectral skewing, described below, is set forth in said U.S. Pat. No. 4,490,691.

c. Fixed Band

In a fixed-band arrangement the same amount of gain reduction occurs throughout the frequency band (whether wide band or one frequency band of a band-splitting system) in response to a dominant signal component. Fixed-band elements can be configured as variable gain or variable loss devices, as discussed in U.S. Pat. No. 4,498,055. Thus, while signal or noise modulation may occur, there is no multiplication of the effect: a 2 dB change in the level of a dominant signal component causes no more than a 2 dB change in gain at frequencies removed from the dominant signal component. However, viewed from the standpoint of noise-reduction effect this is a disadvantage of a fixed-band arrangement—the full noise-reduction effect is not obtained anywhere within the frequency band of operation when limiting occurs in response to a dominant signal component. FIG. 2 is an idealized compressor characteristic response curve illustrating this effect. Although it is not multiplied, there is also the potential for noise and signal modulation throughout the entire frequency band in which the fixed-band action occurs.

2. Action Substitution a. Combining Fixed Band and Sliding Band

Despite the disadvantages mentioned, an advantage of a sliding-band arrangement is that the full noise-reduction effect is obtained at frequencies above the dominant signal component (or below the dominant signal component in the case of a sliding-band system acting downward in frequency). Thus an arrangement that achieves the advantages of fixed-band and sliding-band systems (e.g., the advantage of fixed band is that there is no multiplication of modulation effects and the advantage of sliding band is that there is minimum signal or noise modulation above the dominant signal frequency) without the disadvantages of each (e.g., the disadvantage of fixed band is noise and signal modulation throughout its operating range—although not multiplied and the disadvantage of sliding band is the mid-band modulation effect) would be desirable. The aforementioned action-substitution technique permits such a combination of sliding band and fixed band advantages.

b. Theory of Action Substitution

Action substitution, which is the subject matter of said U.S. Pat. No. 4,736,433 of Ray M. Dolby, is based on the recognition that the ideal of conformal equalization can be more closely approached by compressor, expander and compander type noise-reduction arrangements in which a plurality of compression/expansion/equalization characteristics are superposed or overlaid upon one another in such a way that one or more of the characteristics is hidden or concealed until, as dominant signal components appear, the hidden characteristics are revealed and become active. Thus, according to the action-substitution technique, the quiescent characteristic, which provides a defining umbrella or envelope that conceals one or more latent characteristics, is modified so that the latent characteristic or characteristics emerge in response to dominant signal components in order to provide a more effective adaptive equalization than provided by earlier circuit arrangements.

This unveiling of characteristics can be described as "action substitution" in the sense that the action resulting from one (or perhaps more than one) characteristic is substituted for one or more other characteristic actions that have the potential to operate in the same frequency and level regions when the level and spectral content of the input signal components change. Preferably, the substitution is such that, with respect to any non-dominant signal components, the transmission is maximized in the compressor and minimized in the expander.

Compressors, expanders and noise-reduction compander systems employing action substitution have improved abilities to discriminate among dominant and non-dominant signal components and to confine dynamic action to dominant signal components only. By providing a noise-reduction encoder (compressor) which essentially maintains a constant boost except where there is a dominant signal component, the noise-reduction decoder (expander) has a very stable noise floor, which is essential to a high quality noise-reduction system.

Although action substitution is applicable generally to combinations of elements having various dynamic and passive characteristics, a very useful combination of characteristics in practice is the superposition of a fixed-band dynamic characteristic and a sliding-band dynamic characteristic. Thus, if a sliding-band characteristic and a fixed-band characteristic are superposed in substantially the same frequency range (wide band or a defined band) and level range, the quiescent characteristic of the superposed combination appears the same as the quiescent characteristic of either one taken alone because the two quiescent characteristics are the same. When a dominant signal component appears within their frequency range each characteristic reacts—the fixed-band characteristic drops uniformly in level across the frequency range similar to the way it would if acting by itself and the sliding-band characteristic slides similarly to the way it would if acting by itself.

The sliding-band and fixed actions are no longer independent: to some extent each acts with reference to the other. When these changes occur the two characteristics, which appeared as one characteristic in the quiescent condition (FIG. 5A), are now revealed: the combined characteristic appears as that of a sliding-band characteristic above (or below, depending on whether the sliding band acts upwardly or downwardly in frequency) the frequency of the dominant signal and it appears as a fixed-band characteristic below (or above) the frequency of the dominant signal.

FIG. 5B shows an example in which the sliding band is above the dominant signal and FIG. 5C shows an example in which the sliding band is below the dominant signal. Two regimes of operation are revealed, divided at the frequency of the dominant signal. Thus, the region which the sliding-band characteristic would have left "uncovered" is supplemented by the fixed-band characteristic which, in effect, provides a floor or foundation level. In other words, there is a substitution of action in response to the dominant signal component.

An action-substitution arrangement thus obtains the advantages of both fixed-band and sliding-band arrangements while avoiding their disadvantages. Maximum noise-reduction effect and minimum modulation effects are obtained above (or below) the dominant signal where the sliding-band characteristic operates while avoiding the loss of noise reduction and the mid-band modulation effect below (or above) the dominant signal by the presence of the fixed-band characteristic. Thus, there is no multiplication effect below (or above) the dominant frequency as would occur if the sliding-band characteristic were operating alone, while obtaining the advantages of the sliding-band characteristic above (or below) the dominant frequency.

III. Other Basic Concepts of Noise Reduction Systems

A. Complementarity

A dominant signal component is a signal component having a substantial enough level so as to effect dynamic action within the frequency band under consideration. Under complex signal conditions there may be more than one dominant signal component or a dominant signal component and sub-dominant signal components. In a compander system which relies on complementarity of the compressor and expander, all of the signal components must be compressed and expanded in accordance with a defined compression/expansion law in order for the signal spectrum, including the dominant signal component (and other signals affected by dynamic action), to be restored to their correct levels in the expander. This requirement excludes the usefulness in compander systems of various known adaptive and tracking filter techniques and so-called "single ended" noise-reduction systems (which operate only on a reproduced signal) in which the filter action is not subject to predetermined compression/expansion laws and whose action may be unpredicatable in the presence of multiple signals.

For all the signal components, including the dominant signal component, to be restored to their correct levels in the expander, the characteristics of the expander must match those of the compressor. This can be achieved, for instance, by making an expander by placing a compressor in the feedback loop of a high gain amplifier. For the expander to match the compressor exactly, however, the signal entering the expander must be identical to the signal that left the compressor. This requirement can easily be met if the compressor output and the expander input are connected by means of, for instance, a short piece of wire, but is much harder to meet if a practical medium, with frequency- and level-dependent limitations and errors, is interposed between compressor output and expander input. Errors in the medium will be compounded by frequency- and/or level-dependent mistracking between compressor and expander unless the noise reduction system is designed to tolerate such errors.

A-type, B-type and C-type noise reduction all use a simple bandwidth limiting filter located at the input of the compressor to reduce mis-tracking caused by input signals at frequencies higher than the maximum transmission frequency of the medium. Another noise reduction system, dbx II, ® has instead a bandwidth limiting filter located in the input to its control circuit. Spectral skewing, used alone or in conjunction with a bandwidth limiting filter, considerably reduces the amount of mis-tracking caused by errors in the medium.

1. Spectral Skewing

Spectral skewing is fully described in U.S. Pat. No. 4,490,691 and will thus be described only briefly here. Spectral skewing reduces the ability of errors in the medium to cause tracking errors by reducing the noise reduction circuit's noise reduction effect at frequencies towards the extremes of the audio spectrum. This noise reduction effect can be given up without increasing the audible noise reduction effect because of the ear's reduced sensitivity to low-level noise at such frequencies.

In conventional implementations of spectral skewing, the compressor is preceded by a circuit which sharply attenuates signals at frequencies near the extremes of the audio frequency band, say above 10 kHz and below 50 Hz. This reduces the level of such signals entering the compressor, and thus reduces their contribution to the compressor control signal relative to the contribution of signals at frequencies in the middle of the audio band. The action of the compressor is thus controlled mainly by mid-frequency signals.

The frequency response shaping caused by the spectral skewing circuit in the compressor still exists in the signal entering the expander. Thus, the action of the expander will also be controlled mainly by mid-band signals. Tracking is improved because the dynamic action of the compressor and the expander is controlled mainly by signals which are less subject to errors. A spectral de-skewing circuit located at the output of the expander restores the original frequency response of the signal and, as a result, boosts the noise level of the medium. However, a significant spectral skewing effect can be obtained without noticeably increasing the overall audible noise level because the increased noise level occurs only at frequencies at which the ear has a low sensitivity to low-level noise.

A further advantage of spectral skewing is that it reduces the likelihood of tracking errors caused by level-dependent errors in the medium (e.g. tape saturation) because the spectral skewing circuit reduces the level at which signals at frequencies near the extremes of the audio band are presented to the medium. This is an important advantage because, in many media, the level at which level-dependent errors occur progressively decreases towards one or both extremes of the audio band.

a. The Disadvantages of Spectral Skewing

Spectral skewing can be regarded as a signal conditioning accessory to a noise reduction system. Spectral skewing changes the spectral balance of the signal on which the compressor and expander operate, but it otherwise has no effect on the way in which the noise reduction circuit itself operates. In particular, spectral skewing does not reduce the amount of noise reduction effect produced by the noise reduction circuit itself, even though the noise reduction effect of the combination is reduced at frequencies near the extremes of the audio frequency band. Spectral skewing thus does not reduce the peak or average compression ratio of the noise reduction circuit at such frequencies. A lower compression ratio is desirable because it would reduce the amount of mis-tracking caused by a given error in the medium.

Spectral skewing also has a further disadvantage in that, at the frequencies at which it operates, it raises the input levels at which dynamic action starts and finishes. This means that, compared with no spectral skewing, there is a greater chance that the compressor may be giving a significant compression effect (and hence error multiplication effect) at signal levels at which level-dependent errors in the medium can occur. This effect is only partially ameliorated by the reduction in signal level presented to the medium.

Finally, the amount of spectral skewing that can be practically applied to the compressor is limited by the need for spectral de-skewing in the expander. If the spectral skewing circuit in the compressor applies a very large amount of attenuation, then a very large amount of amplification, with attendant phase-shift and noise problems, is required in the expander to restore an overall flat frequency response. Practical spectral skewing circuits thus tend to have a shelf or notch characteristic, which limits their effectiveness.

2. Anti-Saturation

Anti-saturation is fully described in U.S. Pat. No. 4,490,691 and will thus be described only briefly here. Anti-saturation is a further way of preventing mistracking caused by level-dependent errors in the medium. It operates in the compressor by reducing the signal level presented to the medium, and thus increases the input signal level at which medium overload occurs. The anti-saturation circuit is located in the main path of a dual circuit and thus changes the frequency response of the compressor at high levels only. This is in contrast to conventional spectral skewing which changes the frequency response by the same amount at all levels. An anti-saturation circuit, being located in the main path only, has no effect on the compressor control circuit. It does, however, increase the compression ratio, because it reduces the amplitude of the main-path signal relative to the side-path signal. Finally, a complementary anti-saturation circuit is needed in the main path of the expander to restore a flat overall frequency response.

B. Dual Path

A "dual-path" arrangement is one in which a compression or expansion characteristic is achieved through the use of a main path which is essentially free of dynamic action and one or more secondary or side paths having dynamic action. The side path or paths take their input from the input or output of the main path and their output or outputs are additively or subtractively combined with the main path in order to provide compression or expansion. Generally, a side path provides a type of limiting or variable attenuation and the manner in which it is connected to the main path determines if it boosts (to provide compression) or bucks (to provide expansion) the main-path signal components. Such dual-path arrangements are described in detail in U.S. Pat. Nos. 3,846,719; 3,903,485; 4,490,691, 4,736,433, 4,922,535, and U.S. Pat. No. Re 28,426. Although fixed-band, sliding-band, and action-substitution circuits may be implemented as dual-path or single-path arrangements, dual-path implementations have certain advantages and are preferred.

C. Type I and Type II Configurations

Fixed-band, sliding-band, and action-substitution circuits, implemented as dual-path or single-path arrangements can be used as building blocks in creating compressors, expanders and noise-reduction companders. For example, such circuits may be employed as side paths in dual-path arrangements in the manner shown in FIGS. 3 and 4.

In FIG. 3 a Type I dual-path arrangement (of the type generally described in U.S. Pat. No. 3,846,719) is shown having a compressor 1 in which the input signal is applied to a fixed-band, sliding-band, or action-substitution circuit 2 and to the main path 3. The output of circuit 2 is then summed with the main-path signal components in summing means 4 to provide the compressor output for application to a transmission channel. The side-path signal components thus boost the main-path signal components causing compressor action. The transmission channel output is applied to the expander 5, configured in a complementary manner to the compressor 1, which has an input summing means 4 which receives the transmission channel output and subtracts the output of the fixed-band, sliding-band, or action-substitution circuit 2. The side-path signal components thus buck the main-path signal components causing expander action.

In FIG. 4, a Type II dual-path arrangement (of the type generally described in U.S. Pat. No. 3,903,485) is shown having a compressor 6 which has an input summing means 4 receiving the input signal and the output of the fixed-band, sliding-band, or action-substitution circuit 2. The input summing means 4 provides the compressor output to the transmission channel and the input to the circuit 2 of the compressor. The side-path signal components thus boost (additively combine with) the main-path signal components causing compressor action. The transmission channel output is applied to the expander 7, configured in a complementary manner to the compressor 6. The input signal is applied to the fixed-band, sliding-band, or action-substitution circuit 2 and to the main path 3. The output of circuit 2 is then subtracted from the main-path signal components in summing means 4 to provide the expander output. The side-path signal components thus buck (subtractively combine with) the main-path signal components causing expander action.

In FIGS. 3 and 4 the main path of each compressor and expander is linear with respect to dynamic range and the level of the side-path circuit output is less than the maximum level of the main path. The transmission channel throughout the Figures in this document may include any type of storage or transmission medium and may also include means for converting or encoding the analog signal components from the compressor into a different form (digital, for example), the storage or transmission of the encoded signals, and means for reconverting or decoding the encoded signals back into analog signal components.

D. Modualtion Control

In the A-type, B-type, and C-type systems mentioned above, and the SR system described below, the source-drain path of field effect transistors (FETs) are employed as voltage controlled variable resistors (forming the variable element of a variable attenuator in fixed-band circuits and forming the variable element of a variable filter in sliding-band circuits). DC control voltages, derived from the input signals, are applied to the FET gates. The derivation includes rectification, smoothing, and adjustment of the control voltage amplitude as necessary to achieve the desired dynamic action. As the control voltage increases, the degree of limiting increases: by increasing the attenuation in the fixed-band circuits and, in the sliding-band circuits, by shifting the corner frequency of the filter farther and farther from its quiescent position.

One disadvantage of the control circuit arrangement in the A-type, B-type, and other known compander systems is that the DC control signal is formed from the linear additive combination of the pass-band signals and the stop-band signals reaching the control circuit. In the case of fixed-band circuits in a bandsplitting system, the pass-band is the frequency band in which a particular circuit operates; the stop-band is the remainder of the signal spectrum handled by the system. In the case of sliding-band circuits, the pass-band is the frequency band within the pass-band of the variable filter and the stop-band is the frequency band outside its pass-band. In an ideal circuit, compression or expansion should not be affected by the levels of signals outside the pass-band of the fixed-band or the pass-band of the sliding band (whether or not in its quiescent position). A solution to the problem is set forth in U.S. Pat. No. 4,498,055 and U.S. Pat. No. 4,922,535.

In accordance with the teachings in U.S. Pat. No. 4,498,055 and U.S. Pat. No. 4,922,535, the formation of the DC control signal is altered, in a level dependent way, so as to make the DC control signal less responsive to stop-band signal components as the level of the input signal rises. In practical embodiments, this is accomplished by opposing (subtractively combining or "bucking") the control signal with a signal referred to as the modulation control signal. In the case of a fixed-band circuit, the modulation control signal assures that the gain changes by no more than is necessary to assure that a dominant controlling signal is not boosted (in the case of compression) above a reference level. In the case of a sliding-band circuit, the modulation control signal assures that the amount of frequency sliding of the variable filter is no more than necessary to assure that a dominant controlling signal is not boosted (in the case of compression) above a reference level.

E. Overshoots

A basic design conflict in companding type noise-reduction systems is the requirement to balance the ability to handle rapidly changing waveforms (to minimize signal overshoots) against the desirability of minimizing signal modualtion and noise modulation. The ability of a compressor (or expander) to respond to a rapid amplitude change in its input signal is directly related to its attack time or the time which is required for the device to change its gain (or shift its filter corner frequency) in response to the input amplitude change. Long attack times tend to reduce modulation distortion. When the change in input signal amplitude occurs more abruptly than the device is capable of changing its gain or corner frequency (caused by control circuit lag), an overshoot results. For example, if a compressor has a gain of two times (resulting from some steady-state input condition) and suddenly the input signal doubles in amplitude such that compressor is unable to reduce its gain to provide the desired gain according to its compression law, the output signal will exceed its desired amplitude and may exceed the desired maximum output of the device, depending on the amplitude jump and suddenness with which the input signal increases. Such an increase in output is referred to as an overshoot.

Overshoots normally have maximum amplitudes equal in value to the degree of compression. The overshoot will continue until the input signal is suitably changed or, if the input signal remains constant at its new high level, until the control circuit time lag is sufficiently overcome so as to reduce the gain of the compressor to the gain directed by its compression law. Overshoots are undesirable because they can overload the channel or device carrying the output signal from the compressor.

A discussion of overshoot suppression techniques in the professional SR system and in the earlier A-type, B-type, and C-type systems is set forth in said U.S. Pat. No. 4,922,535.

IV. Professional Spectral Recording (SR)

In 1986 the originators of A-type noise reduction introduced and began marketing an improved audio signal processing system, Spectral Recording (SR) for professional users. The professional SR system, like its predecessor and still widely used A-type noise reduction, is now a well-known commercially successful professional system.

In the Spectral Recording system, the dynamic action is provided by an embodiment of the action-substitution technique that combines, in a synergistic manner, the characteristic actions of fixed-band and sliding-band circuits operating in each of its sub-stages. The action-substitution technique and the use of single-pole filters to allow a broad overlapping of action above and below the 800 Hz crossover frequency provides an overall dynamic action that is highly conformable to signals virtually anywhere in the audio frequency band. In other words, the Spectral Recording encoding action is highly frequency selective and adaptive by virtue of its action substitution of fixed-band and sliding-band elements operating in broadly overlapping frequency bands. The overall effect is essentially that of variable width and variably positioned frequency bands: an almost infinitely variable characteristic that adapts itself to both the level and frequency content of the signal.

The dynamic action provided in the Spectral Recording system embodies the above-mentioned Least Treatment Principle. Thus, the compressor action of the encoder tries to keep all signal components fully boosted at all times. When the boosting must be cut back at a particular frequency, the effect on low-level signal components at other frequencies is minimized. The audible effect of this type of compression is that the signal appears to be enhanced and brighter but without any apparent dynamic compression effects. The ear detects dynamic action primarily by the effect of a gain change due to a signal component at one frequency on a signal component at some other frequency, somewhat removed. If the ear cannot detect dynamic effects in the compressed signal, then 1) it is unlikely that noise modulation effects will be evident in the decoded signal, and 2) it is unlikely that signal modulation effects will be evident in the decoded signal if there should be a gain or frequency response error in the recording or transmission channel.

The professional SR system, as mentioned above, is described in "The Spectral Recording Process," by Ray Dolby, *J. Audio Eng. Soc.*, Vol. 35, No. 3, March 1987, pp. 99–118. Aspects of the Spectral Recording system are also set forth is U.S. Pat. Nos. 4,490,691, 4,498,055, 4,736,433, and 4,922,535, all of Ray M. Dolby.

Spectral Recording shares certain basic techniques with the predecessor A-type, B-type, and C-type systems originated by Ray M. Dolby and Dolby Laboratories. For example, all are complementary dual-path systems in which a main signal path is primarily responsible for conveying high-level signals and a side-chain or side-path signal with a characteristic unique to the system is additively combined with the main signal in the encoding mode and subtractively in the decoding mode, whereby an overall complementary action is obtained.

In Spectral Recording, a multi-stage series arrangement is used with staggered regions of dynamic action as taught in U.S. Pat. No. 4,490,691 of Ray M. Dolby. The high-level and mid-level stages have both high-frequency and low-frequency sub-stages with a crossover frequency of 800 Hz. The low-level stage has only a high-frequency sub-stage, with an 800 Hz high-pass characteristic. In the Spectral Recording encoder, each stage has a low-level gain of about 8 dB, such that when the outputs of the stages are combined with the main signal path a total dynamic effect of up to about 16 dB is obtained at low frequencies and 24 dB at high frequencies. The reciprocal characteristic is provided in the Spectral Recording decoder.

The professional SR system employs level dependent low-frequency and high-frequency antisaturation, described above, providing in the encoded signal a gentle roll-off in the low-frequency and high-frequency regions that increases as the signal level rises in order to reduce the possibility of overloading the medium on which a Spectral Recording encoded signal is recorded or transmitted at frequency extremes where the ear is less sensitive to noise.

Also, Spectral Recording employs low-frequency and high-frequency spectral skewing, also described above, an abrupt and deep reduction in the low-frequency and high-frequency extremes of the encoded signal, primarily for the purpose of reducing the susceptibility of the Spectral Recording decoder to any uncertainties in the low-frequency and high-frequency extreme regions of the recording or transmission medium.

Both antisaturation and spectral skewing are complementary in the Spectral Recording system; complementary de-antisaturation and spectral de-skewing are provided in the decoder. Basic antisaturation and spectral skewing techniques are taught in said U.S. Pat. No. 4,490,691.

Professional SR also uses the technique called modulation control, described above, to improve the performance of both the fixed and sliding bands in resisting any modulation of signal components unless necessary.

V. Consumer Spectral Recording (S-type)

A. Basic Requirements

It is desirable to introduce the benefits of Spectral Recording to consumer and semi-professional audio recording and transmission systems, such as its improved dynamic range, lower noise modulation, improved transient response, improved resistance to encode/decode frequency and level errors, and greatly reduced low-frequency and high-frequency saturation. Unfortunately, the complexity and cost of the professional SR system, particularly the complexity of its low frequency circuitry, makes it unsuitable for use in such products. In addition, the professional SR system is designed to operate in a professional recording system having a dynamic range that is substantially greater than that of consumer or semi-professional equipment.

B. Compatibility Requirements

A consumer and semi-professional noise-reduction system embodying the principal techniques and advantages of Spectral Recording should have an acceptable degree of compatibility with the ubiquitous B-type NR system. One important reason for such compatibility is that cassette tape producers strongly prefer to release prerecorded cassettes in "single inventory" (for example, all copies of particular prerecorded cassettes are B-type encoded). Consequently, a new consumer system embodying the basic elements of Spectral Recording should provide acceptable playback on systems having only B-type decoders and also on systems having no noise-reduction decoder at all.

Audio processing system compatibility problems are discussed in U.S. Pat. No. 4,815,068. According to that patent specification, listening tests indicate that audible effects relating to system compatibility problems may be characterized as: (1) apparently steady-state effects, namely, changes in frequency content of the reproduced signal as, for example, low-frequency or high-frequency emphasis (e.g., spectral imbalance), and (2) dynamic effects, usually referred to as "pumping," whereby signals and/or noise in one part of the frequency spectrum vary in level in accordance with the level of a signal in another part of the spectrum. The extent to which the ear tolerates such effects is level dependent: generally, the effect is less acceptable at high levels.

Preferably, dynamic effects should be eliminated or minimized because such instability in the reproduced signal is more readily perceived by the listener than are steady-state effects. Steady-state effects are less likely to be noticed by most listeners because there is no changing sound to attract the ear's attention. Even to critical listeners steady-state effects may seem attributable to differences in the sound mix. Of course, a direct A/B comparison between fully complementary encoding/decoding and a partially complementary "compatible" arrangement would reveal some differences in the reproduced signal. However, in a practical situation, such a comparison is not available and the only audible cues are those in the reproduced signal itself.

In cases where dynamic stability is not achieved and there are low-level dynamic effects in the presence of primary signals, it has been found that the most subjectively uncomfortable audible effects are those resulting from signal deficiencies rather than excesses in the portion of the reproduced signal suffering such low-level dynamic effects. Such deficiencies are often referred to as a "signal suck-out" effect. Under such conditions level variations or pumping that causes low-level signals to drop further in level, as from an audible to an inaudible level, are particularly disturbing to the ear.

Thus, if the encoder always provides at least as much or a surplus of signal at each frequency when the signal is decoded as in the original signal before encoding, the ear tends to be satisfied. This principle may be referred to as the Principle of Signal Sufficiency or Signal Surplus. In other words, if there is any decode error, it should be positive so as to provide an excess of signal; the ear is more tolerant of an excess rather than a deficiency of signal.

It has been found that signal deficiencies in the order of a few decibels, say 2, 3, or 4 dB of low-level signals, such as low-level ambiences, in the presence of primary or dominant signals, are audibly acceptable to most listeners, but that larger deficiencies, in the order of 6 or 12 dB are not acceptable to most listeners. In contrast, it has been found that signal surpluses of 10, 12, 15 dB or even more of such low-level signals in the presence of primary signals are generally acceptable to most listeners.

Thus, in accordance with the Principle of Signal Sufficiency, the playback arrangement may be considered to be compatible with an encoder if at any frequency or time the low-level signals or ambiences in the presence of primary signals in the reproduced signal are no less than a few dB below the original signal and are no more than some 10 to 15 dB above the original signal. This question of compatibility relates to low-level signals in the presence of primary or dominant signals because it is such low-level signals that are primarily manipulated by the B-type system and the system of the present invention. In such systems, high-level primary or dominant signals are substantially unaffected.

As mentioned above, prerecorded cassettes are released in single inventory, despite the fact that not all purchasers have cassette tape players with B-type decoders. However, systems using such non-equipped cassette tape players typically are inexpensive systems used for relatively non-critical listening. Most such systems have a considerable amount of treble cut or high-frequency roll-off. Subjectively, the roll-off brings the tonal character of a B-type encoded cassette tape essentially back to normal. The low-level boosting of high-frequency components in the encoding process adequately compensates for the high-frequency roll-off. Consequently, B-type encoded cassette tapes produce sound acceptable to most listeners when played back on the type of system that does not have B-type decoding.

The compatibility requirements for a simplified Spectral Recording system, particularly if issued by cassette tape producers in single inventory in place of prerecorded B-type encoded cassettes, would be more even more stringent than just discussed. Such a system would have to provide sound reproduction that would be widely accepted by most users of systems employing cassette decks with B-type noise reduction in addition to users having cassette decks with no noise reduction decoding. Many owners of systems having B-type cassette playback are likely to be relatively critical listeners.

SUMMARY OF THE INVENTION

In accordance with the teachings of the present invention, the advantages of action substitution and other advantages of Spectral Recording are achieved in a relatively simple and less expensive arrangement embodying the essential elements of Spectral Recording yet suitable for use in consumer and/or semi-professional applications. The overall circuit complexity is reduced sufficiently so that a preferred embodiment of the invention is suitable for practical implementation in integrated circuit form. Component and manufacturing costs are therefore substantially less than professional SR, which to date is embodied only in discrete component form.

In addition, the encode/decode characteristics of the preferred embodiment provide a substantial degree of compatibility with the established B-type NR system such that encoded sound material is acceptable to most listeners when played using a B-type NR decoder. The characteristics also provide acceptable playback to most listeners having systems with no noise-reduction decoding.

As mentioned above, the low-frequency circuitry of the professional SR system is particularly complex. For example, the sliding-band circuit of the low-frequency action-substitution sub-stages require the use of a gyrator. Nevertheless, some low-frequency noise reduction is desirable for several reasons: 1) to eliminate residual noise and hum, 2) in order to provide a more balanced noise spectrum, and 3) to provide better compatibility with B-type and no noise reduction playback systems. In addition, since it is also desired to provide a low-frequency de-emphasis to compensate for the IEC standard 3180 μs (microsecond) low-frequency emphasis employed by commercial cassette tape duplicators and in consumer cassette recorder/reproducers, some low-frequency noise reduction is needed to overcome the additional noise resulting from the complementary emphasis in the decoder. However, because cassette tape noise is concentrated at higher frequencies and because of comparatively low print-through, due to the lower operating speed of the cassette medium relative to 15 or 30 ips open-reel professional tape recording, less low frequency noise reduction is required than in the professional SR system.

In order to satisfy these requirements, while maintaining greater simplicity, the system of the present invention lowers the corner frequency of the high-frequency band of the professional SR system by an octave from 800 Hz to 400 Hz and in place of employing two action-substitution sub-stages in the low-frequency band instead uses a single fixed-band sub-stage operating in a substantially smaller low-frequency band having a corner frequency of 200 Hz. The apparent gap between the 200 Hz corner frequency of the low-frequency band and the 400 Hz corner frequency of the high-frequency band is not actually a gap—the gentle slopes (6 dB/octave) of the bands taken with the substantially greater dynamic range of the high-frequency band results in a smooth transition between the two bands.

In the preferred embodiments of the encoder according to the present invention, there are two action-staggered series-connected dual-path stages: a high-level stage and a low-level stage. The known advantages arising from multilevel stages are thus retained, including accuracy and reproducibility, low distortion, low overshoot, and action compounding for good spectral discrimination.

The high-level stage employs high-frequency fixed-band and sliding-band elements, having a corner frequency of about 400 Hz, in an action-substitution arrangement providing about 12 dB of boost for low-level signals below a threshold. The high-level stage also has a low-frequency fixed-band variable element with a corner frequency of about 200 Hz providing about 10 dB of boost for low-level signals below a threshold.

The low-level stage employs high-frequency fixed-band and sliding-band elements, having a corner frequency of about 400 Hz, in an action-substitution arrangement providing about 12 dB of boost for low-level high-frequency signals below a threshold. The low-level stage provides no low-frequency dynamic action.

A high-frequency shelving filter is employed with the fixed-band element of the action-substitution sub-stages in order to compensate for the substantially higher noise floor present in audio cassette decks (in comparison to professional analog audio recorders). In one embodiment the filter is located in the input path to the fixed-band element. In an alternative embodiment the filter is located in the output path of the fixed-band circuit prior to the takeoff point for the fixed-band circuit control circuit. In both cases the filter reduces the sensitivity of the fixed-band circuit of the sub-stage to high-frequency signals above its lower break frequency. Thus, it inhibits the shutting off of all high-frequency noise reduction in the presence of a dominant high-frequency signal that causes the sliding band filter corner frequency to slide substantially upward in frequency.

The overall arrangement provides up to about 24 dB of noise reduction at high frequencies and up to about 10 dB of noise reduction at low frequencies. The prior B-type and C-type noise reduction provided no noise reduction at low frequencies. By adding low-frequency noise reduction, the present system not only suppresses low-frequency noise and hum but provides a more balanced noise spectrum and enhances compatibility as discussed further below.

In one embodiment of the invention, a spectral skewing network in the input signal path has a single-pole high-pass shelving response with a corner frequency at about 50 Hz and a depth of about 6 dB and a two-pole low-pass shelving response with a corner frequency at about 10 kHz and a depth of about 17 dB. The high-frequency portion of the network functions in the manner of a traditional spectral skewing network as set forth said U.S. Pat. No.4,490,691. The low-frequency portion of the network provides a low-frequency spectral skewing effect and, as a further benefit, a low-frequency signal de-emphasis to compensate for the IEC standard 3180 μs (microsecond) low-frequency record emphasis. In an alternative embodiment, only a low-frequency spectral skewing network is located in the input signal path. The network has a corner frequency (pole) of about 80 Hz and a depth of about 8 dB (a zero at about 32 Hz). High-frequency spectral skewing is provided by low-pass networks having a corner frequency of about 12.8 kHz located in the input paths to the high-frequency action-substitution sub-stages; single pole in the high-level stage and two-pole in the low-level stage. Although U.S. Pat. No. 4,490,691 contemplates the location of spectral skewing networks in the noise reduction side path, the patent states that it is not the preferred location. Nevertheless, the configuration of the alternative embodiment provides certain advantages explained below.

In a third, preferred, embodiment, the low-frequency spectral skewing filter is also moved to the side path, in this case to the input of the low-frequency fixed-band sub-stage. Also, the two-pole characteristic of the high-frequency spectral skewing filter in the low-level action substitution sub-stage is changed so that it becomes a single-pole characteristic at frequencies above 48 kHz to improve the margin of stability in the decoder.

In one embodiment, the antisaturation network in the main path of the low-level stage acts only at high frequencies, having a low-pass shelving response with a pole at about 3400 Hz and a zero at about 2300 Hz. In an alternative embodiment, high-frequency antisaturation networks are located in the main path of both the high-level and low-level stages. In the high-level stage the antisaturation network has a corner frequency (pole) of about 6 kHz with a depth of about 6 dB (a zero at about 12 kHz). In the low-level stage the antisaturation network has a corner frequency of about 5 kHz with a depth of about 10 dB (a zero at about 15 kHz).

In a third, preferred, embodiment, the high-frequency anti-saturation characteristic in the high-level stage is changed from a shelf to a notch, again to improve the margin of stability in the decoder. A low-frequency anti-saturation function is added to the high-level stage to restore the anti-saturation effect lost by moving the low-frequency spectral skewing circuit from the input to the side path. Finally, the lower corner frequency (pole) of the anti-saturation characteristic in the low-level stage is increased by about 1 kHz and the upper corner frequency (zero) is moved up so as to maintain the same 10 dB shelf depth.

The overall arrangement is robust in the sense that it provides an improvement over B-type NR and C-type NR with regard to mistracking between record and playback machines caused by substantial record/playback calibration errors resulting from level and/or frequency response errors and/or medium saturation effects. This improvement is believed to be a result of using not only spectral skewing and antisaturation but also action substitution and a high-frequency shelving filter in the fixed-band high-frequency circuits.

FIG. 6 is a representation of the quiescent characteristics of the low-frequency and high-frequency sub-stages and the system according to the present invention operated in its compressor mode, ignoring the effect of its spectral skewing and antisaturation networks. Thus, the curves show the additive effect of the single low-frequency sub-stage and of the two high-frequency sub-stages, providing an overall compression of 24 dB at high frequencies and dropping to 10 dB at low frequencies. The curves also illustrate the smooth overlap of the 6 dB/octave skirts of the response of the 200 Hz corner frequency low-frequency band and the 400 Hz corner frequency high-frequency band.

The arrangement of the present invention is a type of bandsplitting arrangement in which the high-frequency band comprises superposed fixed-band/sliding-band characteristics and the low-frequency band comprises a fixed-band characteristic. In the high-frequency band the sliding band acts upwardly in frequency. By choosing gentle filter slopes (6 dB/octave) and quiescent corner frequencies near or just below the middle of the frequency band (in the range of about 200 to 400 Hz), excellent tracking of a dominant signal by both the high and low-frequency bands throughout a substantial portion of the band under processing is possible.

The nominal quiescent corner frequency is somewhat lower than the 800 Hz corner frequency used in professional SR so that the high-frequency action-substitution sub-stages operate over most of the frequency band, leaving only a small portion of the audio band for the fixed-band low-frequency sub-stage. In addition, corner frequencies of 400 Hz, rather than 800 Hz as used in the professional Spectral Recording system, better suit the noise spectrum of typical consumer cassette tape systems.

The encoding characteristics of the encoder of the system of the present invention provide an excellent basis for acceptable compatibility with B-type decoders and systems with no noise reduction decoding. In common with professional SR, the system embodies the Least Treatment Principle and, with respect to B-type NR and no NR decoding, the Principle of Signal Sufficiency. Through the provision of noise reduction throughout the audio band and particularly action substitution in its high-frequency band, the system provides highly frequency selective compression during encoding: the compressor tends to keep all signal components fully boosted at all times; when the boosting must be cut back at a particular frequency, reduction in boost essentially is not extended to low-level signal components at other frequencies.

The audible effect of this type of compression is that the un-decoded signal appears to be enhanced and brighter but without any apparent dynamic compression effects (the ear detects dynamic action primarily by the effect of a gain change due to a signal component at one frequency on a signal component at some other frequency, somewhat removed). As a consequence, encoded signals reproduced with no special decoding whatsoever are free of pumping effects for nearly all signal conditions because of the compressor's frequency adaptiveness (dynamic action occurs substantially only at frequencies requiring such action and nowhere else) and thus are discernible to a critical listener as compressed signals only because there are changes in the low-frequency and high-frequency emphasis. The dynamic stability of the encoded signal also minimizes the occurrence of pumping effects with B-type playback decoders.

The use of (1) action substitution in the high-frequency sub-stages, (2) two high-frequency sub-stages, and (3) a low-frequency sub-stage assures that there will be a surplus of signal rather than signal suck-out when the encoded signal is played back with B-type NR decoding or no NR decoding, thus satisfying the Principle of Signal Sufficiency.

B-type playback tends to restore to some extent the high-frequency imbalance of the bright encoded signal. For example, in its preferred embodiment the encoder of the present invention provides up to about 24 dB of high-frequency compression and 10 dB of low-frequency compression. In general terms, B-type decoding provides up to 10 dB of high-frequency expansion, thus providing an output signal with about 14 dB of high-frequency boost and 10 dB of low-frequency boost. Thus, a potential spectral high-frequency to low-frequency spectral imbalance may be reduced to only 4 dB. The result is still a somewhat compressed signal, but more spectrally balanced. As mentioned above, steady-state effects are less likely to be noticed than are dynamic effects by most listeners because there is no changing sound to attract the ear's attention.

It has also been found that balanced steady-state low-frequency and high-frequency response effects tend to be overlooked by the ear. Thus, to the extent that the spectral skewing roll-off of the low-frequency and high-frequency regions of the encoded signal is not restored by B-type or non-decoded playback, the balanced or symmetrical effect on the frequency spectrum makes the resulting playback acceptable to most listeners.

Although playback with no NR decoding potentially results in a high-frequency to low-frequency spectral imbalance of 14 dB, that extreme condition occurs only for low-level signal conditions. In practice, users of systems with no NR decoding are likely to be listening to cassette recordings with high signal levels. Moreover, as noted above with respect to B-type encoding, such systems often benefit from additional high-frequency boosting of medium and low-level signals. On many popular vocal recordings, voice quality is subjectively enhanced. Finally, the anti-saturation circuits allow a higher record level to be used with many kinds of program material, enabling even listeners using systems without NR decoding to enjoy a higher signal-to-noise ratio.

BRIEF DESCRIPTION OF THE DRAWINGS

FIG. 1 is an idealized compressor characteristic response curve illustrating the prior art sliding-band multiplication effect.

FIG. 2 is an idealized compressor characteristic response curve illustrating the prior art fixed-band limiting effect.

FIG. 3 is a block diagram showing the prior art Type I dual-path arrangement.

FIG. 4 is a block diagram showing the prior art Type II dual-path arrangement.

FIG. 5A is an idealized compressor characteristic response curve showing the quiescent response of fixed-band and sliding-band elements superposed in accordance with the prior art action-substitution technique.

FIG. 5B is an idealized compressor characteristic response curve showing the response slightly above their thresholds or fixed-band and sliding-band elements superposed in accordance with the prior art action-substitution technique, the sliding band acting upward in frequency.

FIG. 5C is an idealized compressor characteristic response curve showing the response slightly above their thresholds of fixed-band and sliding-band elements superposed in accordance with the prior art action-substitution technique, the sliding band acting downward in frequency.

FIG. 6 is a characteristic compression response curve showing the quiescent characteristics of the low-frequency and high-frequency sub-stages and the overall system according to the present invention operated in its compressor mode, ignoring the effect of its spectral skewing and antisaturation networks.

FIG. 7A is a block diagram of a compander system in accordance with an embodiment of the present invention having series staggered stages employing high-frequency and low-frequency sub-stages of the type described in connection with FIGS. 10, 11, and 12.

FIG. 7B is a block diagram of a compander system having a compressor as shown in FIG. 14, in FIG. 18, or in the compressor part of FIG. 7A, and an expander formed by placing the compressor shown in FIG. 14, in FIG. 18, or in the compressor part of FIG. 7A in the negative feedback loop of a suitable amplifier.

FIG. 8 is a block diagram of a two element action-substitution sub-stage employing fixed-band and sliding-band elements.

FIG. 9A is an idealized compressor characteristic response curve showing the response of an action-substitution sub-stage of the type shown in the arrangement of FIG. 8 for a signal above the threshold of the sliding-band element but below the threshold of the fixed-band element.

FIG. 9B is an idealized compressor characteristic response curve showing the response slightly above the thresholds of both the elements of a sub-stage of the type shown in the arrangement of FIG. 8.

FIG. 9C is an idealized compressor characteristic response curve showing the response at an even greater level above the thresholds of the elements of a sub-stage of the type shown in the arrangement of FIG. 8.

FIG. 10 is a partially schematic block diagram of an embodiment of a high-frequency action-substitution sub-stage employing fixed-band and sliding-band elements for use in a compressor, expander, or compander system in accordance with the invention.

FIG. 11 is a signal flow graph of the high-frequency action-substitution sub-stages according to the embodiment of FIG. 10.

FIG. 12 is a partially schematic block diagram of an embodiment of a low-frequency fixed-band sub-stage for use in a compressor, expander, or compander system in accordance with the invention.

FIG. 13 is a partially schematic block diagram of an embodiment of the circuitry for deriving the modulation control signals used in the embodiments of the circuits of FIGS. 10 and 12.

FIG. 14 is a block diagram of a compressor in accordance with one alternative embodiment of the present invention having series staggered stages employing high-frequency and low-frequency sub-stages of the type described in connection with FIGS. 15 and 16.

FIG. 15 is a partially schematic block diagram of one alternative embodiment of a high-frequency action-substitution sub-stage employing fixed-band and sliding-band elements for use in a compressor, expander, or compander system in accordance with the invention.

FIG. 16 is a partially schematic block diagram of one alternative embodiment of a low-frequency fixed-band sub-stage for use in a compressor, expander, or compander system in accordance with the invention.

FIG. 17 is a partially schematic block diagram of an alternative embodiment of the circuitry for deriving the modulation control signals used in the embodiments of the circuits of FIGS. 15, 16, 19, and 20.

FIG. 18 is a block diagram of a compressor in accordance with another, preferred, alternative embodiment of the present invention having series staggered stages employing high-frequency and low-frequency sub-stages of the type described in connection with FIGS. 19 and 20.

FIG. 19 is a partially schematic block diagram of another, preferred, alternative embodiment of a high-frequency action-substitution sub-stage employing fixed-band and sliding-band elements for use in a compressor, expander, or compander system in accordance with the invention.

FIG. 20 is a partially schematic block diagram of another, preferred, alternative embodiment of a low-frequency fixed-band sub-stage for use in a compressor, expander, or compander system in accordance with the invention.

FIG. 21 shows the output level plotted against frequency at different input levels for a compressor according to the third, preferred, embodiment of the invention.

FIG. 22A shows compression slope plotted against input level at various frequencies within the frequency range of the high-frequency action-substitution sub-stage for a compressor according to the third, preferred, embodiment of the invention.

FIG. 22B shows compression ratio plotted against output level at various frequencies within the frequency range of the high-frequency action-substitution substage for a compressor according to the third, preferred, embodiment of the invention.

FIG. 23A shows compression slope plotted against input level at a frequency within the frequency range of the low-frequency sub-stage for a compressor according to the third, preferred, embodiment of the invention.

FIG. 23B shows compression ratio plotted against output level at a frequency within the frequency range of the low-frequency sub-stage for a compressor according to third, preferred, embodiment of the invention.

DETAILED DESCRIPTION OF THE INVENTION

U.S. Pat. Nos. Re 28,426; 3,846,719; 3,903,485; 4,490,691; 4,498,055; 4,736,433; 4,815,068; and 4,922,535 referred to in this application, are each incorporated herein by reference, each in its entirety.

In FIG. 7A, an embodiment of a compander system having a compressor and an expander, all in accordance with the present invention is shown, in which there are two series Type I dual-path stages in the compressor and two complementary stages in the expander. The threshold levels of the series bilinear stages are staggered, employing the dynamic action level staggering aspects of U.S. Pat. No. 4,490,691. Alternatively, a Type II configuration could be employed. The embodiment of FIG. 7A also employs the spectral skewing and antisaturation aspects of U.S. Pat. No. 4,490,691. Although the invention may be implemented using dual-path or single-path arrangements, dual-path implementations have certain advantages, as discussed above, and are preferred. One alternative embodiment of a compressor in accordance with the present invention is shown in FIG. 14. Another, preferred, alternative embodiment of a compressor in accordance with the present invention is shown in FIG. 18.

The decoder is complementary to the encoder and may be implemented by the arrangement shown for the decoder in FIG. 7A. Alternatively, the well-known technique of placing the encoder in the feedback loop of suitable amplifier, as shown in FIG. 7B, may be used. The compressor shown in FIG. 7B may be the one shown in the compressor part of FIG. 7A, or the compressor shown in FIG. 14 or FIG. 18, or some other configuration of compressor.

The compressor portion of the system of FIG. 7A has two stages: a high-level stage 10, which has the higher threshold level, and a low-level stage 12, which has a lower threshold level. As discussed in U.S. Pat. No. 4,490,691, this is the preferred order of arrangement of staggered stages, although the reverse order is possible. The threshold is the signal amplitude level above which there is an onset of dynamic action in the compressor or expander. The expander portion of the system of FIG. 7A also has two stages arranged complementary to the compressor: the low-level stage 14' and the high-level stage 16.'

Each high-level stage has both a high-frequency action-substitution sub-stage 24 (24') and a low-frequency fixed-band sub-stage 28 (28'). The low-level stage has only a high-frequency action-substitution sub-stage 26 (26') and no low-frequency sub-stage. Each high-frequency sub-stage 24 (24') and 26 (26') is of the type described generally in connection with FIGS. 8 and 9A–9C and more specifically in connection with FIG. 10. Each low-frequency sub-stage 28 (28') is of the type described in connection with FIG. 12. In practical circuits, there are some differences between the high-frequency sub-stages 24 (24') and 26 (26') as a result of their respective locations in the high-level and low-level stages. These differences are noted in the discussion of the embodiment of FIG. 10.

If each high-frequency action-substitution compressor sub-stage (24, 26) and each high-frequency action-substitution expander sub-stage (24,' 26') has, for example, 12 dB of compression or expansion, respectively, and if the low-frequency fixed-band compressor sub-stage 28 and the low-frequency fixed-band expander sub-stage 28' has, for example 10 dB of compression or expansion, then the overall compander system will provide 24 dB of noise reduction in the high-frequency band (above the 400 Hz region, if the high-frequency sub-stages 24 (24') and 26 (26') have 400 Hz cutoff frequencies) and 10 dB of noise reduction in the low-frequency band (below 200 Hz, if the low-frequency sub-stage 28 (28') has a 200 Hz cutoff frequency). Such an arrangement is useful, for example, in a high-quality audio noise-reduction system of the type used in consumer and semi-professional applications.

The input to the compressor portion of the system is applied to low-frequency and high-frequency spectral skewing network shown as block 18. In a practical embodiment the network is a 50 Hz low-pass single-pole shelving section with a 6 dB depth and a 10 kHz high-pass two-pole shelving section with a 17 dB depth. The spectral skewing network has a voltage transfer function in the Laplace domain substantially of the form:

$$\frac{V_o(s)}{V_{in}(s)} = \frac{1 + s/2\pi f_0}{1 + s/2\pi f_1} \cdot \frac{(1 + s/2\pi f_2)(1 + s/2\pi f_3)}{1 + (s/Q \cdot 2\pi f_4) + (s/(2\pi f_4))^2}$$

where $f_0 = 25$ Hz, $f_1 = 50$ Hz, $f_2 = 12{,}400$ Hz, $f_3 = 40{,}800$ Hz, $f_4 = 7{,}980$ Hz, and $Q = 0.63$. The network may be implemented using well-known operational amplifier active filter techniques. A complementary de-skewing network is located in block 20 at the output of the expander.

The main path of the low-level stage 12 in the compressor portion includes a high-frequency antisaturation network 22. The antisaturation network has a voltage transfer function in the Laplace domain substantially of the form:

$$\frac{V_o(s)}{V_{in}(s)} = \frac{1 + s/2\pi f_6}{1 + s/2\pi f_7}$$

where $f_6 = 3{,}400$ Hz, and $f_7 = 2{,}400$. A complementary antisaturation network 23 is located in the main path of the low-level stage 14 in the expander portion.

The Type I stages of FIG. 7A also include summing means 30 and 30' that combine the outputs of the high-frequency and low-frequency sub-stages in the high-level stages 10 and 16 Hz, respectively. The stages include respective summing means 32 and 32' and 34 and 34' which couple the side-path outputs to the main path, thereby combining the side-path output signals with the main-path signal. In practical circuits the summing means 30 and 30' may be dispensed with and the high-frequency and low-frequency sub-stages can be summed in summing means 32 and 32.'

In operation, the fixed-band and sliding-band circuits of the action substitution sub-stages operate in a manner that draws on the best features of both types of circuits. The operation can be described as "action substitution."

In any particular action substitution sub-stage, fixed-band dynamic action is used whenever it provides best performance; sliding-band operation is substituted whenever it has an advantage. In this way the best features of both methods are obtained without the attendant disadvantages of each.

The substitution is effective on a continuous and frequency-by-frequency basis. For example, the output from a given high-frequency sub-stage 24 or 26 will typically be from the fixed band for frequencies up to the dominant signal component and from the sliding band above that frequency in the manner of FIGS. 9A through 9C. The output from the low-frequency sub-stage 28 will be a fixed-band response (e.g., a uniform response throughout the band tailored by its 200 Hz low-pass band-defining filter).

The high-frequency action-substitution sub-stages 24 and 26 are each a two-element action-substitution stack made up of fixed-band and sliding-band dynamic-action elements. The "stack" configuration of action-substitution elements is explained in U.S. Pat. No. 4,736,433 and in the above-cited article "The Spectral Recording Process" (FIG. 3, page 102). Alternatively, the functionally equivalent "subtractive" topology may be used (U.S. Pat. No. 4,736,433 and the cited article, FIG. 2, page 102).

For purposes of explanation, assume that a fixed single-pole high-pass filter with a corner frequency of 400 Hz, for example, is placed in series to the inputs of two such elements. FIG. 8 shows a stack arrangement, with a filter 40, a sliding-band element 42 and fixed-band element 44. The fixed and sliding-band circuits are fed in parallel and the output signal is taken from the sliding-band circuit 42. As will be shown in connection with the embodiment of FIG. 10, the sliding-band variable filter is referenced to the output of the fixed band; that is, the fixed-band output is fed directly to the bottom end of the sliding-band variable resistance element. This connection results in the action-substitution operation mentioned previously. The overall output will always be the larger of the fixed- and sliding-band contributions at all frequencies. If there is a signal situation in which the fixed-band output is negligible, then the sliding band takes over. Conversely, if there is little or no sliding-band contribution, the output from the fixed band will still feed through to the output through the sliding-band variable resistance element. In this way the action of one circuit is substituted for that of the other circuit as signal conditions require. The arrangement employed in the embodiments of FIGS. 14 through 17 and FIGS. 18 through 20 is a variation of the stack arrangement of FIG. 8 with differential derivation of the sliding band element control signal in the manner of FIG. 11 of U.S. Pat. No. 4,736,433.

For the purposes of example, assume that the effective passband threshold of the fixed-band element is −62 dB and that of the sliding-band element is −66 dB at 12 kHz and that each element can provide a maximum of 12 dB of boost. If, for example, a 12 kHz signal is applied at a level of −66 dB, the corner frequency of the sliding-band characteristic will slide to about 600 Hz but nothing happens to the overall characteristic envelope because the fixed band is still inactive and supports the envelope. The new sliding-band characteristic is hidden. FIG. 9A shows this situation: the overall response is the same as the quiescent fixed band response; the sliding band response has shifted upward in frequency from its quiescent response. The overall response envelope remains the same as the fixed-band quiescent response until the signal reaches the −62 dB threshold of the fixed-band element. As the signal rises by a few dB above the fixed-band threshold, the fixed band begins to attenuate revealing the top of the sliding-band characteristic, which continues to slide upward as the signal level rises. The overall response and the sliding band response for this situation is shown in FIG. 9B. As the signal level increases several more dB above the fixed-band threshold, the fixed band continues to attenuate and the sliding band continues to move upward as shown in FIG. 9C. The curves shown in FIGS. 9A–9C are examples generated by a computer model.

In FIG. 10, one embodiment of the high-frequency sub-stages 24 (24') and 26 (26') (FIG. 7A) is shown, indicating both the steady-state and transient control aspects of the circuit. In addition to the differences noted below, the high-level and low-level stages differ in that the AC and DC circuit gains are increased for the low-level stage. As with other block diagrams, this figure shows only the basic parameter determining elements; the practical circuits, of course, contain other details such as buffering, amplification, and attenuation.

Each sub-stage comprises a fixed-band circuit on the bottom and a sliding-band circuit on the top, each with its own control circuits. The fixed- and sliding-band circuits are fed in parallel and the output signal is taken from the sliding-band circuit. The sliding-band variable filter is referenced to the output of the fixed band; that is, the fixed-band output is fed directly to the bottom end of the sliding-band variable resistance element 154. This connection results in the action-substitution operation explained above.

The incoming signal is fed through a single-pole high-pass filter 102. In practice, the filters throughout the various Figures are configured as passive RC filters in the inputs of operational amplifiers that act as buffers. In both the low-level stage 12 and in the high-level stage 10, the filter 102 has a cutoff frequency of about 400 Hz.

The filtered input signal is applied to the fixed-band circuit 104 and to the sliding-band circuit 106. The output signal is taken from the sliding-band circuit and is fed through buffer 158. Thus, the overall quiescent (sub-threshold) frequency response of the circuit is that of a single-pole 400 Hz high-pass network.

A low-pass filter 107 with a shelving response, having a corner frequency of about 3.2 kHz and a shelf depth of 12 dB, is located in the input signal path to the fixed-band element 104. Such a filter response may be expressed as a voltage transfer function in the Laplace domain of the form:

$$\frac{V_o(s)}{V_{in}(s)} = \frac{1 + s/2\pi f_0}{1 + s/2\pi f_1}$$

where $f_0 = 12{,}800$ Hz, and $f_1 = 3{,}200$ Hz.

The filter parameters are selected by trading off two performance parameters. The lower the corner frequency, the more the fixed band is able to provide boost in the presence of high frequency signals but the less noise-reduction effect it will provide when fully boosted. The deeper the shelf, the more the fixed band will be able to provide boost in the presence of a signal frequency above the shelf frequency but the more loss of noise-reduction effect just below the signal frequency will occur. The noise spectrum of the cassette recorder also affected the design of this shelf.

The fixed-band element includes an input resistor 108, a shunt variable-resistance element 110, and a control circuit 112 that generates a DC control signal which is applied to the control input of the variable-resistance element. A variable transconductance amplifier may be used as the variable-resistance element 110 and elsewhere throughout the embodiments of the various Figures.

The variable-resistance element preferably has a linear resistance versus control signal input characteristic. In one practical embodiment, the variable-resistance element 110 responds to a current input and the applied DC control signal is a current. The resistance of the variable-resistance element drops as the DC control signal level increases, causing the amplitude level of the fixed-band filter to drop. The relationship may be expressed as $$R = \frac{k}{I_c}$$

Low-pass filter 107 desensitizes the fixed-band circuit to signals above its cutoff frequency. Thus, as the frequency of a dominant tone rises above the filter cutoff frequency the threshold of the fixed-band circuit rises and its sensitivity decreases. Consequently, the fixed band provides more compression (or more noise reduction) in the presence of signals above the filter 107 cutoff frequency. This provides a reduction of noise modulation.

It has been the practice in implementing fixed-band devices to employ the source-drain path of an FET as a variable loss device (variable resistor) by controlling the voltage applied to its gate. Similarly, sliding-band systems have employed the source-drain path of an FET as the variable element (variable resistor) of a variable filter by controlling the voltage applied to its gate. FETs have been used in this manner in commercial embodiments of A-type, B-type, C-type, and SR systems. See also the descriptions in U.S. Pat. No. Re 28,426, U.S. Pat. No. 4,490,691, and U.S. Pat. No. 4,922,535.

Although the non-linear response of the FET formed an inherent part of the desired dynamic circuit action, the response characteristics of individual FETs are subject to some variation and the non-linear response of the FET is not necessarily the optimum response to achieve the desired dynamic characteristic of the circuit. In addition, J-FETs are not easily implemented in integrated circuits. Although the prior art technique of using an FET as the variable element may be employed, the combination of a non-linear element and a linear variable-resistance element permits the circuit designer to optimize the dynamic circuit characteristic and avoid the problem of variations in FET characteristics while permitting easy integration of the circuits. The characteristic of the non-linear element determines the circuit's compression ratio.

An exponential function is used for the fixed-band circuit of the action-substitution sub-stage. The onset of compression is broad but the compression characteristic approaches the characteristics of a limiter as the input level rises. Thus, the finishing point (the region in the bi-linear characteristic of the side path and main path where the dynamic action ceases and the characteristic becomes linear at high signal levels) is not too far removed (in input level) from the compressor threshold. Alternatively, a series of fixed power law functions could be used in order to avoid temperature dependent effects (two terms, $V^2$ and $V^8$, for example). Such functions also cause the compression ratio to continue to rise as the input level increases.

A fixed power law function is used for the sliding-band circuit of the action-substitution sub-stage, consequently the compression ratio does not increase with input signal level. An increasing compression ratio is not required because phase shift in the side path, due to the variable filter characteristics, increases with input signal level, further reducing the side-path contribution to the main path than would be provided by attenuation alone. In addition, for a sliding-band compressor, a fixed power law function provides a compressor whose compression characteristics do not change with frequency, whereas an exponential function would do so. Moreover, a fixed power law allows control over the shape of the compression curve.

Thus, the respective exponential and fixed power law functions give the circuit designer control over the shape of the compression curves. Mistracking is minimized when the beginning and end points of the compression curves are smooth and broadly defined. A countervailing requirement is that the dynamic action of the overall circuit must be restricted so as to occur above the noise floor and below the maximum level of its operating environment. For staggered bi-linear stages, this selection of non-linear elements provides the necessary freedom to design an encoder with good overall characteristics.

FIG. 11 shows a signal flow graph of the high-frequency sub-stages, where:

$f_0$ is the frequency of the high-frequency band defining filter = 400 Hz, $f_1$ is the sliding-band sliding filter quiescent frequency = 200 Hz, $f_2$ is the fixed-band shelf filter zero frequency = 12,800 Hz, $f_3$ is the fixed-band shelf filter pole frequency = 3,200 Hz, $\omega_n$ is $2\pi f_n$, $A_{SC}$ is the signal gain of the side-path, $V_{OS}$ is the fixed-band variable element and control circuit offset voltage, $V_T$ is (q/kT) = 25 mV at 300° K., $G_1$ is the fixed-band control circuit gain, $G_2$ is the sliding band control circuit gain, N is the fixed power of the sliding-band variable element and control circuit, $G_{SB}$ is the sliding band control circuit output, and $G_{FB}$ is the fixed band control circuit output.

The values of $V_{OS}$, $G_1$, $G_2$, and N are different in the high-level and low-level stages.

Inspection of FIGS. 10 and 11 shows that each fixed-band circuit has a voltage transfer function in the Laplace domain substantially of the form:

$$\frac{V_o(s)}{V_{in}(s)} = \frac{1 + s/2\pi f_2}{1 + s/2\pi f_3} \cdot \frac{1}{1 + \exp\left(\frac{G_1 V_o(s) - V_{OS}}{V_T}\right)}$$

and that each sliding-band circuit has a voltage transfer function in the Laplace domain substantially of the form:

$$\frac{V_o(s)}{V_{in}(s)} = \frac{1 + s/2\pi f_1}{1 + s/2\pi f_1 + (G_2 V_o(s))^N}$$

where the parameters are as defined above.

Returning to the description of FIG. 10, the fixed-band output from the fixed-band variable resistance element 110 is fed via weighting filter 116 to two control circuits, the main (pass-band and stop-band) control signal circuit 118 and the pass-band control circuit 120. This arrangement is similar to FIG. 21 of U.S. Pat. No. 4,498,055 and FIG. 8 of U.S. Pat. No. 4,922,535. In the main control circuit the signal is rectified in block 128 and opposed in combining means 129 by the modulation control signal MC3. The derivation of the modulation control signals is explained below in connection with FIG. 13. The resulting DC signal is smoothed by a smoothing circuit 130 with about an 8 millisecond (ms) time constant (the overall steady-state control signal characteristic in this and all other circuits is average responding—an important feature in a practical companding system). The control signal is then fed to one input of a maximum selector circuit 122, which passes to its output the larger of two signals applied to the input.

The fixed-band output is also fed to the pass-band control circuit 120, which comprises the 800 Hz single-pole high-pass filter 132, a full-wave rectifier 134, and a smoothing circuit (about 8 ms) 136. The pass-band control signal is applied to the other input of the maximum selector circuit. The output of the maximum selector circuit is further smoothed by about a 160 ms time constant in block 124 and is used to control the fixed-band variable resistor 110 via variable resistor driver circuit 126, a non-linear function circuit. The second integrator 124 cooperates with the first integrator (of circuit 118 or circuit 120) not only to provide a ripple-free DC control signal but also to adjust the attack and release time constants of the control circuit 112. A diode (not shown) across the resistive element of integrator 124 shortens the time constant under certain conditions. If the voltages at the input and output of block 124 become significantly different, the discharge time of the second integrator is reduced to be that of the first integrator. Such a diode is also connected across block 168 for the same purpose.

The non-linear function element 126 generates a current output having an exponential function in response to the applied input voltage from the second integrator 124 according to the function:

$$I_{out} = k \exp\left(\frac{V_{in} - V_{os}}{V_T}\right)$$

An exponential current function is easily obtained by driving the base of a transistor with a voltage and obtaining the current from the collector. Using well-known techniques, in a practical circuit a voltage offset is applied at the base of the transistor.

The dual control circuit arrangement described above is employed to obtain optimal performance under both simple signal (single dominant signal) and complex signal (more than one dominant signal) situations. The modulation control signal MC3 is optimized in frequency weighting and amount for simple signal conditions, in which the modulation control action is most useful. Under complex signal conditions, however, the modulation control signal developed becomes improper, and the resulting modulation control action is then greater than necessary; that is, the DC control signal output from the main control circuit is less than required. Under this condition the control signal from the pass-band circuit is phased in, via the maximum selector circuit, to control the overall action of the fixed-band compressor circuit.

The output of the fixed-band element is fed through buffer 114 with an overall gain of unity to provide the reference for the sliding-band filter: this is the only signal output of the fixed-band circuit.

The sliding-band element 106 includes parallel input resistor 150 and capacitor 152 which are shunted by a variable-resistance element 154, and a control circuit 156 that generates a DC control signal which is applied to the control input of the variable-resistance element. The presence of resistor 150 results in a variable high-pass filter characteristic having a shelving response (a "variable high-pass shelf filter"). The time-constant of capacitor 152 and resistor 150 defines the lower, fixed, corner frequency of the variable high-pass shelf filter. In practical embodiments of the circuit, this corner frequency is at about 200 Hz. The time constant of capacitor 152 and the resistance of variable resistance element 154 defines the upper, variable, corner frequency of the variable high-pass shelf filter. At high values of resistance of variable resistance element 154, the two corner frequencies overlap and the variable high-pass shelf filter assumes an all-pass characteristic.

The variable-resistance element 154 preferably has a linear control signal input versus resistance characteristic. In one practical embodiment, the variable-resistance element 154 responds to a current input and the applied DC control signal is a current. The resistance of the variable-resistance element drops as the DC control signal level increases, causing the corner frequency of the sliding-band filter to rise. The relationship resistance may be expressed as $$R = \frac{k}{I_c}$$

The sliding-band control signal is derived by control circuit 156 from the circuit output. The signal is fed through the 10 kHz (8 kHz in the low-level stage) single-pole high-pass weighting network 160 and is rectified. The rectified signal is opposed in combining means 163 by modulation control signal MC1; since MC1 also has a single-pole high-pass characteristic, the ratio between the rectified control signal and MC1 monitors the signal attenuation (this ratio creates an end-stop effect on the sliding-band action). The result is smoothed first in block 166 by a time constant of about 8 ms (4 ms in the low-level stage) and finally in block 168 by a time constant of about 80 ms. The smoothed control signal is then used to control the sliding-band variable resistance element 154 via variable resistor driver circuit 170, a non-linear function circuit. As in the fixed-band circuit of the sub-stage, the second integrator cooperates with the first integrator not only to provide a ripple-free DC control signal but also to adjust the attack and release time constants of the control loop. A single control circuit suffices in the sliding-band circuit because the high-pass control weighting network 160 tends to offset the effect of complex signals on the modulation control voltage developed (MC1).

The non-linear function element 170 generates a current output having a fixed power law function in response to the applied input voltage from the second integrator according to the function:

$$I_{out} = k(V_{in})^N$$

where N is a positive number greater than 1. Such a function may be obtained in a conventional way by cascading log/antilog circuits with a defined amount of gain between them.

As mentioned above, although the prior art technique of using an FET as the variable element may be employed, the combination of a non-linear element and a linear variable-resistance element is preferred.

The overall output from the high-frequency action-substitution sub-stage is taken from buffer 158 of the sliding-band element 106.

The overshoot suppression arrangements for the high-frequency sub-stages are also shown in FIG. 10. In the high-frequency sub-stages a general feature is that unsmoothed rectified signals from the control circuit rectifiers 128 and 162 are opposed by appropriate modulation control signals and are fed via diode means 135 and 137 to the final smoothing circuits 124 and 168, respectively, particularly the capacitors thereof.

In common with the professional SR sysetsm and the A-type, and C-type systems, the overshoot suppression thresholds in the present arrangements are significantly higher than the steady-state thresholds. Preferably, the overshoot suppression thresholds are set at about 10 dB above the relevant steady-state thresholds; the overshoot suppression effects are then phased in gradually. The net result is that for most musical signals the overshoot suppressors rarely operate; the compressors are controlled by well-smoothed signals. When the suppressors do operate, the effect is so controlled that modulation distortion is minimal. Under relatively steady-state, but nonetheless changing, signal conditions subsequent to a transient that has triggered operation of the overshoot suppressors, the overshoot-suppression effects are gradually phased out or reduced with increasing signal levels; this action further ensures low overall modulation distortion from the system.

The circuit configuration gives the circuit designer the ability to adjust the relative thresholds and the gradual phase in of the overshoot effects. The thresholds are set by adjusting the relative gain of the amplifiers in the steady-state and overshoot suppression circuits. As explained in further detail below, the gradual phasing in of overshoot suppression effects is accomplished by operating the diodes which couple the overshoot suppression circuits to the capacitor from which the control signal is derived as variable resistors. Other, more complex circuits may be employed to achieve this function. The gradual phasing out or reduction of overshoot suppression effects is achieved by limiting circuits that reduce the gain of the overshoot suppression circuits at very high levels as well as by the modulation control signals that oppose the overshoot suppression signals at high levels.

Referring again to FIG. 10, in the high-frequency fixed-band circuit the overshoot suppression signal is derived from full-wave rectifier 128 of the main control circuit 118. As with the steady-state control signal, the rectified signal is opposed by MC3 in combining means 131, so that the overshoot suppression threshold is appropriate for conditions in the steady-state regime. The appropriate AC and DC conditions are set in amplifier stage 133. The gain of the overshoot suppression side circuit is less than the gain of the steady-state control circuit. The resultant overshoot suppression signal is coupled by a diode means 135 to the final smoothing circuit 124, particularly the capacitor thereof.

In the sliding-band circuit two overshoot suppression signals are used, primary and secondary. The primary overshoot suppression signal is derived from the full-wave control circuit rectifier 162, opposed in combining means 163 by MC2, a smoothed version of MC1 (MC1 controls the steady-state characteristics), the appropriate AC and Dc conditions are set in amplifier stage 165, and coupled to the final smoothing circuit 168, particularly the capacitor thereof, via diode means 167. As in the fixed band, the gain of the overshoot suppression side circuit is less than unity. The smoothing of MC1 to create MC2 is necessary because, unlike the situation in the fixed-band circuit, there is no constant and favorable phase relationship between the signal in the control circuit and MC1 (because of the sliding band); the smoothing enables reliable and effective bucking action to take place.

The effect of the primary overshoot suppression circuit preferably is maximized for the most significant transient signal situation—that is, a single impulse or tone burst starting from a sub-threshold signal level. Because of the way the primary overshoot signal is derived, the overshoot suppression signal amplitude falls with increasing frequency faster than the control signal amplitude. This causes insufficient overshoot suppression for signals in the 200 to 800 Hz region. To compensate for this, a portion of the fixed-band overshoot suppression is fed to the sliding-band control circuit. This supplemental signal is called the sliding-band secondary overshoot signal.

The sliding-band and fixed-band control circuits (156 and 118, respectively) further include a "parking" feature. In the sliding-band circuit 156, a parking circuit 176 is coupled to the second integrator 168 by a coupling diode 178. In the fixed-band circuit 118, a parking circuit 180 is coupled to the second integrator 124 by a coupling diode 182. The parking circuits operate generally in the same way as the parking circuits described in U.S. Pat. No. 4,736,433. The fixed-band parking circuit 180 puts a charge on the capacitor in smoothing circuit 124 so as to keep the control circuit just below its threshold; the sliding-band parking circuit 176 operates in the same manner so as to prevent the sliding-band filter corner frequency from dropping below a particular frequency. The effect of the parking circuits is to improve noise-reduction performance and transient response under certain signal conditions by allowing the control circuit to react more quickly. In the sliding band, the parking circuit fixes the corner frequency of the sliding band slightly above the corner frequency of the circuit input filter.

FIG. 12 shows the steady-state and transient control aspects of the low-frequency fixed-band sub-stage 28 (FIG. 7A). As with the high-frequency sub-stages, only the basic parameter determining elements are shown. The sub-stage is similar to the fixed-band circuit of the high-frequency sub-stage described in connection with FIG. 10.

Referring to FIG. 12, the incoming signal is applied through a 200 Hz band-defining low-pass filter (the location of this filter is changed from that of the action-substitution sub-stage) to a variable attenuator circuit provided by resistor 182 and a variable resistance element 184. Control circuit frequency weighting is provided by a single-pole 400 Hz low-pass filter 186. The main control circuit 188 full-wave rectifies the filtered signal in block 190; the resulting DC signal is bucked by modulation control signal MC4 in combining means 192, smoothed in block 194 by a smoothing circuit with about a 15 ms time constant, and fed to one input of maximum selector circuit 196. The maximum selector circuit has the same purpose and mode of operation as in the high-frequency sub-stages.

The low-frequency fixed-band sub-stage also includes the "parking" feature. A parking circuit 210 is coupled to the second integrating capacitor 206 by a coupling diode 212. The parking circuit 210 operates in the same way as the fixed-parking circuit 180 of FIG. 10: it puts a charge on the capacitor in smoothing circuit 206 so as to keep the control circuit just below its threshold.

The 400 Hz frequency weighted output of the fixed-band sub-stage is also fed to the pass-band control circuit 198. Here the control signal is further weighted by a 100 Hz single-pole low-pass filter 200, full-wave rectified in block 202, smoothed by a smoothing circuit with about a 15 ms time constant in block 204, and fed to the other input of the maximum selector. The larger of the two signals is passed to the final smoothing circuit (about 300 ms) 206 and is used to control the fixed-band variable resistor 184 via variable resistor driver circuit 208, a non-linear function circuit. Circuit 208 provides a characteristic similar to circuit 126 of FIG. 10.

In a manner generally similar to that of the high-frequency sub-stages, unsmoothed rectified signals derived from the outputs of the variable elements are opposed by appropriate modulation control signals and are fed via diode means to the final smoothing circuits, especially the capacitor in each such circuit.

The low-frequency fixed-band sub-stage generates a primary overshoot suppression signal simply by bucking the output of rectifier 214 against MC4 in combining means 216. The appropriate AC and DC conditions are set in amplifier 218 and the overshoot suppression signal is then coupled via diode means 220 to the final smoothing circuit 206, especially the capacitor thereof, of the fixed-band circuit. The gain of the overshoot suppression side circuit is less than the gain of the steady-state control circuit.

In the arrangements of U.S. Pat. No. 3,846,719; U.S. Pat. No. Re 28,426; and U.S. Pat. No. 4,490,691 and in commercialized embodiments based thereon (the A-type, B-type, and C-type systems) the noise-reduction signals (from the side paths) are highly limited or attenuated under high-level signal conditions. This high degree of limiting or attenuation, beginning at a low-level threshold, is responsible for the low harmonic distortion, low overshoot, and low modulation distortion which characterize these systems.

As explained in U.S. Pat. No. 4,498,055, it is unnecessary to utilize such a low threshold and such a strong limiting characteristic under certain conditions. In particular, whenever the noise-reduction signal departs from an in-phase condition with respect to the main-path signal, then the threshold can be raised. Furthermore, after an appropriate degree of limiting has taken place at a given frequency (in order to create the desired overall compression law), then it is unnecessary to continue the limiting as the signal level rises. Rather, the level of the noise-reduction signal can be allowed to rise as the input signal rises, stabilizing at some significant fraction of the main-path signal level.

For example, in the fixed-band circuits of the action-substitution sub-stages such just described in connection with FIG. 10, in the fixed-band sub-stage of FIG. 12, and in U.S. Pat. No. 4,922,535, the application of the teachings of U.S. Pat. No. 4,498,055 results in conventional performance in the pass-band (in-phase) frequency region. However, in the stop-band region the limiting threshold is allowed to rise and the degree of limiting is reduced.

As discussed in U.S. Pat. No. 4,922,535, similar considerations apply in sliding-band circuits. In the B-type sliding-band circuit (described in detail in U.S. Pat. No. 4,490,691), a variable filter follows a fixed filter, which has proved to be an efficient and reproducible arrangement. However, at frequencies outside the pass-band a pure two-pole filter results in overall amplitude subtraction because of the large phase angles created. Therefore, the type of filter which has been employed is only quasi-two-pole (a single-pole fixed filter plus a variable shelf characteristic).

The same arrangement is used in the practical embodiments of the arrangement of FIG. 7A, with one octave differences in the variable filter quiescent turn-over points and the fixed filter turnover point (as in the B-type circuit). Above the threshold at a particular frequency the variable filter slides to the turnover frequency needed to create the overall (main-path plus side-path signal) compression law. As the input level rises, and once an overall gain of unity is obtained, there is no reason for further sliding of the variable filter. At this point the modulation control arrangement as taught in U.S. Pat. No. 4,498,055 and U.S. Pat. No. 4,922,535 counteracts further sliding of the variable filter; this prevents unnecessary modulation of the signal and impairment of the noise-reduction effect achieved during decoding.

The above effects in both fixed and sliding bands are created by circuits called modulation control circuits. Suitably filtered or frequency weighted signals from the main signal path are rectified, and in some cases smoothed, and are fed in opposition to the control signals generated by the control circuits of the various circuits. The result at higher signal levels is to create a balance or equilibrium between the circuit control signals and the modulation control signals. Under these conditions there is no further gain reduction or sliding of the relevant variable filters with increasing input signal levels.

As mentioned in U.S. Pat. No. 4,498,055, when modulation control techniques are embodied in multistage devices, the modulation control circuits need not be derived from within each individual stage. FIG. 13 shows a preferred arrangement for deriving modulation control (MC) signals used in the embodiments of FIGS. 11 and 12.

In the professional SR system, as explained in U.S. Pat. No. 4,922,535, eight modulation control signals, designated MC1 through MC8, are employed. In the present system only four of those modulation control signals are employed, MC1–MC3 and MC6, and they are derived from the summing means of the second stage (adder 34 in the compressor and adder 32' in the expander). MC4 and MC5 are not required because the present system does not use a low-frequency sliding-band stage. In the professional SR system, MC4 controls the sliding-band parts of the low-frequency action substitution sub-stages and MC5 is used to control the low-frequency sliding-band overshoot suppression circuits. However, to prevent a break in the sequence of modulation control signal numbering from possibly causing confusion, MC6 of the professional SR system is called MC4 in this application. Thus, MC4 in this application is not the same as MC4 in professional SR.

FIG. 13 shows further details of the modulation control circuits. MC1-3 are used for the high-frequency sub-stages 24 and 26 (FIG. 7A); MC4 is used for the low-frequency sub-stage 26 (FIG. 7A).

MC1 controls the high-frequency sliding-band circuits. The signal from the takeoff point is fed through a 100 Hz all-pass filter 250 for phase compensation, a single-pole high-pass filter 252 having about a 3 kHz corner frequency, and is rectified in block 254, and fed in opposition to the control signals generated by the high-frequency sub-stages. MC1 is also smoothed by a two-stage integrator 256 having about a 1 ms time constant and is employed, as MC2, to oppose the operation of the high-frequency sliding-band overshoot suppression circuits as described above. The overshoot suppression thresholds thereby track the steady-state thresholds.

MC3 controls the high-frequency fixed-band circuits. The signal from the takeoff point is weighted by cascaded single-pole low-pass filters 258, 260, having respective corner frequencies of about 200 Hz and about 400 Hz, rectified in block 262 and fed in opposition to both the steady-state and transient control (overshoot suppression) circuits of the high-frequency fixed-band circuits.

MC4 controls the low-frequency fixed-band sub-stage. The signal from the takeoff point is weighted by cascaded single-pole high-pass filters 264, 266, having corner frequencies of about 200 Hz and 400 Hz, respectively, rectified in block 268, and is fed in opposition to both the steady-state and transient control (overshoot suppression) circuits of the low-frequency fixed-band sub-stage.

A side effect of the modulation control scheme is that at high signal levels the amplitudes of the noise-reduction signals from the side paths are relatively high in comparison with the situation in the A-type, B-type, and C-type systems that do not employ modulation control. Because of this it is not possible to employ simple overshoot suppression diodes as in these previous systems (for example, clipping diodes 28 in FIG. 4 of U.S. Pat. No. Re 28,426). Accordingly, as in the professional SR system and as described in U.S. Pat. No. 4,922,535, overshoot suppression side circuits are used in parallel with a portion of the steady-state control circuit in order to provide a rapid but controlled decrease in attack time of the control circuit.

In FIG. 14, an alternative embodiment of a compressor in accordance with the present invention is shown, having two-series Type I dual-path stages. As with the embodiment of FIG. 7A, the threshold levels of the series bi-linear circuits are staggered, employing the dynamic action level staggering aspects of U.S. Pat. No. 4,490,691. Alternatively, a Type II configuration could be employed. The embodiment of FIG. 14 also employs the spectral skewing and antisaturation aspects of U.S. Pat. No. 4,490,691. Although the invention may be implemented using dual-path or single-path arrangements, dual-path implementations have certain advantages, as discussed above, and are preferred. The decoder is complementary to the encoder and may be implemented by the well-known technique of placing the encoder in the feedback loop of suitable high gain amplifier or in the manner of the arrangement of FIG. 7A.

Corresponding elements in FIGS. 7 and 14 bear related reference numerals, the FIG. 14 reference numerals adding 300 to the numerals used in FIG. 7A. The compressor portion of the system of FIG. 14 has two stages: a high-level stage 310, which has the higher threshold level, and a low-level stage 312, which has a lower threshold level. The low-level stage has only a high-frequency action-substitution sub-stage 326 and no low-frequency sub-stage. Each high-frequency sub-stage 324 and 326 is of the type described generally in connection with FIGS. 9A-9C and more specifically in connection with FIGS. 7 and 10. High-frequency sub-stage 324 includes a high-frequency sliding-band element 346 and a high-frequency fixed-band element 348; high-frequency sub-stage 326 includes a high-frequency sliding-band element 350 and a high-frequency fixed-band element 352. The low-frequency sub-stage 328 is of the type described in connection with FIG. 16. In practical circuits, there are some differences between the high-frequency sub-stages 324 and 326 as a result of their respective locations in the high-level and low-level stages. These differences are noted in the discussion of the embodiment of FIG. 15.

If each high-frequency action-substitution compressor sub-stage (324, 326) and each high-frequency action-substitution expander sub-stage in the complementary expander (not shown) has, for example, 12 dB of compression or expansion, respectively, and if the low-frequency fixed-band compressor sub-stage 328 and the low-frequency fixed-band expander sub-stage in the complementary expander has, for example, 10 dB of compression or expansion, then an overall compander system employing the compressor of FIG. 14 and its complementary expander will provide 24 dB of noise reduction in the high-frequency band (above the 400 Hz region, if the high-frequency sub-stages 324 and 426 have 400 Hz cutoff frequencies) and 10 dB of noise reduction in the low-frequency band (below 200 Hz, if the low-frequency sub-stage 328 has a 200 Hz cutoff frequency). Such an arrangement is also useful, for example, as is the embodiment of FIG. 7A, in a high-quality audio noise-reduction system of the type used in consumer and semi-professional applications.

The input to the compressor portion of the system is applied to low-frequency spectral skewing network shown as block 340. In a practical embodiment the network is a low-pass single-pole shelving section with a pole at 80 Hz and a zero at 32 Hz (a depth of about 8 dB). The spectral skewing network has a voltage transfer function in the Laplace domain substantially of the form:

$$\frac{V_o(s)}{V_{in}(s)} = \frac{f_0}{f_1} \cdot \frac{1 + s/2\pi f_0}{1 + s/2\pi f_1}$$

where $f_0 = 32$ Hz, and $f_1 = 80$ Hz. The network may be implemented using well-known operational amplifier active filter techniques. A complementary de-skewing network is located in the expander (not shown).

The low-frequency spectral skewing network of the FIG. 14 embodiment has a bigger shelf and its action starts at a higher frequency than the corresponding network in the embodiment of FIG. 7A. This change provides a better antisaturation effect in the frequency region where typical cassette tape starts to saturate as a result of the 3180 μs (microsecond) low-frequency record equalization by providing about 3 dB of attenuation at 50 Hz at high input signal levels.

High-frequency spectral skewing is provided by network 342 and network 344 in the inputs to the respective high-frequency action substitution sub-stages 324 and 326. In a practical embodiment, network 342 is a single-pole low-pass filter having a corner frequency of 12.8 kHz and network 344 is a two-pole low-pass filter having the same corner frequency. These networks may be implemented using well-known operational amplifier active filter techniques.

Relocating the high-frequency spectral skewing filter from the compressor input to the side-path input of each of the two stages enables the purposes of conventional spectral skewing to be obtained without some of the attendant disadvantages. Primarily, the original purpose of desensitizing the compressor control circuits to signals at frequencies at which significant medium errors are likely is achieved simply by attenuating the input to the side path at such frequencies. This provides the same kind of control signal frequency weighting as conventional spectral skewing. The conventional spectral skewing configuration shown in FIG. 7A is required to have a shelving response at high frequencies so that a stable expander can be made by putting a compressor in the negative feedback loop of a suitable amplifier. This shelf characteristic limits the amount of spectral skewing effect that can be obtained. Such a limit does not apply with side-path spectral skewing, and spectral skewing networks 342 and 344 of FIG. 14 are simple 1-pole and 2-pole low-pass filters respectively. Such filters can be used because, although their effect in the side path continues to increase with increasing frequency, they can never reduce overall compressor gain to less than unity.

The ability to use non-shelving filters in side-path spectral skewing circuits gives the important performance advantage of a progressively increasing amount of spectral skewing effect as the frequency increases. Consider, for example, the superior ability of side-path spectral skewing to reduce bias effect. All high quality tape recorders use a large-amplitude ultrasonic bias signal, at normally somewhere between 60–250 kHz in consumer products, to linearize the recording process. If the bias signal enters the control circuit of the noise reduction processors, it can substantially change the compressor characteristic. The bias generator normally does not operate when the tape recorder is playing back and the noise reduction circuit is in decode mode, so the bias signal does not change the expander characteristic. The normal expander characteristic is unable to track the bias-altered compressor characteristic, and serious encode-decode mis-tracking results. Even if the bias signal is present when the expander is operating (e.g. in a three-head tape recorder when monitoring off-tape during a recording) there will still be mis-tracking because the amount of bias leakage into the compressor and expander (and hence bias effect) is unlikely to be exactly the same in the compressor and expander.

To prevent the bias signal from entering the compressor and the expander, various filtering methods, including tuned traps, are used. These filters can degrade the sound quality (by ringing) and may limit the bandwidth that can be recorded. Side-path spectral skewing with a simple single-pole or two-pole low-pass characteristic as described above greatly improves the immunity of the compressor and the expander to bias interference because of the large amounts of attenuation such circuits give at bias frequencies. Side-path spectral skewing at both low and high frequencies also helps prevent compressor-expander mis-tracking caused by other forms of extraneous signals, such as FM-multiplex pilot tones, and low-frequency flicker noise. Since it is good practice to use an input bandwidth defining filter for reasons other than preventing bias interference, such a filter should be retained, but with a simple single-pole band-pass characteristic having corner frequencies well away from the normal limits of the audio band.

Instead of acting as an accessory to a conventionally operating noise reduction circuit, a side-path spectral skewing circuit is fully integrated with the noise reduction circuit and changes the way in which the noise reduction circuit operates. The spectral skewing circuit attenuates the side-path output signal in the frequency range in which it operates and hence reduces amount of compression obtained at such frequencies. This in turn reduces the peak compression ratio, and hence the mistracking effect. Moreover, because there is no attenuation of the main-path signal, side-path spectral skewing does not raise the level of the compressor finishing point as conventional spectral skewing does. In fact, the level of the compressor finishing point progressively decreases with increasing frequency, a desirable feature in consumer tape equipment in which the level at which the tape saturates also progressively decreases with increasing frequency.

A further advantage of locating spectral skewing in the side path is that such a configuration has a beneficial effect in the expander as well as in the compressor. In the expander shown in FIG. 7A, the spectral de-skewing circuit is at the output of the expander, and thus cannot prevent extraneous signals from contributing to the expander control signals, and thus modifying the expander characteristic. Side-path spectral skewing reduces the contribution of extraneous signals to the control signal in both the compressor and the expander and thus enhances the accuracy of the noise reduction system in applications in which signals in addition to those that left the compressor are present at the input of the expander.

Because of its location in the side path, making it inoperative at high signal levels, side-path spectral skewing does not reduce the level at which signals are presented to the medium, and thus cannot reduce the likelihood of level-dependent medium errors (such as tape saturation) occurring. This deficiency can be remedied by increasing the amount of anti-saturation applied in the main path. Increasing the amount of anti-saturation increases the compression ratio and thus undoes some of the advantage of using side-path spectral skewing. However, the configuration of FIG. 14 allows the frequency range and amount of anti-saturation to be completely independent of the frequency range and amount of spectral skewing, which gives considerable scope for trading off the various parameters to optimize the circuit characteristics for various applications. The parameters shown in FIGS. 14 and 15 are optimized for use in high quality compact cassette recorders.

Complementary de-skewing networks are located in the expander (not shown).

The main paths of the low-level and high-level stages 310 and 312 include respective high-frequency antisaturation networks 356 and 358. Antisaturation network 356 has a voltage transfer function in the Laplace domain substantially of the form:

$$\frac{V_o(s)}{V_{in}(s)} = \frac{1 + s/2\pi f_8}{1 + s/2\pi f_9}$$

where $f_8 = 6,000$ Hz, and $f_9 = 12,000$ Hz.

Antisaturation network 358 has a voltage transfer function in the Laplace domain substantially of the form:

$$\frac{V_o(s)}{V_{in}(s)} = \frac{1 + s/2\pi f_6}{1 + s/2\pi f_7}$$

where $f_6 = 5,000$ Hz, and $f_7 = 15,000$ Hz.

Complementary antisaturation networks are located in the expander (not shown). The use of two antisaturation networks and the change in the break frequencies of the networks with respect to the single antisaturation network of the FIG. 10 embodiment results in improved antisaturation response and compensates for the reduced antisaturation effect produced by the spectral skewing network arrangements of the FIG. 14 embodiment.

The Type I stages of FIG. 14 also include summing means 332 and 334 that combine the outputs of the high-level and low-level stages 310 and 312 with the respective main paths. FIG. 14 also shows the modulation control circuits as block 354 which applies the modulation control signals MC1-3 to the action substitution sub-stage elements 346, 348, 350, and 352 and the modulation control signal MC4 to the low-frequency fixed band sub-stage 328.

In operation, the action substitution sub-stages of the embodiment of FIG. 14 operate in the same way as in described in connection with the embodiment of FIG. 7A. However, as mentioned above, the stack configuration of the embodiment of FIGS. 14-17 employs a differential derivation of the sliding-band element control signal.

In FIG. 15, an embodiment of the high-frequency sub-stages 324 and 326 (FIG. 14) is shown, indicating both the steady-state and transient control aspects of the circuit. In addition to the differences noted below, the high-level and low-level stages differ in that the AC and DC circuit gains are increased for the low-level stage. As with other block diagrams, this figure shows only the basic parameter determining elements; the practical circuits, of course, contain other details such as buffering, amplification, and attenuation. For the purposes of conciseness and convenience, only the differences between FIG. 15 and FIG. 10 will be described. Corresponding elements in FIGS. 10 and 15 bear related reference numerals, the FIG. 15 reference numerals adding 300 to the numerals used in FIG. 10.

In the embodiment of FIG. 15, the input high-frequency band defining filter 102 of FIG. 10 now includes the high-frequency spectral skewing network 342 or 344 (FIG. 14). The combined band defining and spectral skewing network is shown as block 403. The input filter of the high-frequency sub-stage of the high-level stage has a voltage transfer function in the Laplace domain substantially of the form:

$$\frac{V_o}{V_{in}} = \frac{s/2\pi f_1}{1 + s/2\pi f_1} \cdot \frac{1}{1 + s/2\pi f_2}$$

where $f_1 = 406$ Hz, and $f_2 = 12,600$ Hz; and the input filter of the high-frequency sub-stage of the low-level stage has a voltage transfer function in the Laplace domain substantially of the form: where $f_1 = 406$ Hz, $f_2 = 48,000$ Hz, $f_3 = 13,300$ Hz, and $Q = 0.88$.

$$\frac{V_o}{V_{in}} = \frac{s/2\pi f_1}{1 + s/2\pi f_1} \cdot \frac{1 + s/2\pi f_2}{1 + (s/Q \cdot 2\pi f_3) + (s/2\pi f_2)^2}$$

In order to implement the differential derivation of the sliding-band element control signal, the output of the fixed band element at the junction of resistor 408 and the variable element 410 is subtracted from the signal fed to the sliding band element control circuit in combining means 459. Deriving the sliding band control signal differentially effectively raises the threshold of the sliding band, and prevents the sliding band from being controlled erroneously by noise. At low input signal levels, the differential voltage developed across fixed-band control element 410 (which has a relatively high value under such conditions) is significant and thus considerably reduces the amplitude of the signal at the output of combining means 459 (and hence the amplitude of the sliding band element control signal). At higher input signal levels, when the value of fixed band control element 410 is lower, the effect of the differential voltage from across element 410 is less, and the sliding band control signal has its full effect.

The effectiveness of the differentially derived sliding band control signal on raising the threshold of the sliding band is enhanced at high frequencies by relocating filter network 107 from the input to the fixed band element 104 of the FIG. 10 embodiment. The filter is now labelled block 409 and is now located between the fixed band and sliding band elements. Relocating the filter has no effect on the operation of the fixed band element. The fixed band element control circuit still receives a filtered signal. The signal fed from the fixed band element to the bottom end of sliding band control element 454 is also filtered as before. The differential signal fed to combining means 459 is not filtered, however. This means that at frequencies above the lower turn-over frequency of filter 409, the amplitude of the differential signal (and hence its effect on the sliding band element control circuit) is up to 12 dB greater than it would have been if filter 407 had been left in the position of filter 107 of the FIG. 10.

Filter 160 of the FIG. 10 embodiment is modified to have a corner frequency of 6 kHz in both the high-level and low level stages. It is shown as block 461.

In the control circuit 412 of the fixed band element, the corner frequency of the filter 116 (FIG. 10) is raised to about 400 Hz (Filter 417 in FIG. 15).

The control circuit of the fixed-band element is simplified by removing the 8 ms time constant circuits 130 and 136 (FIG. 10). Instead, in the embodiment of FIG. 15, maximum selector 422 operates on unsmoothed rectified signals and feeds a single 8 ms time constant circuit 423, followed by 160 ms time constant circuit 424.

The parking circuit 176 (FIG. 10) is omitted from the embodiment of FIG. 15.

Additions to the embodiment of FIG. 15 are circuits for limiting the maximum amplitude level of the sliding-band and fixed-band control signals: limit circuits 477 and 486 and their respective coupling diodes 479 and 482. Whereas the parking circuit improves the attack time of the circuit by maintaining the capacitor voltage in the integrator at a level just below the threshold of variable element 426, the limit circuits improve recovery time and enhance compatibility among circuits by preventing the voltage on the capacitor from building up to excessive levels under high level signal conditions. When the high level signal ceases, the voltage on the capacitor can fall more quickly to the new level appropriate for the new input signal condition because it has a lower starting level.

FIG. 16 shows the steady-state and transient control aspects of the low-frequency fixed-band sub-stage 328 (FIG. 14). As with the high-frequency sub-stages, only the basic parameter determining elements are shown. The circuit is similar to the fixed-band circuit of the high-frequency sub-stage described in connection with FIG. 15. For the purposes of conciseness and convenience, only the differences between FIG. 16 and FIG. 12 will be described. Corresponding elements in FIGS. 12 and 16 bear related reference numerals, the FIG. 16 reference numerals adding 300 to the numerals used in FIG. 12.

As in the high-frequency sub-stages, the control circuit is simplified by operating the maximum selector on unsmoothed rectified signals. This enables the two 15 ms time constant circuits 194 and 204 (FIG. 12) to be replaced by a single 15 ms time constant circuit 505 located between the maximum selector 496 and the 300 ms time constant circuit 506.

The derivation of the overshoot suppression signal is changed in the FIG. 16 embodiment with respect to FIG. 12. Rectifier 214 and combining means 216 (FIG. 12) are omitted and, in the FIG. 16 embodiment, the overshoot signal is simply derived from the output of main control circuit 488. This signal is a suitable source of an overshoot suppression signal because smoothing element 194 (FIG. 12) is omitted in the FIG. 16 configuration.

A limit circuit 524 and diode 522 is added to limit the maximum amplitude of the low-frequency fixed-band control signal.

FIG. 17 shows further details of the modulation control circuits used in the embodiment of FIGS. 14, 15, and 16. MC1-3 are used for the high-frequency sub-stages 324 and 326 (FIG. 14); MC4 is used for the low-frequency sub-stage 328 (FIG. 14). For the purposes of conciseness and convenience, only the differences between FIG. 17 and FIG. 13 will be described. Corresponding elements in FIGS. 13 and 17 bear related reference numerals, the FIG. 17 reference numerals adding 300 to the numerals used in FIG. 13. The embodiment of FIG. 17 omits the 100 Hz all-pass filter 250 of FIG. 13. In addition, a single stage integrator 257 with a 2 ms time constant is used instead of a 2-stage integrator 256 with 1 ms time constants.

FIGS. 18 through 20 show the preferred embodiment of a compressor in accordance with the present invention. Because the embodiment shown in FIGS. 18 through 20 is an evolutionary development of that shown in FIGS. 14 through 17, the description pertaining to FIGS. 14 through 16 pertains equally to FIGS. 18 through 20, except for the differences to be described below. Corresponding elements in FIGS. 14 through 16 and 18 through 20 bear related reference numerals; in the latter three Figures, the reference numerals add the letter A to the reference numerals used the former three figures. FIG. 17 shows the modulation control signal derivation for both embodiments.

The input to the compressor portion of the system is applied in the preferred embodiment (FIG. 18) directly to the input of the main path and the input filters of the high-level stage 310A in the side path, instead of via low-frequency spectral skewing block 340 (FIG. 14). Low-frequency spectral skewing is provided in the embodiment of FIG. 18 by block 360A, located at the input of low-frequency fixed band 328A in high-level stage 310A. Although the low-frequency spectral skewing network is shown as separate block 360A in FIG. 18, its function can be realized simply by changing low frequency band defining filter 480 (FIG. 16) at the input to low-frequency fixed band 328 (FIG. 14) into band-pass filter 490A (FIG. 20) in the same location 328A (FIG. 18). Alternatively, separate filters can be used for the low frequency band defining filter and spectral skewing functions.

In a practical embodiment, the high-pass (i.e. low-frequency spectral skewing) portion of band-pass filter 490A is a single-pole section with a corner frequency at 33 Hz and the low-pass (i.e. low frequency band defining) portion of the filter is a single-pole section with a corner frequency of 240 Hz. The latter frequency is different from the 200 Hz corner frequency of corresponding low-pass filter 480 of the FIG. 14 embodiment because different preferred value components are used. The input filter 490A of low-frequency fixed-band sub-stage 328A in high-level stage 310, with combined low frequency band defining and low-frequency spectral skewing functions, has a voltage transfer function in the Laplace domain substantially of the form:

$$\frac{V_o(s)}{V_{in}(s)} = \frac{s/2\pi f_1}{1 + s/2\pi f_1} \cdot \frac{1}{1 + s/2\pi f_2}$$

where $f_1 = 33$ Hz, and $f_2 = 240$ Hz. The network may be implemented using well-known operational amplifier active filter techniques. A complementary combined low-frequency de-skewing network and low frequency band defining filter is located in the expander (not shown).

The low-frequency spectral skewing network 360A of the FIG. 18 embodiment operates at lower frequencies than the corresponding network in the embodiments of FIGS. 7 and 14. However, the effect of low-frequency spectral skewing filter 360A of the FIG. 18 embodiment is greater at very low frequencies than that of the low-frequency spectral skewing filter of the other two embodiments because filter 360A has a simple high-pass characteristic rather than a shelf characteristic. This change in characteristic is made possible by locating the spectral skewing filter in the side path, where there is no need to limit its action in order to be able to generate an accurate complementary characteristic in decode mode.

High-frequency spectral skewing is provided by networks 342A and 344A. Again, separate circuit blocks are shown in FIG. 18, but a practical embodiment of the circuit can use the configuration shown in FIG. 14, in which a single band-pass filter (403 in FIG. 15) in the input of each of the high-frequency action-substitution sub-stages 324 and 326 in FIG. 14 serves as both the high-frequency spectral skewing network and the action-substitution sub-stage high-frequency band defining input filter. Alternatively, separate filters can be used to provide the spectral skewing and high-frequency band defining filter functions.

In a practical version of the FIG. 18 embodiment, the input band-pass filter 403A (FIG. 19) of high-frequency action substitution sub-stage 324A of high-level stage 310A has a single-pole high-pass (high-frequency band defining) characteristic with a corner frequency at 406 Hz, and a single-pole low-pass (spectral skewing) characteristic with a corner frequency at 12.6 kHz. The slight difference in the these frequencies from the corresponding frequencies used in block 403 of the FIG. 14 embodiment is simply a result of using components with different preferred values. Input filter 403A of the high-frequency action-substitution sub-stage 324A of high-level stage 310A, with combined high-frequency band defining filter and high-frequency spectral skewing functions, has a voltage transfer function in the Laplace domain substantially of the form:

$$\frac{V_o(s)}{V_{in}(s)} = \frac{s/2\pi f_1}{1 + s/2\pi f_1} \cdot \frac{1}{1 + s/2\pi f_2}$$

where $f_1 = 406$ Hz, and $f_2 = 12,600$ Hz.

The input band-pass filter 403A (FIG. 15) to the high-frequency action substitution sub-stage 326A in low-level stage 312A has a single-pole high-pass (high-frequency band defining) characteristic with a corner frequency at 406 Hz, and a double-pole low-pass (spectral skewing) characteristic with a corner frequency at 13.3 kHz. The slight difference in the first of these frequencies from the corresponding frequency in block 403 of the FIG. 14 embodiment is simply a result of using components with different preferred values.

The slope of the low-pass characteristic of band-pass filter 403A changes to a single pole characteristic at frequencies above 48 kHz. This causes some reduction of the spectral skewing effect at ultrasonic frequencies, such as tape recorder bias frequency. However, even with the reduced spectral skewing effect, the FIG. 18 embodiment remains considerably superior to other noise reduction systems and the FIG. 10 configuration in avoiding tracking errors caused by bias and other ultrasonic signals. The main advantage of reducing the slope of the spectral skewing characteristic at ultrasonic frequencies is that it increases the margin of stability of the decoder (when an encoder is typically placed in the feedback loop of a high-gain amplifier).

Input filter 403A of the high-frequency action substitution sub-stage (326A) of low-level stage 312A, with combined high-frequency band defining filter and high-frequency spectral skewing functions, has a voltage transfer function in the Laplace domain substantially of the form:

$$\frac{V_o(s)}{V_{in}(s)} = \frac{s/2\pi f_1}{1 + s/2\pi f_1} \cdot \frac{1 + s/2\pi f_2}{1 + (s/Q \cdot 2\pi f_3) + (s/2\pi f_3)^2}$$

where $f_1 = 406$ Hz, $f_2 = 48,000$ Hz, $f_3 = 13,300$ Hz, and $Q = 0.88$.

These networks may also be implemented using well-known operational amplifier active filter techniques. Complementary combined de-skewing and high-frequency band defining input filter networks are located in the expander (not shown).

The main paths of low-level and high-level stages 310A and 312A respectively include respective antisaturation networks 356A and 358A. Both networks provide high-frequency antisaturation action; additionally, antisaturation network 356A in high-level stage 310A provides low-frequency antisaturation action, substituting for the antisaturation effect lost by moving the low-frequency spectral skewing network 360A to the side-path.

Combined low-frequency and high-frequency antisaturation network 356A has an overall band-pass-like characteristic. The low-frequency antisaturation effect is provided by a single-pole shelf characteristic with an upper corner frequency at 150 Hz and a lower corner frequency at 60 Hz. These frequencies are considerably higher than those used in low-frequency spectral skewing network 340 in the FIG. 14 embodiment. However, low-frequency spectral skewing network 340 (FIG. 14) is located at the compressor input, whereas anti-saturation network 356A (FIG. 18) is located in the main path, where its action is diluted by the non-attenuated low-frequency signal from low-frequency band 328A in the side path. With the corner frequencies stated above, low-frequency part of antisaturation network 356A reduces the overall level of the signal at compressor output 361A by about the same amount as low-frequency spectral skewing network 340 reduced it in the FIG. 14 embodiment. At an input level of 5 dB above reference level (200 nWb/m for cassette tapes), the low-frequency part of antisaturation network 356A reduces the signal level at compressor output 361A by about 3 dB at 50 Hz, which effectively cancels out the troublesome 3180 μs low-frequency record pre-emphasis required by the I.E.C. standard for cassette tapes. A greater low-frequency antisaturation effect is obtained at higher levels; at lower levels, the effect is reduced.

The high-frequency antisaturation effect of block 356A in high-level stage 310A is provided by a high-frequency notch characteristic with a notch frequency of 25 kHz instead of the simple single-pole shelf characteristic used in the FIG. 14 embodiment. Above 25 kHz, the attenuation of the notch filter gradually reduces to zero, which usefully increases the margin of stability of the decoder (when an encoder is typically placed in the feedback loop of a high-gain amplifier) compared with the FIG. 14 shelf characteristic. The resulting reduction in the amount of anti-saturation effect at ultrasonic frequencies does not give rise to appreciable tape overload problems at such frequencies mainly because the normal record amplifier configuration used in most consumer and semi-professional tape recorders has a greatly reduced response at such frequencies. Moreover, the shelf characteristic is retained in the low-level stage and produces about 10 dB of antisaturation effect at such frequencies.

Antisaturation network 356A has a voltage transfer function in the Laplace domain substantially of the form:

$$\frac{V_o(s)}{V_{in}(s)} = \frac{2\pi f_1}{2\pi f_2} \cdot \frac{1 + s/2\pi f_1}{1 + s/2\pi f_2} \cdot \frac{1 + (s/Q \cdot 2\pi f_3) + (s/2\pi f_3)^2}{1 + (2s/Q \cdot 2\pi f_3) + (s/2\pi f_3)^2}$$

where $f_1 = 60$ Hz, $f_2 = 150$ Hz, $f_3 = 25,000$ Hz, and $Q = 0.707$.

Antisaturation network 358A provides high-frequency antisaturation in low-level stage 312A and is a single-pole shelf network, similar to antisaturation network 358 in the FIG. 14 embodiment. However, the lower corner frequency has been moved up from 5 kHz to 6 kHz. The depth of the shelf remains essentially unchanged. Antisaturation network 358A has a voltage transfer function in the Laplace domain substantially of the form:

$$\frac{V_o(s)}{V_{in}(s)} = \frac{1 + s/2\pi f_6}{1 + s/2\pi f_7}$$

where $f_6 = 6,000$ Hz, and $f_7 = 17,600$ Hz. Complementary antisaturation networks are located in the expander (not shown).

FIG. 19 shows the preferred embodiment of the high-frequency action substitution sub-stages 324A and 326A (FIG. 18) of the high-level stage 310A and the low-level stage 312A respectively, including both the steady-state and transient control aspects of the circuit. To save repetition, only the differences between the FIG. 19 embodiment and the FIG. 15 embodiment will be discussed. Corresponding elements in FIGS. 15 and 19 bear related reference numerals, the FIG. 19 reference numerals adding the letter A to the numerals used in FIG. 15.

The differences between the input band-pass filter 403 of FIG. 15 and the input band-pass filter 403A of FIG. 18 have already been described in connection with the above description of high-frequency spectral skewing.

The corner frequency of filter 461A is changed from 6 kHz to 8 kHz in high-level stage 310A (FIG. 18) only. The corner frequency of filter 461A in low-level stage 312A (FIG. 18) remains at 6 kHz. Staggering the corner frequencies gives in an improved compromise between sensitivity of sliding band control circuit 456A to noise and high-frequency compression ratio.

The limit circuit 486 in fixed-band control circuit 418 of FIG. 15 is omitted from the embodiment of FIG. 19. Sliding-band control circuit 456A retains limit circuit 477A to prevent excessive sliding of the band, however.

Because many kinds of signal compressors and expanders have level-dependent action, it is customary to define their action at levels relative to a reference level. The reference level in such devices invented by one of the inventors (Dolby) is generally referred to as "Dolby" level. The following voltage transfer function equations include a $V_{ref}$ term which enables their transfer function to be calculated for any value of Dolby level. Transfer functions given elsewhere in this specification omit the $V_{ref}$ term, but are valid for a Dolby level of 1 Volt RMS.

The voltage transfer function, at any level relative to a reference signal level, of the high-level, high-frequency fixed-band compressor in the Laplace domain is of the form:

$$\frac{V_o(s)}{V_{in}(s)} = \frac{1}{1 + \exp\left(\frac{G_{1H}V_o(s)}{V_{ref}} - V_{OSH}\right)} \cdot \frac{1 + s/2\pi f_2}{1 + s/2\pi f_3}$$

where $f_2$ is the fixed-band shelf filter zero frequency = 12,800 Hz, $f_3$ is the fixed-band shelf filter pole frequency = 3,200 Hz, $G_{1H}$ is the control circuit gain = 200, $V_{ref}$ is the RMS reference level voltage, $V_{OSH}$ is the control element offset voltage = 3.6.

The voltage transfer function, at any level relative to the reference signal level, of the low-level, high-frequency fixed-band compressor in the Laplace domain is of the form:

$$\frac{V_o(s)}{V_{in}(s)} = \frac{1}{1 + \exp\left(\frac{G_{1L}V_o(s)}{V_{ref}} - V_{OSL}\right)} \cdot \frac{1 + s/2\pi f_2}{1 + s/2\pi f_3}$$

where $f_2$ is the fixed-band shelf filter zero frequency = 12,800 Hz, $f_3$ is the fixed-band shelf filter pole frequency = 3,200 Hz, $G_{1L}$ is the control circuit gain = 663, $V_{ref}$ is the RMS reference level voltage, $V_{OSL}$ is the control element offset voltage = 6.0.

The voltage transfer function, at any level relative to the reference signal level, of the high-level, high-frequency sliding band compressor in the Laplace domain is of the form:

$$\frac{V_o(s)}{V_{in}(s)} = \frac{(s + 2\pi f_1) \cdot A_{SCH}}{s + 2\pi f_1 \left[\left(\frac{G_{2H}V_o(s)}{V_{ref}}\right)^N + 1\right]}$$

where $f_1$ is the lower corner frequency of the sliding-band variable high-pass shelf filter = 200 Hz, $G_{2H}$ is the control path gain = 1,610, $V_{ref}$ is the RMS reference level voltage, N is the control element power = 1.5, $A_{SCH}$ is the side-path signal gain = 3.05, The voltage transfer function, at any level relative to the reference signal level, of the low-level, high-frequency sliding band compressor in the Laplace domain is of the form:

$$\frac{V_o(s)}{V_{in}(s)} = \frac{(s + 2\pi f_1) \cdot A_{SCL}}{s + 2\pi f_1 \left[\left(\frac{G_{2L}V_o(s)}{V_{ref}}\right)^N + 1\right]}$$

where $f_1$ is the lower corner frequency of the sliding-band variable high-pass shelf filter = 200 Hz, $G_{2L}$ is the control path gain = 4,900, $V_{ref}$ is the RMS reference level voltage, N is the control element power = 1.5, $A_{SCL}$ is the side-path signal gain = 3.4.

FIG. 20 shows the preferred embodiment of the low-frequency sub-stage 328A (FIG. 18), including both the steady-state and transient control aspects of the circuit. The FIG. 20 embodiment is identical to the FIG. 16 embodiment, except for the two changes discussed below. Corresponding elements in FIGS. 16 and 20 bear related reference numerals, the FIG. 20 reference numerals adding the letter A to the numerals used in FIG. 16.

The differences between the input low-pass filter 480 of FIG. 16 and the input band-pass filter 490A of FIG. 20 have already been described in connection with a description of low-frequency spectral skewing.

The limit circuit 524 and diode 522, which, in the FIG. 16 embodiment, was added to the FIG. 10 embodiment to limit the maximum amplitude of the low-frequency fixed-band control signal, has been found to be unnecessary and has thus been removed from the FIG. 20 embodiment.

The voltage transfer function, at any level relative to the reference signal level, of the low-frequency fixed-band compressor in the Laplace domain is of the form:

$$\frac{V_o(s)}{V_{in}(s)} = \frac{1}{1 + \exp\left(\frac{G_{1F}V_o(s)}{V_{ref}} - V_{OSF}\right)}$$

where
- $G_{1F}$ is the control circuit gain = 213,
- $V_{ref}$ is the RMS reference level voltage,
- $V_{OSF}$ is the control element offset voltage = 6.0.

The modulation control signals for the embodiment shown in FIGS. 18, 19 and 20 are derived as shown in FIG. 17, and will therefore not be discussed further.

FIG. 21 shows a plot of output level against frequency at different input levels for a computer model of the compressor shown in FIGS. 18-20. The level-dependent influence of the antisaturation networks (high-level) and spectral skewing (low-level) on the overall characteristic can be seen by comparing the high-level and low-level curves.

FIG. 22 shows a plot of compression ratio against input level (FIG. 22A) or output level (FIG. 22B) at various different frequencies in the high frequency band for a computer model of the compressor shown in FIGS. 18-20. It can be seen that the compressor acts over a wide range of input levels, but its action at high levels (about 10 dB and up), at which errors are most audible and level-dependent errors are most likely to occur, is considerably less than at medium levels (between about −40 dB and about −15 dB), where errors are less likely to occur and to be audible. There is also very little action at low input levels (below about −45 dB) where noise could cause errors if there were action.

Note that the range of input levels at which significant dynamic action occurs (a compression ratio of about 1.5 or greater) is about −50 dB to about −5 dB or −10 dB (a range of about 40 to 45 dB) in comparison to the range of output levels at which significant dynamic action occurs which is about −30 dB to −10 dB (a range of about 20 dB). This illustrates the nominal 24 dB compression in the high-frequency. More rigorously, compression is determined by comparing the area under the respective input and output curves.

Thus, as illustrated in FIGS. 22A and 22B, the compressor of FIGS. 18-20 acts over a wide range of input signal levels, a range of levels which, as expressed in decibels, is about twice the range of its compressed output. Similar performance is provided by the other compressor and expander arrangements and set forth in this patent specification.

It is an important quality of the compressors and expanders of the present invention to provide dynamic action in a high-frequency band over a wide range of input signal levels while providing no dynamic action (fixed gain) at high and low input signal levels (e.g., a "bi-linear" characteristic as explained in U.S. Pat. No. 4,736,433) without significant accompanying increases of the overall maximum compression (or expansion) ratio. In the embodiments disclosed, this result is achieved by staggering of the high level and low level stages. However, similar results might also be obtainable using single stage arrangements particularly if digital signal processing techniques are employed. Thus, in its broadest context, the invention is not limited to the use of staggered high-frequency stages in cascade.

FIG. 23 shows a plot of compression ratio against input level (FIG. 23A) or output level (FIG. 23B) at 200 Hz for a computer model of the compressor shown in FIGS. 18-20. Although a signal at 200 Hz is affected primarily by the action of the low-frequency band sub-stage of the compressor, it is also affected somewhat by the high-frequency sub-stages due to the overlap of the characteristic actions. Thus, the compression at 200 Hz is somewhat greater than the maximum 10 dB provided by the low-frequency sub-stage.

Inspection of FIGS. 23A and 23B shows that a low frequencies such as 200 Hz, where compression results primarily from action of a single sub-stage, the compressor acts over a narrower range of input levels than it does at higher frequencies. Because the medium levels at which the compressor acts at low frequencies are narrower, the high level and low level regions at which there is little or no action are greater. The compressor at low frequencies thus also exhibits the desired bi-linear characteristic. The maximum compression ratio in the high-frequency region (FIGS. 22A and 22B) is about 2.4, which is not significantly greater than the compression ratio of about 1.8 to 1.9 in the low-frequency region.

The compressor shown in FIGS. 18-20 and its complementary expander have been practically embodied in a set of three linear integrated circuits, and a single-chip embodiment is in development. In addition, the fact that all the parameters in the circuit are defined in precise mathematical terms means that the compressor and expander could have a digital embodiment. This would be especially useful if, for instance, the signal to be recorded already existed in digital form. Alternatively, an analog signal could be digitized using an analog-to-digital convertor. The digital signal would be processed using a digital signal processor, the processor being programmed to manipulate the digital signals according to the mathematical definitions stated herein. Finally, the mathematically manipulated (i.e. compressed) signal would be re-converted to an analog signal which would be recorded on tape in the normal way. In playback, the signal from the playback head would be amplified and converted into digital form. It would then be mathematically manipulated by the digital signal processor to realize the required expander characteristic. Normal playback equalization could be applied either to the analog signal in the playback amplifier, or by an additional mathematical manipulation of the digital signal in the digital signal processor. Finally, the digital signal would be re-converted to an analog signal.

Because a considerable amount of effort is going into developing low-cost, high-quality analog-to-digital convertor, digital-to-analog convertor and digital signal processing chips, such an approach may eventually have cost advantages over the very complex linear integrated circuit required for an all-analog embodiment of the compressor and expanders described herein.

A further possibility would be to perform all the signal processing in the analog domain, but to realize all the control circuits in the digital domain.

We claim:

1. A circuit for modifying the dynamic range of an audio signal, namely a compressor or an expander, comprising means for compressing the audio signal, in the case of a compressor, or for expanding the audio signal, in the case of an expander, by up to about 10 dB in a low-frequency band extending generally from about 200 Hz downward, said means for compressing or expanding the audio signal in a low-frequency band having a fixed-band characteristic, and means for compressing the audio signal, in the case of a compressor, or for expanding the audio signal, in the case of an expander, by up to about 24 dB in a high-frequency band extending generally from about 400 Hz upward, said means for compressing or expanding the audio signal in a high-frequency band having a fixed-band/sliding-band action-substitution characteristic.

2. A circuit according to claim 1 wherein said high-frequency band is defined by a double-pole filter characteristic having a corner frequency of about 400 Hz and said low-frequency band is defined by a single-pole filter characteristic having a corner frequency of about 200 Hz, whereby there is a broad frequency overlap in the operation of said means for compressing or expanding the audio signal in a high-frequency band and said means for compressing or expanding the audio signal in a low-frequency band.

3. A circuit according to claim 2 wherein said means for compressing or expanding the audio signal in a low-frequency band comprises a fixed-band sub-stage and wherein said means for compressing or expanding the audio signal in a high-frequency band comprises a first action-substitution sub-stage and a second action-substitution sub-stage, each of said action-substitution sub-stages having a fixed-band circuit and a sliding-band circuit.

4. A circuit according to claim 3 wherein said first and second action-substitution sub-stages are cascaded in series, the dynamic action levels of the respective action-substitution sub-stages being staggered so as to increase the dynamic action without significant accompanying increases of the maximum compression or expansion ratio of the overall circuit.

5. A circuit according to claim 4 wherein said fixed-band sub-stage and either said first action-substitution sub-stage or said second action-substitution sub-stage comprise a first stage and said other action-substitution sub-stage comprises a second stage.

6. A circuit according to claim 5 wherein said first and second stages are each dual-path circuits wherein in said first stage the action-substitution sub-stage is in a first side path and said fixed-band sub-stage is in a second side path and in said second stage the action-substitution sub-stage is in a side path.

7. A circuit according to claim 3 wherein said fixed-band sub-stage and either said first action-substitution sub-stage or said second action-substitution sub-stage comprise a first stage and said other action-substitution sub-stage comprises a second stage.

8. A circuit according to claim 7 wherein said first and second stages are each dual-path circuits wherein in said first stage the action-substitution sub-stage is in a first side path and said fixed-band sub-stage is in a second side path and in said second stage the action-substitution sub-stage is in a side path.

9. A circuit according to claim 1 wherein said means for compressing or expanding the audio signal in a low-frequency band comprises a fixed-band sub-stage and wherein said means for compressing or expanding the audio signal in a high-frequency band comprises a first action-substitution sub-stage and a second action-substitution sub-stage, each of said action-substitution sub-stages having a fixed-band circuit and a sliding-band circuit.

10. A circuit according to claim 9 wherein said first and second action-substitution sub-stages are cascaded in series, the dynamic action levels of the respective action-substitution sub-stages being staggered so as to increase the dynamic action without significant accompanying increases of the maximum compression or expansion ratio of the overall circuit.

11. A circuit according to claim 10 wherein said fixed-band sub-stage and either said first action-substitution sub-stage or said second action-substitution sub-stage comprise a first stage and said other action-substitution sub-stage comprises a second stage.

12. A circuit according to claim 11 wherein said first and second stages are each dual-path circuits wherein in said first stage the action-substitution sub-stage is in a first side path and said fixed-band sub-stage is in a second side path and in said second stage the action-substitution sub-stage is in a side path.

13. A circuit according to claims 8 or 12, said circuit further comprising a high-frequency spectral skewing network in the input of each action-substitution sub-stage, and a low-frequency spectral skewing network, each spectral skewing network having a characteristic such that its attenuation increases as the frequency becomes further removed from the center of the audio frequency range.

14. A circuit according to claim 13 wherein said low-frequency spectral skewing network has the response of a high-pass filter with a corner frequency of about 33 Hz.

15. A circuit according claim 14 wherein said high-frequency spectral skewing networks each have the response of a low-pass filter.

16. A circuit according claim 13 wherein said high-frequency spectral skewing networks each have the response of a low-pass filter.

17. A circuit according to claim 13 wherein said each substage has a band-defining filter in its input path, the spectral skewing network and band-defining filter being combined in a single band-pass filter.

18. A circuit according to claim 17 wherein said band-pass filter has a voltage transfer function in the Laplace domain substantially of the form $$\frac{V_o(s)}{V_{in}(s)} = \frac{s/2\pi f_1}{1 + s/2\pi f_1} \cdot \frac{1}{1 + s/2\pi f_2}$$

where $f_1 = 33$ Hz, and $f_2 = 240$ Hz.

19. A circuit according to claim 18 wherein the spectral skewing characteristic of the band-pass filter in each action-substitution sub-stage is that of a low-pass filter with a corner frequency of about 12.8 kHz.

20. A circuit according to claim 19 wherein the spectral skewing characteristic of the band-pass filter of one of the action-substitution sub-stages is that of a single-pole filter and the spectral skewing characteristic of the band-pass filter of the other of the action-substitution sub-stages is that of a double-pole filter up to a particular frequency and a single-pole filter above that frequency.

21. A circuit according to claim 17 wherein the spectral skewing characteristic of the band-pass filter in each action-substitution sub-stage is that of a low-pass filter with a corner frequency of about 12.8 kHz.

22. A circuit according to claim 21 wherein the spectral skewing characteristic of the band-pass filter of one of the action-substitution sub-stages is that of a single-pole filter and the spectral skewing characteristic of the band-pass filter of the other of the action-substitution sub-stages is that of a double-pole filter up to a particular frequency and a single-pole filter above that frequency.

23. A circuit according to claim 22 wherein the band-pass filter of said one of the action-substitution sub-stages has a voltage transfer function in the Laplace domain substantially of the form $$\frac{V_o(s)}{V_{in}(s)} = \frac{s/2\pi f_1}{1 + s/2\pi f_1} \cdot \frac{1}{1 + s/2\pi f_2}$$

where $f_1 = 406$ Hz, and $f_2 = 12,600$ Hz, the band-pass filter network of said other of the action-substitution sub-stages has a voltage transfer function in the Laplace domain substantially of the form $$\frac{V_o(s)}{V_{in}(s)} = \frac{s/2\pi f_1}{1 + s/2\pi f_1} \cdot \frac{1 + s/2\pi f_2}{1 + (s/Q \cdot 2\pi f_3) + (s/2\pi f_3)^2}$$

where $f_1 = 406$ Hz, $f_2 = 48,000$ Hz, $f_3 = 13,300$ Hz, and $Q = 0.88$, and the band-pass filter network of the fixed-band sub-stage has a voltage transfer function in the Laplace domain substantially of the form $$\frac{V_o(s)}{V_{in}(s)} = \frac{s/2\pi f_1}{1 + s/2\pi f_1} \cdot \frac{1}{1 + s/2\pi f_2}$$

where $f_1 = 33$ Hz, and $f_2 = 240$ Hz.

24. A circuit according to claim 13 wherein, in the case of a compressor, said first stage further comprises a low-frequency antisaturation network and a first high-frequency antisaturation network in its main path and said second stage further comprises a second high-frequency antisaturation network in its main path and, in the case of an expander, said first stage further comprises a low-frequency antisaturation network having a characteristic that is substantially complementary to that of the corresponding antisaturation network in the first stage of the compressor, and a first high-frequency antisaturation network in its main path having a characteristic that is substantially complementary to that of the corresponding antisaturation network in the first stage of the compressor and said second stage further comprises a second high-frequency antisaturation network in its main path having a characteristic that is complementary to that of the antisaturation network in the second stage of the compressor.

25. A circuit according to claim 24 wherein, in the case of a compressor,
said low-frequency antisaturation network has a high-pass shelving response, and
said second high-frequency antisaturation network has a low-pass shelving response, and
in the case of an expander,
said low-frequency antisaturation network has a response complementary to a high-pass shelving response, and
said second high-frequency antisaturation network has a response complementary to a low-pass shelving response.

26. A circuit according to claim 25 wherein, in the case of a compressor, said low-frequency antisaturation network has a voltage transfer function in the Laplace domain substantially of the form $$\frac{V_o(s)}{V_{in}(s)} = \frac{2\pi f_1}{2\pi f_2} \cdot \frac{1 + s/2\pi f_1}{1 + s/2\pi f_2}$$

where $f_1 = 60$ Hz and $f_2 = 150$ Hz, and said second high-frequency antisaturation network has a voltage transfer function in the Laplace domain substantially of the form $$\frac{V_o(s)}{V_{in}(s)} = \frac{1 + s/2\pi f_6}{1 + s/2\pi f_7}$$

where $f_6 = 6,000$ Hz, and $f_7 = 17,600$ Hz and, in the case of an expander, said low-frequency antisaturation network and said second high-frequency antisaturation network, respectively, each have a voltage transfer function substantially complementary to that of the corresponding antisaturation network in the compressor.

27. A circuit according to claim 13 wherein each action-substitution sub-stage includes a sensitivity-reducing filter for reducing the sensitivity of the fixed-band circuit located in the input path of the fixed-band circuit.

28. A circuit according to claim 27 wherein the sensitivity-reducing filter is a low-pass filter with a shelving response.

29. A circuit according to claim 28 wherein the sensitivity-reducing filter has a voltage transfer function in the Laplace domain substantially of the form $$\frac{V_o(s)}{V_{in}(s)} = \frac{1 + s/2\pi f_2}{1 + s/2\pi f_3}$$

where
$f_2$ is the filter zero frequency, and
$f_3$ is the filter pole frequency.

30. A circuit according to claim 13 wherein, in each action-substitution stage, the fixed-band circuit and the sliding-band circuit each has a control circuit for controlling its dynamic action, the input of the sliding-band control circuit being derived from the output of the sliding-band circuit and the input of the fixed-band control circuit being derived from the output of the fixed-band circuit through a sensitivity-reducing filter for reducing the sensitivity of the fixed-band control circuit.

31. A circuit according to claim 30 wherein the sensitivity-reducing filter is a low-pass filter with a shelving response.

32. A circuit according to claim 31 wherein the sensitivity-reducing filter has a voltage transfer function in the Laplace domain substantially of the form $$\frac{V_o(s)}{V_{in}(s)} = \frac{1 + s/2\pi f_2}{1 + s/2\pi f_3}$$

where
$f_2$ is the filter zero frequency, and $f_3$ is the filter pole frequency.

33. A circuit according to claim 9 wherein said fixed-band sub-stage and either said first action-substitution sub-stage or said second action-substitution sub-stage comprise a first stage and said other action-substitution sub-stage comprises a second stage.

34. A circuit according to claim 33 wherein said first and second stages are each dual-path circuits wherein in said first stage the action-substitution sub-stage is in a first side path and said fixed-band sub-stage is in a second side path and in said second stage the action-substitution sub-stage is in a side path.

35. A circuit according to claim 34, said circuit further comprising a high-frequency spectral skewing network in the input of each action-substitution sub-stage, and a low-frequency spectral skewing network, each spectral skewing network having a characteristic such that its attenuation increases as the frequency becomes further removed from the center of the audio frequency range.

36. A circuit according to claim 35 wherein said low-frequency spectral skewing network has the response of a high-pass filter with a corner frequency of about 33 Hz.

37. A circuit according claim 36 wherein said high-frequency spectral skewing networks each have the response of a low-pass filter.

38. A circuit according claim 35 wherein said high-frequency spectral skewing networks each have the response of a low-pass filter.

39. A circuit according to claim 35 wherein said each substage has a band-defining filter in its input path, the spectral skewing network and band-defining filter being combined in a single band-pass filter.

40. A circuit according to claim 39 wherein said band-pass filter has a voltage transfer function in the Laplace domain substantially of the form $$\frac{V_o(s)}{V_{in}(s)} = \frac{s/2\pi f_1}{1 + s/2\pi f_1} \cdot \frac{1}{1 + s/2\pi f_2}$$

where $f_1 = 33$ Hz, and $f_2 = 240$ Hz.

41. A circuit according to claim 40 wherein the spectral skewing characteristic of the band-pass filter in each action-substitution sub-stage is that of a low-pass filter with a corner frequency of about 12.8 kHz.

42. A circuit according to claim 41 wherein the spectral skewing characteristic of the band-pass filter of one of the action-substitution sub-stages is that of a single-pole filter and the spectral skewing characteristic of the band-pass filter of the other of the action-substitution sub-stages is that of a double-pole filter up to a particular frequency and a single-pole filter above that frequency.

43. A circuit according to claim 39 wherein the spectral skewing characteristic of the band-pass filter in each action-substitution sub-stage is that of a low-pass filter with a corner frequency of about 12.8 kHz.

44. A circuit according to claim 43 wherein the spectral skewing characteristic of the band-pass filter of one of the action-substitution sub-stages is that of a single-pole filter and the spectral skewing characteristic of the band-pass filter of the other of the action-substitution sub-stages is that of a double-pole filter up to a particular frequency and a single-pole filter above that frequency.

45. A circuit according to claim 44 wherein the band-pass filter of said one of the action-substitution sub-stages has a voltage transfer function in the Laplace domain substantially of the form $$\frac{V_o(s)}{V_{in}(s)} = \frac{s/2\pi f_1}{1 + s/2\pi f_1} \cdot \frac{1}{1 + s/2\pi f_2}$$

where $f_1 = 406$ Hz, and $f_2 = 12,600$ Hz,
the band-pass filter network of said other of the action-substitution sub-stages has a voltage transfer function in the Laplace domain substantially of the form $$\frac{V_o(s)}{V_{in}(s)} = \frac{s/2\pi f_1}{1 + s/2\pi f_1} \cdot \frac{1 + s/2\pi f_2}{1 + (s/Q \cdot 2\pi f_3) + (s/2\pi f_3)^2}$$

where $f_1 = 406$ Hz, $f_2 = 48,000$ Hz, $f_3 = 13,300$ Hz, and $Q = 0.88$, and
the band-pass filter network of the fixed-band sub-stage has a voltage transfer function in the Laplace domain substantially of the form $$\frac{V_o(s)}{V_{in}(s)} = \frac{s/2\pi f_1}{1 + s/2\pi f_1} \cdot \frac{1}{1 + s/2\pi f_2}$$

where $f_1 = 33$ Hz, and $f_2 = 240$ Hz.

46. A circuit according to claims 8, 12, 34, 35, or 39 wherein, in the case of a compressor, said first stage further comprises a low-frequency antisaturation network and a first high-frequency antisaturation network in its main path and said second stage further comprises a second high-frequency antisaturation network in its main path and, in the case of an expander, said first stage further comprises a low-frequency antisaturation network having a characteristic that is substantially complementary to that of the corresponding antisaturation network in the first stage of the compressor, and a first high-frequency antisaturation network in its main path having a characteristic that is substantially complementary to that of the corresponding antisaturation network in the first stage of the compressor and said second stage further comprises a second high-frequency antisaturation network in its main path having a characteristic that is complementary to that of the antisaturation network in the second stage of the compressor.

47. A circuit according to claim 46 wherein, in the case of a compressor,
said low-frequency antisaturation network has a high-pass shelving response, and
said second high-frequency antisaturation network has a low-pass shelving response, and
in the case of an expander,
said low-frequency antisaturation network has a response complementary to a high-pass shelving response, and
said second high-frequency antisaturation network has a response complementary to a low-pass shelving response.

48. A circuit according to claim 47 wherein, in the case of a compressor, said low-frequency antisaturation network has a voltage transfer function in the Laplace domain substantially of the form $$\frac{V_o(s)}{V_{in}(s)} = \frac{2\pi f_1}{2\pi f_2} \cdot \frac{1 + s/2\pi f_1}{1 + s/2\pi f_2}$$

where $f_1 = 60$ Hz and $f_2 = 150$ Hz, and said second high-frequency antisaturation network has a voltage transfer function in the Laplace domain substantially of the form $$\frac{V_o(s)}{V_{in}(s)} = \frac{1 + s/2\pi f_6}{1 + s/2\pi f_7}$$

where $f_6 = 6,000$ Hz, and $f_7 = 17,600$ Hz and, in the case of an expander, said low-frequency antisaturation network and said second high-frequency antisaturation network, respectively, each have a voltage transfer function substantially complementary to that of the corresponding antisaturation network in the compressor.

49. A circuit according to claims 3, 4, 10, 8, 12, 34, 35, or 39 wherein each action-substitution sub-stage includes a sensitivity-reducing filter for reducing the sensitivity of the fixed-band circuit located in the input path of the fixed-band circuit.

50. A circuit according to claim 49 wherein the sensitivity-reducing filter is a low-pass filter with a shelving response.

51. A circuit according to claim 50 wherein the sensitivity-reducing filter has a voltage transfer function in the Laplace domain substantially of the form $$\frac{V_o(s)}{V_{in}(s)} = \frac{1 + s/2\pi f_2}{1 + s/2\pi f_3}$$

where
$f_2$ is the filter zero frequency, and
$f_3$ is the filter pole frequency.

52. A circuit according to claims 3, 4, 10, 8, 12, 14, 35, or 39 wherein, in each action-substitution stage, the fixed-band circuit and the sliding-band circuit each has a control circuit for controlling its dynamic action, the input of the sliding-band control circuit being derived from the output of the sliding-band circuit and the input of the fixed-band control circuit being derived from the output of the fixed-band circuit through a sensitivity-reducing filter for reducing the sensitivity of the fixed-band control circuit.

53. A circuit according to claim 52 wherein the sensitivity-reducing filter is a low-pass filter with a shelving response.

54. A circuit according to claim 53 wherein the sensitivity-reducing filter has a voltage transfer function in the Laplace domain substantially of the form $$\frac{V_o(s)}{V_{in}(s)} = \frac{1 + s/2\pi f_2}{1 + s/2\pi f_3}$$

where
$f_2$ is the filter zero frequency, and
$f_3$ is the filter pole frequency.

55. A circuit according to claim 9 wherein each action-substitution sub-stage includes a sensitivity-reducing filter for reducing the sensitivity of the fixed-band circuit located in the input path of the fixed-band circuit.

56. A circuit according to claim 55 wherein the sensitivity-reducing filter is a low-pass filter with a shelving response.

57. A circuit according to claim 56 wherein the sensitivity-reducing filter has a voltage transfer function in the Laplace domain substantially of the form $$\frac{V_o(s)}{V_{in}(s)} = \frac{1 + s/2\pi f_2}{1 + s/2\pi f_3}$$

where
$f_2$ is the filter zero frequency, and
$f_3$ is the filter pole frequency.

58. A circuit according to claim 9 wherein, in each action-substitution stage, the fixed-band circuit and the sliding-band circuit each has a control circuit for controlling its dynamic action, the input of the sliding-band control circuit being derived from the output of the sliding-band circuit and the input of the fixed-band control circuit being derived from the output of the fixed-band circuit through a sensitivity-reducing filter for reducing the sensitivity of the fixed-band control circuit.

59. A circuit according to claim 58 wherein the sensitivity-reducing filter is a low-pass filter with a shelving response.

60. A circuit according to claim 59 wherein the sensitivity-reducing filter has a voltage transfer function in the Laplace domain substantially of the form $$\frac{V_o(s)}{V_{in}(s)} = \frac{1 + s/2\pi f_2}{1 + s/2\pi f_3}$$

where
$f_2$ is the filter zero frequency, and
$f_3$ is the filter pole frequency.

61. A circuit according to claims 3, 4, 9, 35, 39, 55, or 58 wherein, in each action-substitution sub-stage,
the fixed-band circuit and the sliding-band circuit
each has a variable element for determining the dynamic action of the circuit, the variable element being controlled by a control circuit,
the variable element and control circuit combination in the fixed-band circuit having substantially an exponential characteristic, and
the variable element and control circuit combination in the sliding-band circuit having substantially a fixed power law characteristic.

62. A circuit according to claim 61 wherein each variable element has a linear characteristic and each respective control circuit includes a non-linear circuit providing the desired exponential or fixed power law characteristic.

63. A circuit according to claim 62 wherein, in each action-substitution sub-stage, the control circuit of the fixed-band circuit and the control circuit of the sliding-band circuit each generates a control signal and includes means for limiting the maximum amplitude level of the control signal.

64. A circuit according to claim 61 wherein
in each action-substitution sub-stage, the variable element and control circuit of each fixed-band circuit
further includes an offset voltage, and each fixed-band circuit has a voltage transfer function in the Laplace
domain substantially of the form $$\frac{V_o(s)}{V_{in}(s)} = \frac{1}{1 + \exp\left(\frac{G_1 V_o(s)}{V_{ref}} - V_{OS}\right)} \cdot \frac{1 + s/2\pi f_2}{1 + s/2\pi f_3}$$

where
f₂ is the fixed-band shelf filter zero frequency,
f₃ is the fixed-band shelf filter pole frequency,
$G_1$ is the high-frequency fixed-band control circuit gain,
$V_{ref}$ is the RMS reference level voltage, and
$V_{OS}$ is the variable element and control circuit offset voltage; and
each sliding-band circuit has a voltage transfer function in the Laplace domain substantially of the form $$\frac{V_o(s)}{V_{in}(s)} = \frac{(s + 2\pi f_1) \cdot A_{SC}}{s + 2\pi f_1 \left[ \left( \frac{G_2 V_o(s)}{V_{ref}} \right)^N + 1 \right]}$$

where
$f_1$ is the lower corner frequency of the sliding-band variable high-pass shelf filter,
$G_2$ is the sliding-band control circuit gain,
$V_{ref}$ is the RMS reference level voltage,
N is the fixed power of the sliding-band variable element and control circuit, and
$A_{SC}$ is the signal gain of the side-path,
the variable element and control circuit of the fixed-band sub-stage further includes an offset voltage, and
the fixed-band sub-stage has a voltage transfer function in the Laplace domain substantially of the form $$\frac{V_o(s)}{V_{in}(s)} = \frac{1}{1 + \exp\left( \frac{G_{1F} V_o(s)}{V_{ref}} - V_{OSF} \right)}$$

where
$G_{1F}$ is the control circuit gain,
$V_{ref}$ is the RMS reference level voltage, and
$V_{OSF}$ is the control element offset voltage.

65. A circuit according to claim 64 wherein the parameter values are approximately:

| | | | |
|---|---|---|---|
| $f_1$ | = 200 Hz, | $f_2$ = 12,800 Hz, | $f_3$ = 3,200 Hz, |
| $G_1$ | = 200 in said first stage, and = 663 in said second stage, | | |
| $G_2$ | = 1,610 in said first stage, and = 4,900 in said second stage, | | |
| $V_{OS}$ | = 3.6 V in said first stage, and = 6.0 V in said second stage, | | |
| N | = 1.5 | | |
| $A_{SC}$ | = 3.05 in said first stage, and = 3.4 in said second stage, and | | |
| $G_{1F}$ | = 213, and | | |
| $V_{OSF}$ | = 6.0. | | |

66. A method for modifying the dynamic range of an audio signal, namely by compressing or expanding, comprising
compressing or expanding the audio signal with a fixed-band characteristic by up to about 10 dB in a low-frequency band extending generally from about 200 Hz downward, and
compressing or expanding the audio signal with a fixed-band/sliding-band action-substitution characteristic by up to about 24 dB in a high-frequency band extending generally from about 400 Hz upward.

67. A method according to claim 66 wherein said high-frequency band is defined by a double-pole filter characteristic having a corner frequency of about 400 Hz and said low-frequency band is defined by a single-pole filter characteristic having a corner frequency of about 200 Hz, whereby there is a broad frequency overlap in the compressing or expanding of the audio signal in said high-frequency band and the compressing or expanding of the audio signal in said low-frequency band.

* * * * *

UNITED STATES PATENT AND TRADEMARK OFFICE
CERTIFICATE OF CORRECTION

PATENT NO. : 5,185,806

DATED : February 09, 1993

INVENTOR(S) : Dolby et al

It is certified that error appears in the above-identified patent and that said Letters Patent is hereby corrected as shown below:

| | | |
|---|---|---|
| Abstract | | |
| | Line 17: | "sub-state" should be --sub-stage-- |
| Column 06 | Line 51: | "unpredicatable" should be --unpredictable-- |
| Column 08 | Line 40: | insert --path-- after "dual" |
| Column 10 | Line 56: | "modualtion" should be --modulation-- |
| Column 14 | Line 48: | delete "more" |
| Column 21 | Line 10: | insert --the-- after "to" |
| Column 22 | Line 51: | insert --Hz-- after "2,400" |
| Column 26 | Line 43: | "2 $\pi f_n$" should be --$2\pi f_n$-- |
| Column 29 | Line 26: | "systesm" should be --system-- |
| Column 29 | Line 27: | insert --B-type-- after "A-type," |
| Column 30 | Line 12: | "Dc" should be --DC-- |
| Column 35 | Line 13: | insert --also-- before "be" |
| Column 37 | Line 36: | "in" should be --is-- |
| Column 38 | Line 09: | "$(s/2\pi f_2)^2$" should be --$(s/2\pi f_3)^2$ |
| Column 46 | | |

UNITED STATES PATENT AND TRADEMARK OFFICE
CERTIFICATE OF CORRECTION

PATENT NO. : 5,185,806
DATED : February 09, 1993
INVENTOR(S) : Dolby et al

It is certified that error appears in the above-identified patent and that said Letters Patent is hereby corrected as shown below:

```
    Line 13:    "a low" should be --at low--
Column 48
    Line 36:    insert --to-- before "claim"
Column 48
    Line 39:    insert --to-- before "claim"
Column 51
    Line 25:    insert --to-- before "claim"
Column 51
    Line 28:    insert --to-- before "claim"
```

Signed and Sealed this

Seventeenth Day of January, 1995

Attest:

BRUCE LEHMAN

Attesting Officer     Commissioner of Patents and Trademarks